United States Patent
Rutledge et al.

(10) Patent No.: US 10,466,803 B1
(45) Date of Patent: *Nov. 5, 2019

(54) MAGNETIC SENSING USER INTERFACE DEVICE, METHODS, AND APPARATUS

(71) Applicant: SeeScan Inc., San Diego, CA (US)

(72) Inventors: Austin Rutledge, San Diego, CA (US); Ray Merewether, La Jolla, CA (US); Michael J. Martin, San Diego, CA (US); Mark S. Olsson, La Jolla, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/614,565

(22) Filed: Jun. 5, 2017

Related U.S. Application Data

(63) Continuation of application No. 13/590,099, filed on Aug. 20, 2012, now Pat. No. 9,678,577.

(60) Provisional application No. 61/525,766, filed on Aug. 20, 2011.

(51) Int. Cl.
*G06F 3/02* (2006.01)

(52) U.S. Cl.
CPC ..................................... *G06F 3/02* (2013.01)

(58) Field of Classification Search
CPC ..................................... G06F 3/02; G09G 3/36
See application file for complete search history.

(56) References Cited

U.S. PATENT DOCUMENTS

| | | | |
|---|---|---|---|
| 3,112,464 A | 11/1963 | Ratajaski | |
| 3,170,323 A | 2/1965 | Kurt | |
| 3,331,971 A | 7/1967 | Moller | |
| 3,764,779 A | 10/1973 | Kadoya | |
| 3,980,808 A | 9/1976 | Kikuchi | |
| 4,107,604 A | 8/1978 | Bernier | |
| 4,161,726 A | 7/1979 | Burson | |
| 4,216,467 A | 8/1980 | Colston | |
| 4,293,837 A | 10/1981 | Jaffe | |

(Continued)

FOREIGN PATENT DOCUMENTS

| | | |
|---|---|---|
| DE | 19501439 | 9/1996 |
| DE | 19806611 | 8/1999 |

(Continued)

OTHER PUBLICATIONS

International Searching Authority, "Written Opinion of the International Searching Authority" for PCT Patent Application No. PCT/IB10/01039, dated Oct. 15, 2011, European Patent Office, Munich.

(Continued)

*Primary Examiner* — Towfiq Elahi

(74) *Attorney, Agent, or Firm* — Steven C. Tietsworth, Esq.; Heena Sharma

(57) ABSTRACT

User interface devices with electromagnetic dipole arrays and associated magnetic sensors, control circuits, and processing elements for determining user actuation of the device are disclosed. In one embodiment a user interface device includes an electromagnetic dipole array coupled to an actuator, along with a three-axis magnetic sensor and control and processing elements for controlling driving currents to the dipole array and sensing and processing received magnetic field signals to determine movement or displacement of the actuator.

14 Claims, 41 Drawing Sheets

(56) References Cited

U.S. PATENT DOCUMENTS

| | | |
|---|---|---|
| 4,348,142 A | 9/1982 | Figour |
| 4,459,578 A | 7/1984 | Sava |
| 4,489,303 A | 12/1984 | Martin |
| 4,490,710 A | 12/1984 | Kopsho et al. |
| 4,500,867 A | 2/1985 | Ishitobo |
| 4,651,558 A | 3/1987 | Martin |
| 4,733,214 A | 3/1988 | Andresen |
| 4,774,458 A | 9/1988 | Aronoff |
| 4,785,180 A | 11/1988 | Dietrich |
| 4,825,157 A | 4/1989 | Milkan |
| 4,853,630 A | 8/1989 | Houston |
| 4,879,556 A | 11/1989 | Duimel |
| 4,998,182 A | 3/1991 | Krauter |
| 5,045,842 A | 9/1991 | Galvin |
| 5,146,566 A | 9/1992 | Hollis, Jr. |
| 5,160,918 A | 11/1992 | Saposnik |
| 5,168,221 A | 12/1992 | Houston |
| 5,450,054 A | 9/1995 | Schmersal |
| 5,504,502 A | 4/1996 | Arita |
| 5,525,901 A | 6/1996 | Clymer |
| 5,565,891 A | 10/1996 | Armstrong |
| 5,598,090 A | 1/1997 | Baker |
| 5,619,195 A | 4/1997 | Allen |
| 5,670,987 A | 9/1997 | Doi |
| 5,687,080 A | 11/1997 | Hoyt |
| 5,706,027 A | 1/1998 | Hilton |
| 5,749,577 A | 5/1998 | Couch |
| 5,767,840 A | 6/1998 | Selker |
| 5,831,554 A | 11/1998 | Hedayat |
| 5,831,596 A | 11/1998 | Marshall |
| 5,850,142 A | 12/1998 | Rountos |
| 5,939,679 A | 8/1999 | Olsson |
| 5,959,863 A | 9/1999 | Hoyt |
| 5,969,520 A | 10/1999 | Schottler |
| 6,002,184 A | 12/1999 | Delson |
| D421,433 S | 3/2000 | Alviar et al. |
| D422,996 S | 4/2000 | Alviar et al. |
| 6,129,527 A | 10/2000 | Donahoe |
| 6,144,125 A | 11/2000 | Birkestrand |
| 6,225,980 B1 | 5/2001 | Weiss |
| 6,329,812 B1 | 12/2001 | Sundin |
| 6,333,734 B1 | 12/2001 | Rein |
| 6,353,430 B2 | 3/2002 | Cheng et al. |
| 6,462,731 B1 | 10/2002 | Stoffers |
| 6,501,458 B2 | 12/2002 | Baker |
| 6,550,346 B2 | 4/2003 | Gombert |
| 6,573,709 B1 | 6/2003 | Gandel |
| 6,593,729 B2 | 7/2003 | Sundin |
| 6,597,347 B1 | 7/2003 | Yasutake |
| 6,606,085 B1 * | 8/2003 | Endo .................. G05G 9/04796 345/159 |
| 6,614,420 B1 | 9/2003 | Han et al. |
| 6,664,946 B1 | 12/2003 | Stipes et al. |
| 6,707,446 B2 | 3/2004 | Nakamura |
| 6,727,889 B2 | 4/2004 | Shaw |
| 6,738,043 B2 | 5/2004 | Endo |
| 6,753,519 B2 | 6/2004 | Gombert |
| 6,762,748 B2 | 7/2004 | Maatta |
| 6,804,012 B2 | 10/2004 | Gombert |
| 6,822,635 B2 | 11/2004 | Shahoian |
| 6,831,679 B1 | 12/2004 | Olsson |
| 6,879,316 B2 | 4/2005 | Kehlstadt |
| 6,891,526 B2 | 5/2005 | Gombert |
| 6,925,975 B2 | 8/2005 | Ozawa |
| 6,928,886 B2 | 8/2005 | Muesel |
| 7,084,856 B2 | 8/2006 | Huppi |
| 7,145,551 B1 | 12/2006 | Bathiche et al. |
| 7,148,880 B2 | 12/2006 | Magara |
| 7,151,526 B2 | 12/2006 | Endo |
| 7,164,412 B2 | 1/2007 | Kao |
| 7,233,318 B1 | 6/2007 | Farag |
| 7,336,006 B2 * | 2/2008 | Watanabe ................ G06F 3/016 310/12.25 |
| 7,474,296 B2 | 1/2009 | Obermeyer |
| 7,552,541 B2 | 6/2009 | Sakuri |
| 7,733,327 B2 | 6/2010 | Harley |
| 7,737,945 B2 | 6/2010 | West |
| 7,753,788 B2 | 7/2010 | Lum et al. |
| 7,800,581 B2 | 9/2010 | Lye |
| 7,825,903 B2 | 11/2010 | Anastas |
| 7,958,782 B2 | 6/2011 | Le |
| 7,978,175 B2 | 7/2011 | Orsley |
| 8,089,039 B2 | 1/2012 | Pascucci |
| 8,100,030 B2 | 1/2012 | Koschke |
| 8,139,033 B2 | 3/2012 | Yamamoto |
| 8,274,358 B2 | 9/2012 | Ando |
| 8,289,385 B2 | 10/2012 | Olsson |
| 8,497,767 B2 | 7/2013 | Hollis, Jr. |
| 9,134,817 B2 | 9/2015 | Olsson |
| 2002/0033795 A1 | 3/2002 | Shahoian |
| 2002/0033798 A1 | 3/2002 | Nakamura et al. |
| 2003/0107551 A1 | 6/2003 | Dunker |
| 2003/0126980 A1 | 7/2003 | Barden |
| 2006/0103628 A1 * | 5/2006 | Akieda ................ G06F 3/03548 345/156 |
| 2006/0106454 A1 | 5/2006 | Osborne et al. |
| 2006/0256075 A1 | 11/2006 | Anastas |
| 2006/0290670 A1 | 12/2006 | Ishimaru |
| 2007/0129100 A1 * | 6/2007 | Kim ..................... G06F 1/1616 455/550.1 |
| 2007/0182842 A1 | 8/2007 | Sonnenschein |
| 2007/0216650 A1 | 9/2007 | Frohlich |
| 2007/0262959 A1 | 11/2007 | Gu |
| 2008/0001919 A1 | 1/2008 | Pascucci |
| 2008/0174550 A1 | 7/2008 | Laurila |
| 2008/0290821 A1 | 11/2008 | Brandt |
| 2009/0025094 A1 | 1/2009 | York |
| 2009/0058802 A1 | 3/2009 | Orsley |
| 2009/0071808 A1 | 3/2009 | Kang |
| 2009/0115749 A1 | 5/2009 | Kim |
| 2010/0265176 A1 | 10/2010 | Olsson |
| 2011/0050405 A1 | 3/2011 | Hollis, Jr. |
| 2011/0102382 A1 | 5/2011 | Shimizu |
| 2012/0215475 A1 | 8/2012 | Rutledge |
| 2012/0256821 A1 | 10/2012 | Olsson |
| 2012/0274563 A1 | 11/2012 | Olsson |

FOREIGN PATENT DOCUMENTS

| | | |
|---|---|---|
| DE | 19954497 | 4/2001 |
| EP | 0628976 | 12/1994 |
| EP | 0982646 | 3/2000 |
| EP | 1193643 | 4/2002 |
| EP | 1708074 A2 | 10/2006 |
| EP | 1926016 A1 | 5/2008 |
| EP | 1953621 | 6/2008 |
| JP | 03036946 | 2/1991 |
| WO | WO 01/69343 | 9/2001 |
| WO | WO 04/049092 A1 | 6/2004 |
| WO | WO 06/106454 A1 | 10/2006 |
| WO | WO 11/146668 A2 | 11/2011 |
| WO | WO 12/075468 A1 | 6/2012 |

OTHER PUBLICATIONS

International Searching Authority, "Written Opinion of the International Searching Authority" for PCT Patent Application No. PCT/US11/37069, dated Nov. 18, 2012, European Patent Office, Munich.

International Searching Authority, "Written Opinion of the International Searching Authority" for PCT Patent Application No. PCT/US11/48535, dated Feb. 20, 2013, European Patent Office, Munich.

International Searching Authority, "Written Opinion of the International Searching Authority" for PCT Patent Application No. PCT/US11/56039, dated Apr. 12, 2013, European Patent Office, Munich.

International Searching Authority, "Written Opinion of the International Searching Authority" for PCT Patent Application No. PCT/US11/59835, dated May 8, 2013, European Patent Office, Munich.

International Searching Authority, "Written Opinion of the International Searching Authority" for PCT Patent Application No. PCT/US11/63186, dated Jun. 2, 2013, European Patent Office, Munich.

(56) References Cited

OTHER PUBLICATIONS

International Searching Authority, "Written Opinion of the International Searching Authority" for PCT Patent Application No. PCT/US14/38656, dated Nov. 17, 2015, European Patent Office, Munich.
Melexis Microelectronic Integrated Systems, Product Information on Absolute Position Sensor IC, MLX90333.
Tietsworth, Steven C., Response to Non-Final Office Action and Amendment (dated Jan. 7, 2012), regarding Magnetic Manual User Interface Devices, U.S. Appl. No. 12/756,068.

* cited by examiner

1000

| $B_r$ (mT) | $B_z$ (mT) | $r$ (mm) |
|---|---|---|
| 0.096725 | 321.706090 | 0.000000 |
| 16.547073 | 270.898359 | 0.065000 |
| 27.613051 | 226.194652 | 0.130000 |
| 34.083266 | 187.726357 | 0.195000 |
| 36.932920 | 155.245962 | 0.260000 |
| 37.379161 | 128.320421 | 0.325000 |
| 36.143987 | 106.231773 | 0.390000 |
| 34.056447 | 88.288963 | 0.455000 |
| 31.551480 | 73.742558 | 0.520000 |
| 28.902364 | 61.943479 | 0.585000 |
| 26.306843 | 52.345762 | 0.650000 |
| 23.847584 | 44.519541 | 0.715000 |
| 21.583363 | 38.090253 | 0.780000 |
| 19.527548 | 32.782559 | 0.845000 |
| 17.669158 | 28.370964 | 0.910000 |
| 16.004650 | 24.687049 | 0.975000 |
| 14.521448 | 21.590019 | 1.040000 |
| 13.195364 | 18.969805 | 1.105000 |
| 12.011047 | 16.741034 | 1.170000 |
| 10.959639 | 14.836860 | 1.235000 |
| 10.016899 | 13.200218 | 1.300000 |
| 9.175064 | 11.786250 | 1.365000 |
| 8.422227 | 10.558771 | 1.430000 |
| 7.744260 | 9.489692 | 1.495000 |
| 7.137741 | 8.554035 | 1.560000 |
| 6.589820 | 7.732238 | 1.625000 |
| 6.095970 | 7.007247 | 1.690000 |
| 5.650031 | 6.365092 | 1.755000 |
| 5.244766 | 5.795322 | 1.820000 |

| $B_r$ (mT) | $B_z$ (mT) | z (mm) |
|---|---|---|
| 0.096725 | 321.706090 | 0.400000 |
| 16.547073 | 270.898359 | 0.489655 |
| 27.613051 | 226.194652 | 0.579310 |
| 34.083266 | 187.726357 | 0.668965 |
| 36.932920 | 155.245962 | 0.758620 |
| 37.379161 | 128.320421 | 0.848275 |
| 36.143987 | 106.231773 | 0.937930 |
| 34.056447 | 88.288963 | 1.027586 |
| 31.551480 | 73.742558 | 1.117241 |
| 28.902364 | 61.943479 | 1.206896 |
| 26.306843 | 52.345762 | 1.296551 |
| 23.847584 | 44.519541 | 1.386206 |
| 21.583363 | 38.090253 | 1.475861 |
| 19.527548 | 32.782559 | 1.565516 |
| 17.669158 | 28.370964 | 1.655171 |
| 16.004650 | 24.687049 | 1.744826 |
| 14.521448 | 21.590019 | 1.834481 |
| 13.195364 | 18.969805 | 1.924136 |
| 12.011047 | 16.741034 | 2.013791 |
| 10.959639 | 14.836860 | 2.103446 |
| 10.016899 | 13.200218 | 2.193102 |
| 9.175064 | 11.786250 | 2.282757 |
| 8.422227 | 10.558771 | 2.372412 |
| 7.744260 | 9.489692 | 2.462067 |
| 7.137741 | 8.554035 | 2.551722 |
| 6.589820 | 7.732238 | 2.641377 |
| 6.095970 | 7.007247 | 2.731032 |
| 5.650031 | 6.365092 | 2.820687 |
| 5.244766 | 5.795322 | 2.910342 |

| Br (mT) | Bz (mT) | R (mm) |
|---|---|---|
| 0 | 3.5921 | 0 |
| 1.5555 | 7.1641 | 0.78062 |
| 3.1109 | 10.736 | 0.88748 |
| 4.6664 | 14.308 | 0.8879 |
| 6.2219 | 17.88 | 0.86906 |
| 7.7774 | 21.452 | 0.84368 |
| 9.3328 | 25.024 | 0.81702 |
| 10.888 | 28.597 | 0.79124 |
| 12.444 | 32.169 | 0.76918 |
| 13.999 | 35.741 | 0.74804 |
| 15.555 | 39.313 | 0.7303 |
| 17.11 | 42.885 | 0.71075 |
| 18.666 | 46.457 | 0.69677 |
| 20.221 | 50.029 | 0.68354 |
| 21.777 | 53.601 | 0.66484 |
| 23.332 | 57.173 | 0.65465 |
| 24.888 | 60.745 | 0.64588 |
| 26.443 | 64.317 | 0.63233 |
| 27.999 | 67.889 | 0.62441 |
| 29.554 | 71.461 | 0.61683 |
| 31.109 | 75.033 | 0.60173 |
| 32.665 | 78.605 | 0.5946 |
| 34.22 | 82.177 | 0.58913 |
| 35.776 | 85.75 | 0.58417 |
| 37.331 | 89.322 | 0.58193 |
| 38.887 | 92.894 | 0.5705 |
| 40.442 | 96.466 | 0.56007 |
| 41.998 | 100.04 | 0.55095 |
| 43.553 | 103.61 | 0.54658 |
| 45.109 | 107.18 | 0.54471 |
| 46.664 | 110.75 | 0.54416 |

*FIG. 20*

| Br (mT) | Bz (mT) | Z (mm) |
|---|---|---|
| 0 | 3.5921 | 5.8726 |
| 1.5555 | 7.1641 | 4.3126 |
| 3.1109 | 10.736 | 3.5538 |
| 4.6664 | 14.308 | 3.0926 |
| 6.2219 | 17.88 | 2.7717 |
| 7.7774 | 21.452 | 2.5315 |
| 9.3328 | 25.024 | 2.3433 |
| 10.888 | 28.597 | 2.1918 |
| 12.444 | 32.169 | 2.0632 |
| 13.999 | 35.741 | 1.9525 |
| 15.555 | 39.313 | 1.8564 |
| 17.11 | 42.885 | 1.7737 |
| 18.666 | 46.457 | 1.6983 |
| 20.221 | 50.029 | 1.6307 |
| 21.777 | 53.601 | 1.5719 |
| 23.332 | 57.173 | 1.5151 |
| 24.888 | 60.745 | 1.4658 |
| 26.443 | 64.317 | 1.4178 |
| 27.999 | 67.889 | 1.3767 |
| 29.554 | 71.461 | 1.3316 |
| 31.109 | 75.033 | 1.2961 |
| 32.665 | 78.605 | 1.2622 |
| 34.22 | 82.177 | 1.2287 |
| 35.776 | 85.75 | 1.1951 |
| 37.331 | 89.322 | 1.1623 |
| 38.887 | 92.894 | 1.1369 |
| 40.442 | 96.466 | 1.1115 |
| 41.998 | 100.04 | 1.0871 |
| 43.553 | 103.61 | 1.0625 |
| 45.109 | 107.18 | 1.0383 |
| 46.664 | 110.75 | 1.0144 |

MAGNETIC SENSING USER INTERFACE DEVICE, METHODS, AND APPARATUS

CROSS-REFERENCE TO RELATED PATENTS AND APPLICATIONS

This application is a continuation of and claims priority to co-pending U.S. patent application Ser. No. 13/590,099, filed Aug. 20, 2012, entitled MAGNETIC SENSING USER INTERFACE DEVICE METHODS AND APPARATUS USING ELECTROMAGNETS AND ASSOCIATED MAGNETIC SENSORS, which claims priority under 35 U.S.C. § 119(e) to U.S. Provisional Patent Application Ser. No. 61/525,755, filed Aug. 20, 2011, entitled USER INTERFACE DEVICE METHODS AND APPARATUS USING PERMANENT MAGNETS OR ELECTROMAGNETS AND CORRESPONDING MAGNETIC SENSORS, the content of which is hereby incorporated by reference herein in its entirety for all purposes.

FIELD

The present disclosure relates generally to user interface devices using magnetic sensing, and associated methods, apparatus, and systems. More particularly, but not exclusively, the disclosure relates to user interface devices using magnetic sensing and electromagnetic dipole arrays for magnetic field generation.

BACKGROUND

There are a multitude of manual user interface devices available for interacting with computers and other electronic devices, such as computer mouse devices, track balls, joysticks, and the like. Many of these manual user interface devices use mechanical or optical components for detecting movements relative to a supporting surface, such as a table, desk, or other surface. Interpretation of motion in these mechanical and optical devices is dependent on the device components and configuration, and the art is replete with methods for interpreting motion of mechanical and optical components of these user interface devices. However, methods for interpreting position and motion in user interface devices using magnetic sensing components leave much room for improvement.

SUMMARY

The present disclosure relates generally to user interface devices using magnetic sensing, and associated methods, apparatus, and systems. For example, in one aspect, the disclosure relates to a user interface device. The user interface device may include, for example, an actuator element. The actuator element may include or be coupled to an electromagnetic dipole array having a plurality of dipole elements for generating magnetic fields. The device may further include a control circuit for selectively energizing ones of a plurality of dipole elements of the dipole array to generate the magnetic fields. The device may further include a magnetic sensor element associated with the dipole array. The magnetic sensor element may be configured to sense the magnetic fields at a position of the actuator element and provide magnetic sensor output data corresponding to the sensed magnetic fields.

In another aspect, the disclosure relates to a method for electromagnetic sensing in a user interface device. The method may include, for example, one or more of the stages of: selectively driving a first current in a first dipole element of a dipole array coupled to an actuator; sensing, at a multi-axis magnetic sensor, magnetic fields generated by the first dipole element; providing magnetic sensor output data corresponding to the first sensed magnetic fields; selectively driving a second current in a second dipole element of the dipole array; sensing, at the multi-axis magnetic sensor, magnetic fields generated by the second dipole element; providing magnetic sensor output data corresponding to the second sensed magnetic fields; receiving the magnetic sensor output data at a processing element; and determining, based at least in part on the magnetic sensor output data, a location or position of the actuator.

In another aspect, the disclosure relates to computer-readable media for storing instructions for implementing, in whole or in part, the above-described method or other related methods on a processing element or other electronic circuit element, which may be a component of a magnetic user interface device. In another aspect, the disclosure relates to apparatus and devices for implementing the above-described method or other related methods, in whole or in part, as well as systems for using the above-described method or related methods in whole or in part. In another aspect, the disclosure relates to means for performing the above-described method or related methods, in whole or in part.

Various additional aspects, details, features, and functions of various embodiments are further described herein in conjunction with the appended drawing figures.

BRIEF DESCRIPTION OF THE DRAWINGS

The present application may be more fully appreciated in connection with the following detailed description taken in conjunction with the accompanying drawings, wherein:

FIG. 10 illustrates details of an embodiment of part of a radial displacement lookup table for use in a magnetic UID;

FIG. 11 illustrates partial details of an embodiment of part of a Z-axis displacement lookup table for use in a magnetic UID;

FIG. 20 is an illustration of details of an embodiment of part of a radial position lookup table for use in a magnetic UID;

FIG. 21 is an illustration of details of an embodiment of part of a Z-axis position lookup table for use in a magnetic UID;

DETAILED DESCRIPTION OF EMBODIMENTS

Overview

Figure 1:
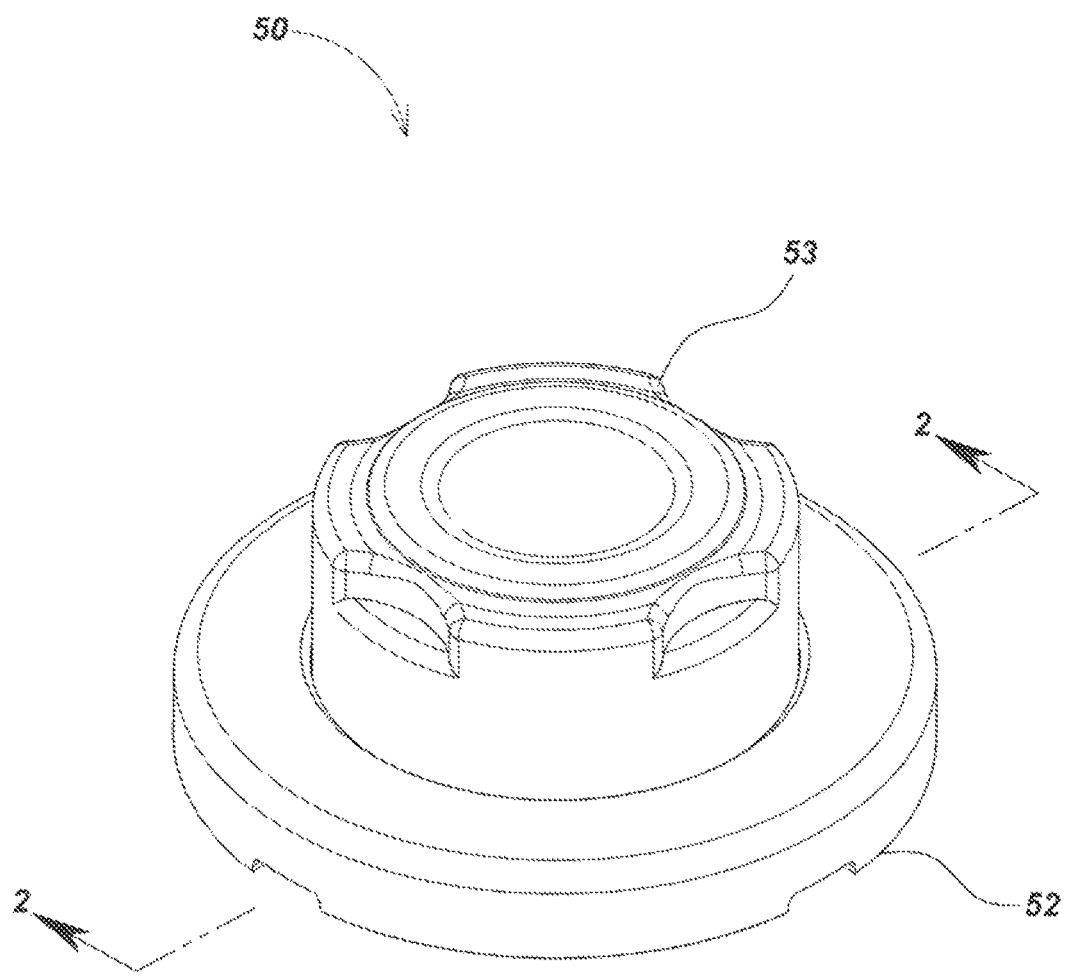
FIG. 1 is an isometric view of details of an embodiment of an example magnetic user interface device (UID) with a clover leaf shaped printed circuit board.

This disclosure relates generally to user interface devices using magnets and magnetic sensing, along with associated methods, apparatus, and systems. More particularly, but not exclusively, the disclosure relates to magnetically sensed user interface devices ("UIDs") using electromagnets and associated magnetic sensing elements. In addition, the disclosure relates to methods and apparatus for generating and using magnetic field models within UIDs that use magnetic sensing elements (also denoted herein as "magnetic UIDs" for brevity), such as permanent or electromagnets and associated magnetic sensors, to sense positions, motions, deformations, and/or other user interactions with the user interface devices A typical magnetic UID may include an actuator element having one or more permanent magnets or a magnetic dipole array (and associated control and driving circuits), along with corresponding magnetic sensors, which may be multi-axis magnetic sensors, configured to sense the position and/or movements of the magnets and associated actuator. The sensed information may then be processed in a processing element to generate information related to motion, position, deformation, or other actions of the actuator element, which may then be provided to attached computers or other electronic computing devices or systems to facilitate user interaction with the computers or other electronic computing devices or systems. In implementations where electromagnets are used, a control circuit, which may be coupled to or incorporated with a processing element, may generate and control driving currents to be applied to dipole elements of the electromagnetic dipole array.

Subject matter described in various additional applications is related to this disclosure and may be combined with the various apparatus, devices, and methods described herein in various embodiments. For example, this disclosure is related to U.S. patent application Ser. No. 13/110,910, filed on May 18, 2011, entitled USER INTERFACE DEVICES, APPARATUS, AND METHODS, to U.S. Patent Application Ser. No. 61/363,173, filed Jul. 9, 2010, entitled SPRING SUSPENDED MAGNETICALLY SENSED USER INTERFACE DEVICES, to U.S. Provisional Patent Application Ser. No. 61/372,025, filed Aug. 9, 2010, entitled SPRING SUSPENDED MAGNETICALLY SENSED USER INTERFACE DEVICE, to U.S. patent application Ser. No. 13/214,209, filed on Aug. 21, 2011, entitled MAG- NETIC SENSED USER INTERFACE DEVICE, METHODS AND APPARATUS, to U.S. patent application Ser. No. 13/272,172, filed Oct. 12, 2011, entitled MAGNETIC THUMBSTICK USER INTERFACE DEVICES, to U.S. patent application Ser. No. 13/292,038, filed Nov. 8, 2010, entitled SLIM PROFILE MAGNETIC USER INTERFACE DEVICES, to U.S. patent application Ser. No. 13/310,670, filed Dec. 2, 2011, entitled MAGNETICALLY SENSED USER INTERFACE APPARATUS AND DEVICE, and to U.S. Provisional Patent Application Ser. No. 61/424,496, filed Dec. 17, 2010, entitled KNOB-ACTUATOR USER INTERFACE DEVICE WITH MAGNETIC SENSORS. The content of each of these applications is hereby incorporated by reference herein in its entirety for all purposes. These applications may be denoted collectively herein as the "Related Applications."

As noted previously, this disclosure relates generally to user interface devices using magnetic sensing. For example, in one aspect, the disclosure relates to a user interface device. The user interface device may include, for example, an actuator element. The actuator element may include or be coupled to an electromagnetic dipole array having a plurality of dipole elements for generating magnetic fields. The device may further include a control circuit for selectively energizing ones of a plurality of dipole elements of the dipole array to generate the magnetic fields. The device may further include a magnetic sensor element associated with the dipole array. The magnetic sensor element may be configured to sense the magnetic fields at a position of the actuator element and provide magnetic sensor output data corresponding to the sensed magnetic fields.

The electromagnetic dipole array may be, for example, a cross-shaped array having a pair of dipole elements on prongs of the array. The two prongs may be orthogonal or, in some embodiments, may not be orthogonal. The dipole array may include a ferrite cross-shaped substrate with windings on each of the orthogonal prongs. The electromagnetic dipole array may be a three-dimensional array having three dipole elements on three prongs of the array. The three prongs may be orthogonal or, in some embodiments, may not be orthogonal. The three prong dipole may include a ferrite cross-shaped substrate with windings on each of the orthogonal prongs. The dipole array may include three chip-scale inductors disposed in a pyramid configuration on a substrate, such as a printed circuit board (PCB) or other substrate.

The control circuit may be, for example, an electronic circuit for selectively providing currents to ones of a plurality of elements of the dipole array to generate the magnetic fields. The electronic circuit may be included, in whole or in part, in a processing element of a user interface device. The electronic circuit may include digital switching components, such as transistors or other switching components, along with associated analog and digital circuit components and control/processing components. The switching may be implemented by software running on a processing element or other processing device or component. The switching may be done in conjunction with sensing performed at the magnetic sensor element. The currents may be sequentially applied to ones of the plurality of elements of the dipole array by the electronic circuit. An ambient magnetic field condition may be sensed by the magnetic sensor and stored in a memory of the user interface device. An adjustment to the driving currents may be generated by the processing element based on the sensed magnetic field. The driving currents may be sequentially applied to the dipole elements to offset or cancel a sensed ambient magnetic field condition.

The magnetic sensor element may be, for example, a three-dimensional magnetic field sensor. The magnetic sensor element may be a compass sensor or magnetometer device, or other magnetic sensor.

The position of the actuator may be in a rest or neutral position. A first magnetic field measurement may be made in the rest or neutral position. The position of the actuator may subsequently be an actuated position offset from a rest or neutral position. A second or subsequent magnetic field measurement may be made at the actuated position or subsequent actuated or rest positions.

The device may further include, for example, a memory. The device may further include a processing element coupled to the memory. The processing element may be configured to perform or initiate one or more of the stages of: receiving the magnetic sensor output data; generating an estimated position or deformation of the actuator based at least in part on the received output data; and generating, based on the estimated position or deformation of the actuator element, an output signal usable by an electronic computing system coupled to the user interface device.

The device may further include, for example, a substrate. The substrate may be a printed circuit board or other substrate. The magnetic sensor may be disposed on the substrate. The control circuit may be disposed on the substrate. The device may further include a plurality of springs. The springs may be mechanically coupled between the actuator and the substrate to float the electromagnetic dipole array relative to the magnetic sensor. The springs may be electrical conductors for driving current and/or control, data, or other signals from the control circuit to the electromagnetic dipole array.

In another aspect, the disclosure relates to a method for electromagnetic sensing in a user interface device. The method may include, for example, one or more of the stages of:

selectively driving a first current in a first dipole element of a dipole array coupled to an actuator; sensing, at a multi-axis magnetic sensor, magnetic fields generated by the first dipole element; providing magnetic sensor output data corresponding to the first sensed magnetic fields; selectively driving a second current in a second dipole element of the dipole array; sensing, at the multi-axis magnetic sensor, magnetic fields generated by the second dipole element; providing magnetic sensor output data corresponding to the second sensed magnetic fields; receiving the magnetic sensor output data at a processing element; and determining, based at least in part on the magnetic sensor output data, a location or position of the actuator.

The first dipole element and the second dipole element may, for example, be disposed on orthogonal prongs of the dipole array in a cross-configuration. The first and/or second driving currents may be adjusted to compensate for a sensed ambient magnetic field condition. The magnetic sensor may be a three-axis magnetic sensor and the magnetic sensor output data corresponds to three-dimensional magnetic field data. The dipole array may comprise two dipole elements. The dipole array may comprise three or more dipole elements. The dipole array elements may be orthogonal or, in some embodiments, may not be orthogonal.

In another aspect, the disclosure relates to a method for processing signals in a user interface device, where the user interface device includes an actuator element having one or more magnets and one or more magnetic sensor elements configured to sense a position or deformation of the actuator element. The method may include, for example, receiving, during a movement or deformation of the actuator element from the released state, sensor data from the one or more magnetic sensor elements in a plurality of axes of measurement. The method may further include comparing the sensor data from the one or more magnetic sensor elements to a predefined magnetic field model to determine an estimated position or deformation of the actuator element from the reference state. The method may further include generating, based on the estimated position or deformation of the actuator element from the reference state, an output signal usable by an electronic device coupled to the user interface device. The predefined magnetic field model may be configured to relate positional information of the one or more magnets with corresponding sensor information associated with the one or more magnetic sensor elements.

The stage of comparing the sensor data from the one or more magnetic sensor elements to a predefined magnetic field model may include, for example, comparing the sensor data to values in one or more lookup tables to determine the estimated position or deformation. Comparing the sensor data may further include converting x and y dimension sensor measurements to an r-dimension measurement and determining the estimated position by accessing a lookup table including $B_r$ and z-dimension values. Alternately, or in addition, comparing the sensor data from the one or more magnetic sensor elements to a predefined magnetic field model may include solving, based on the sensor data, a closed form equation of the predefined magnetic field model to determine the estimated position or deformation. The plurality of orthogonal axes of measurement may be three orthogonal axes of measurement.

The one or more magnets may be permanent magnets. Alternately, or in addition, the one or more magnets may be electromagnets, such as electromagnets configured in a magnetic dipole array. The actuator element may include one or more movable elements. Alternately, or in addition, the actuator element may include one or more deformable elements.

The output signal may include, for example, data defining the estimated position of the actuator element and/or of magnets in or associated with the actuator element. The output signal may include data defining a motion of the actuator element. The output signal may include data defining the deformation of the actuator element. The predefined magnetic field model may include one or more lookup tables relating the positional information to the sensor information. The predefined magnetic field model may include a mathematic model, which may be a closed form solution model, relating the position information to the sensor information. The reference position may be a released state position or may be another position related to or associated with the released state position, such as a position offset from the released state position.

The reference position may be offset from a released state position, and the method may further include, for example, determining the offset from the released position and adjusting the estimated position based on the determined offset. The offset may be a function of temperature and/or other physical or operational parameters, and the estimated position may be adjusted responsive to a temperature measurement or measurement or determination of the other physical or operational parameters.

The method may further include, for example, compensating for unintended displacement of the manual actuator below a predetermined minimum threshold. The method may further include compensation for position of the magnetic user interface device using one or more compass devices. Position of the magnetic user interface device may be compensated by using a first compass on the magnetic user interface device and a second compass on a display or monitor of a coupled electronic computing system.

The determining of the offset from the released position may include, for example, generating a center calibration prism including a predetermined set of boundaries of the magnetic field components detected by each sensor, and repeatedly redefining the center calibration prism so as to auto-zero the released state position.

In another aspect, the disclosure relates to a magnetic user interface device. The magnetic user interface device may include, for example, an actuator element including one or more magnets, one or more magnetic sensor elements associated with the one or more magnets, where the one or more magnetic sensor elements may be configured to sense a position or deformation of the actuator element and/or the magnets associated with the actuator element. The magnetic user interface device may further include a memory configured to store a predefined magnetic field model. The magnetic user interface device may further include a processing element coupled to the memory. The processing element may be configured to receive, during a movement or deformation of the actuator element from the released state, sensor data from the one or more magnetic sensor elements in a plurality of axes of measurement, compare the sensor data from the one or more magnetic sensor elements to the predefined magnetic field model to determine an estimated position or deformation of the actuator element from the reference state, and generate, based on the estimated position or deformation of the actuator element from the reference state, an output signal usable by an electronic device coupled to the user interface device. The predefined magnetic field model may be configured to relate positional information of the one or more magnets with corresponding sensor information associated with the one or more magnetic sensor elements.

The one or more magnets may include permanent magnets. Alternatively, or in addition, the one or more magnets may include cross-shaped electromagnets or other electromagnet dipole array elements. The one or more magnetic sensor elements may include high sensitivity magnetic sensor elements, such as compass sensors or magnetometers.

In another aspect, the disclosure relates to a user interface device. The user interface device may include, for example, actuator means including one or more magnets, magnetic sensor means configured to sense a position or deformation of the actuator means, and memory means configured to store a predefined magnetic field model. The user interface device may further include processor means coupled to the memory means configured to receive, during a movement or deformation of the actuator element from the released state, sensor data from the one or more magnetic sensor elements in a plurality of axes of measurement, compare the sensor data from the one or more magnetic sensor elements to the predefined magnetic field model to determine an estimated position or deformation of the actuator element from the reference state, and generate, based on the estimated position or deformation of the actuator element from the reference state, an output signal usable by an electronic device coupled to the user interface device. The predefined magnetic field model may be configured to relate positional information of the one or more magnets with corresponding sensor information associated with the one or more magnetic sensor elements.

In another aspect, the disclosure relates to a computer-readable medium containing instructions stored on a non-transitory medium for causing a processor in a magnetic user interface device, wherein the magnetic user interface device includes one or more actuator elements and one or more magnetic sensor elements configured to sense motion or deformation of the actuator elements, to perform a signal processing method. The signal processing method may include receiving, during a movement or deformation of the actuator element from the released state, sensor data from the one or more magnetic sensor elements in a plurality of axes of measurement, comparing the sensor data from the one or more magnetic sensor elements to a predefined magnetic field model to determine an estimated position or deformation of the actuator element from the reference state, and generating, based on the estimated position or deformation of the actuator element from the reference state, an output signal usable by an electronic device coupled to the user interface device. The predefined magnetic field model may relate positional information of the one or more magnets with corresponding sensor information associated with the one or more magnetic sensor elements.

In another aspect, the disclosure relates to a method for generating a field model for use in a user interface device including one or more actuator elements and one or more magnetic sensor elements configured to sense motion or deformation of the actuator elements. The method may include, for example, orienting the user interface device in ones of a plurality of positions and determining and storing positional information corresponding to the ones of a plurality of positions, receiving and storing ones of a plurality of sensor data values corresponding to the ones of a plurality of positions, and associating the positional information with the sensor data values to generate the field model. The positional information and sensor data values may be associated in the form of a lookup table. Alternately, or in addition, the positional information and sensor data values may be associated in the form of a closed-form equation. In another aspect, the disclosure relates to a method of processing signals from a manual user interface device having a manual actuator that can be manually moved from a released state and returned to its released state as a result of restorative forces, the movement of the manual actuator causing relative movement between a plurality of magnets and a plurality of corresponding sensors that each generate signals representing three independent magnetic field components detected within each sensor. The method may include, for example, generating a field model for each sensor in which the signals from each sensor correspond to a predetermined set of position data, comparing the position data for each of the sensors to determine a displacement of the manual actuator from the released state, and generating signals for transmission to an electronic computing system representing the displacement of the manual actuator, the signals being generated in a predetermined format that can be interpreted by the electronic computing system.

In another aspect, the disclosure relates to a method of processing signals from a manual user interface device having a manual actuator that can be manually moved from a released state and returned to its released state as a result of restorative forces, the movement of the manual actuator causing relative movement between a plurality of magnets and a plurality of corresponding sensors that each generate signals representing three independent magnetic field components detected within each sensor. The method may include, for example, generating a center calibration prism including a predetermined set of boundaries of the magnetic field components detected by each sensor, and repeatedly re-defining the center calibration prism to auto-zero the released state position.

Various additional aspects, details, features, functions, apparatus, systems, processes, and methods are further described and illustrated below in conjunction with the appended drawing figures.

Example magnetic user devices on which embodiments may be implemented may include, for example, user interface devices, such as are described in the Related Applications, that include a movable and/or deformable manual actuator element for facilitating user interaction, through the device, with other elements, components, devices, and/or systems, such as computers or other electronic computing devices or systems. An element of the user interface device may be configured to provide restorative forces in response to user manipulation of the device. For example, the manual actuator may exhibit resistance to manipulation and may return to a neutral position with the use of springs, flexible membranes, or other mechanical elements.

Magnetic UIDs use one or more magnets and one or more magnetic sensors. The magnets may be permanent magnets configured such that each of the permanent magnets may be paired to a magnetic sensing element or elements. The sensing element or elements may be configured to measure magnetic field components, which may be measured in one or more axes (e.g., three-axes of motion in a typical embodiment).

In some embodiments, electromagnets may be used in place of or in additional to permanent magnets. Electromagnets may be formed in an electromagnetic dipole array, such as in a cross-shaped configuration to include two or three orthogonal dipoles. In some embodiments, a single cross-configured electromagnet and a single three-axis high sensitivity magnetic sensor may be used to provide a highly compact magnetic UID which may reduce component count, size, and/or complexity from magnetic UIDs using permanent magnets. The two (or more) dipoles may be selectively switched to generate a magnetic field for sensing in an electromagnet embodiment. The dipole elements of the electromagnetic embodiment may also be selectively driven to generate a shaped or compensated magnetic field to account for ambient magnetic field elements or other offsets or distortion.

A magnetic field model associated with the magnetic UID may be generated, and information related to the magnetic field model may be stored in the magnetic UID, such as in a memory or other data storage mechanism. The magnetic field model may comprise a closed-form mathematic model, such as in the form of one or more equations that represent relationships between sensor measurements and positions and/or deformations of the actuator(s) and/or associated magnets. Alternately, or in addition, the magnetic field model comprises a set of data, such as data configured in a lookup table (LUT) or other data structure to represent the relationships between sensor information and position or deformation information.

The magnetic UID may have information received from the magnetic sensors in conjunction with the magnetic field model to convert magnetic field measurements (such as during user movement or deformation of the actuator elements(s)) into position, motion, and/or deformation information and data corresponding with the magnets and/or actuator(s).

The magnets may be permanent magnets such as ferromagnets or other types of permanent magnets. The magnets may be positioned so that the north pole and south pole of each type of magnet are pointed or oriented in the same direction or are oriented in different directions. The sensing element or elements may be a magnetic sensor or sensors, for example, Hall-Effect sensors. In some embodiments, very sensitive sensors may be used that, for instance, measure Lorentz force, such as, for example, magnetometers or compass sensors, such as the BLBC3-B CMOS 3D Compass sensor from Baolab Microsystems or other compass or high sensitivity magnetic sensors.

In some embodiments, interpolation, offset compensation, and/or other processing or adjustment may be used to further refine the positional data of the magnet and associated actuator(s).

Terminology

As used herein the term "permanent magnet" refers to any object that is magnetized and creates its own persistent magnetic field. Suitable ferromagnetic materials for a permanent magnet include iron, nickel, cobalt, rare earth metals and their alloys, e.g. Alnico and Neodymium. Permanent magnets can also be made of powderized ferromagnetic material held together with an organic binder or by other materials known or developed in the art.

The term "electromagnet" refers to an element that generates a magnetic field when energized with a driving current. Electromagnets may be implemented as dipoles which may be arranged in an array configuration in an electromagnetic dipole array comprising two or more dipoles.

The term "released state" as used herein describes a state in which no operator-initiated forces are acting upon a magnetically-sensed manual actuator besides those which are inherently an aspect of the structure of the device itself, such as gravity. Furthermore, the term "reference point" as used herein describes the measurement in terms of magnetic field components made while the manual actuator of a manual user interface device is in the released state or in a state related to the released state by a compensation factor.

The term "magnet center position" as used herein refers to measurements of the position of the center of the magnet, such as the center of a permanent magnet or central position of an electromagnet such as a cross-shaped two dipole electromagnet, in relation to its corresponding magnetic sensor in terms of physical distance.

The term "electronic computing system" as used herein refers to any system that may be controlled by or otherwise interface with a manual user interface device. Examples of an electronic computing system include but are not limited to: personal computers (PCs), video game console systems, robotic arms, test or measurement equipment, imaging equipment, graphical art systems, as well as computer aided design systems.

The term "processing element" as used herein refers to a component which receives signals or data from sensors and is capable of processing the data to generate output signals. In a typical magnetic UID implementation, a processing element receives signals or data representing information from multiple magnetic sensors, processes the information to determine position, motion, deformation, and/or other information related to user interaction with the magnetic UID, and then generates output signals in a compatible format for transfer to the electronic computing system, with the output signal then transferred to the electronic computing system. In some embodiments the processing element may be integral with the electronic computing system, whereas in other embodiments the processing element may be within a separate device or apparatus. A processing element may include one or more processors, such as microcontrollers, microprocessors, digital signal processors (DSPs), field programmable gate arrays (FPGAs), application specific integrated circuits (ASICs), or other programmable devices, as well as one or more memories, one or more peripheral devices, such as analog-to-digital (A/D) converters, serial or parallel digital input/output devices, or other peripheral components or devices. A processing element may include a memory or other circuit for storing instructions for execution on the processor, or may be coupled to an external memory or other device to retrieve instructions for execution.

The terms "displace" and "displacement," when used herein in reference to the manual actuator and the magnets, shall mean various manual movements thereof, including, but not limited to, lateral movements along the X and Y axes, vertical movements along the Z axis, tilting, rotation, and permutations and combinations thereof. The same definition applies to movement of the magnetic sensors in the converse arrangement where the magnetic sensors are coupled to the manual actuator and move adjacent to stationary corresponding magnets.

The terms "magnetically sensed user interface device," "manual user interface device," and "magnetic user interface device (magnetic UID)" refer to any user interface device that utilizes, among other specialized components, a magnet or magnets that correspond to and move with respect to a magnetic sensor or magnetic sensors. The magnet(s) or magnetic sensor(s) are typically mounted onto some form of a manual actuator in a known or predefined arrangement.

A manual actuator on a magnetic UID is typically pivotably mounted by a restorative element such as a spring or springs so that the manual actuator and attached magnet(s) are free to move through a limited range about the magnetic sensor(s). Instead of a spring, magnetic UIDs may use adjacent permanent magnets oriented with opposite polarities to provide the restorative force necessary to return the manual actuator to a released state.

Each of the magnetic sensors may be closely paired with ones of the magnets. In magnetic UIDs with more than one of the magnets and one of the magnetic sensors, the magnetic sensors may be placed far enough apart so that the magnetic field of the magnets associated with other ones of the magnetic sensors do not strongly influence the measured magnetic fields at each of the magnetic sensors, or any influence may be compensated for. Each magnetic sensor may preferably measure three independent magnetic field components approximately at a single compact point in space within the sensor package. When the position of a magnetic sensor is referenced herein, the referenced sensor position refers to a point within the sensor package where the magnetic fields are measured.

As used herein, the term, "exemplary" means "serving as an example, instance, or illustration." Any aspect, detail, function, element, module, implementation, and/or embodiment described herein as "exemplary" is not necessarily to be construed as preferred or advantageous over other aspects and/or embodiments.

Example Embodiments

Examples of various configurations of magnetic UIDs and associated elements may be found in the Related Applications, including, for example, U.S. patent application Ser. No. 12/756,068, entitled MAGNETIC MANUAL USER INTERFACE DEVICE, and U.S. patent application Ser. No. 13/110,910, filed on May 18, 2011, entitled USER INTERFACE DEVICES, APPARATUS, AND METHODS, the entire disclosures of which are hereby incorporated by reference. Some example embodiments of such user interface devices are described subsequently with respect to FIGS. 1-7.

For example, FIGS. 1-5 illustrate details of an embodiment 50 of a magnetic UID that includes an upper substantially inverted dome shaped scalloped-edge manual actuator 51 and a lower base 52. The scalloped-edge actuator 51 may be encased by an over-molded elastomeric covering 53. Internally and along the bottom surface of actuator 51 a series of four top spring captures 51a (best seen in FIG. 5) and a series of four magnet mounts 51b may be formed. The magnet mounts 51b may be used to secure a set of four cylindrical magnets 54 to actuator 51. Each of the cylindrical magnets 54 may be oriented with its South pole facing towards the bottom of actuator 51 and its North pole facing towards a corresponding one of four sensors 55, which may be, for example, a Melexis MLX90333 Triaxis 3D-Joystick Position sensor or a Melexis MLX90363 sensor. In some embodiments, magnetic sensors with increased sensitivity may be used that, for instance, measure Lorentz force. In such embodiments one sensor may be used to measure and subtract off any local, background magnetic fields, such as the earth's magnetic field, to compensate for such fields and improve sensing accuracy and device performance.

Top spring captures 51a may be formed to aid in holding a set of four springs 56 in place during displacements of actuator 51. The center of the top of the actuator 51 may be concave, curving downward in the direction toward the base 52. About the center of the bottom of actuator 51, a center keying feature 51c (best illustrated in FIG. 5) may be formed. Actuator 51 may be mounted to a center limiting component 57 using a screw 58 and/or other attachment mechanisms. The top of center limiting component 57 may be formed with a limiting component keying feature 57a which may fit or engage with a complementary center keying feature 51c to aid in securing the center limiting component 57 to manual actuator 51. The center limiting component 57 may be configured so that it forms a cylindrical post on its top end, above the limiting component keying feature 57a. The bottom section of the center limiting component 57 may flatten to a larger diameter than that of its cylindrical post top.

Figure 2:
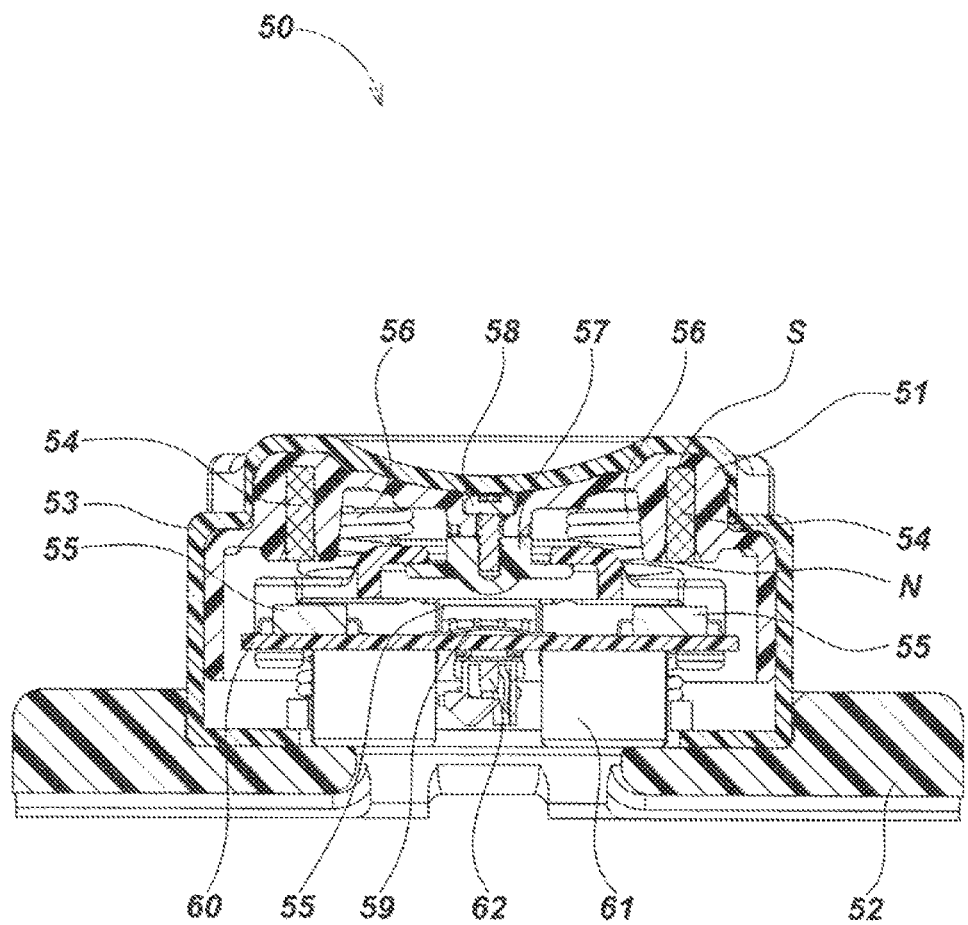
FIG. 2 is an enlarged vertical sectional view of the magnetic UID embodiment of FIG. 1 taken along line 2-2 of FIG. 1.

Evenly spaced in four places about the circumference of the flattened section of larger diameter, a series of curved projections may be formed in the center limiting component 57. A downward facing dome may be shaped about the bottom center of the flattened section of the center limiting component 57 in order to make contact with a mechanical dome switch 59 during certain downward displacements of actuator 51. A mechanical dome switch 59 (as shown in FIG. 2) may be mounted to the top center of a circuit board, such as clover leaf shaped printed circuit board 60. Each of the four sensors 55 may be mounted on a corresponding one of the four leaves of printed circuit board 60. Printed circuit board 60 may be mounted to the underside of a bottom spring mounting piece 61 using screws 58 or other attachment mechanisms.

Figure 3:
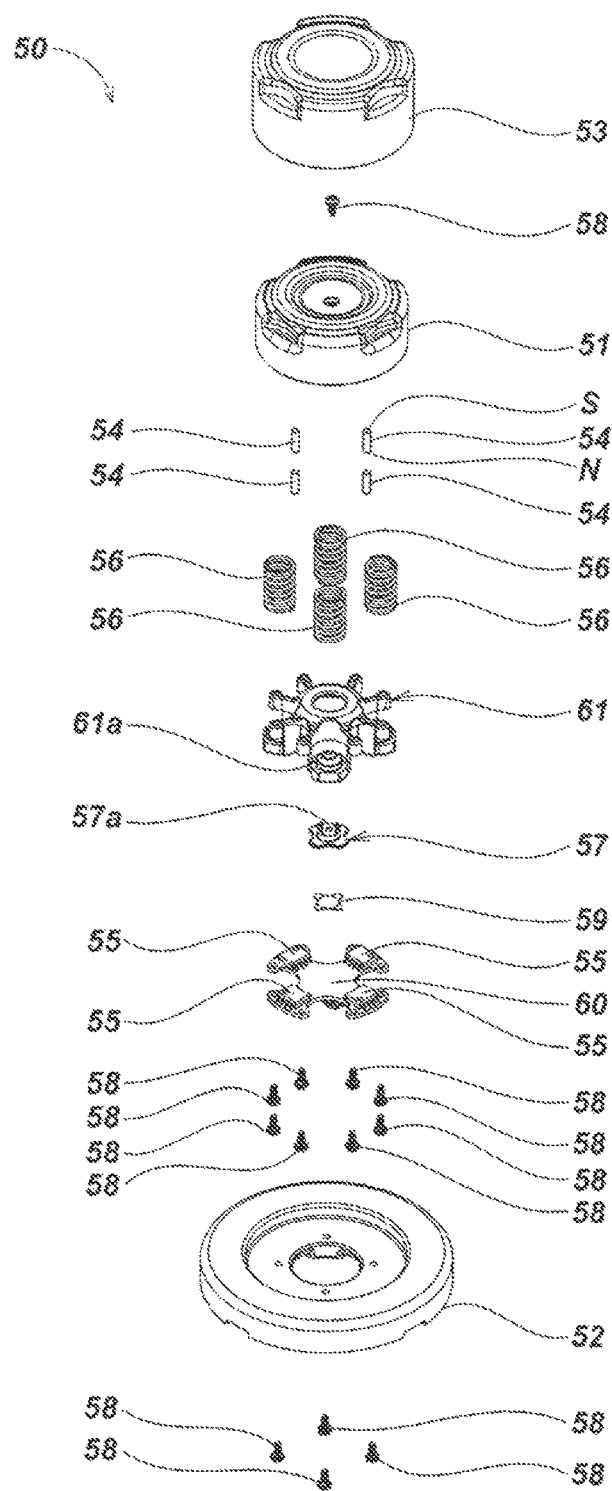
FIG. 3 is a slightly reduced exploded isometric view of the magnetic UID embodiment of FIG. 1 taken from above.
Figure 4:
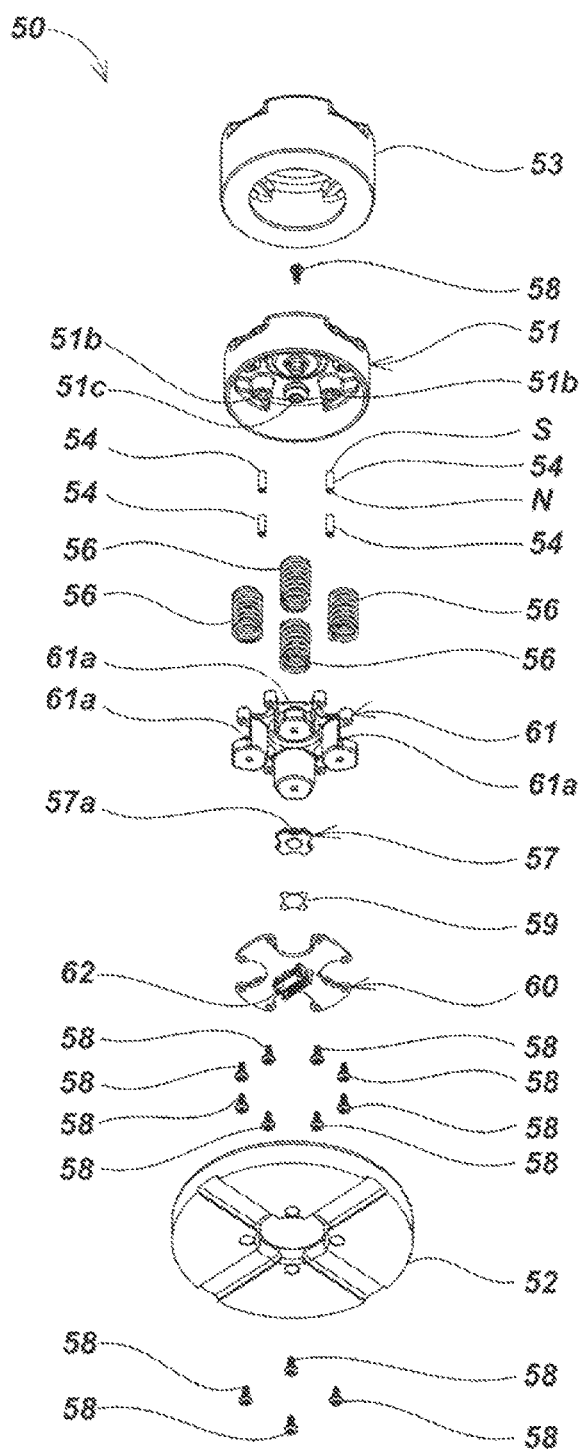
FIG. 4 is an exploded view of the embodiment of FIG. 3 taken from below.

An electrical connector 62 may be mounted on the bottom of printed circuit board 60. In between each leaf of printed circuit board 60, the bottom of each of the springs 56 may be mounted to the bottom of the partial cylindrical recesses formed by the bottom spring mounting piece 61. A set of bottom spring captures 61a (as shown in FIG. 3 and FIG. 4) may be formed about the bottom of each of the partial cylindrical recesses to aid in holding the springs 56 in place in relation to the bottom spring mounting piece 61. The partial cylindrical recesses may have a greater diameter than that of the springs 56 so as to allow range of motion of the springs 56 and actuator 51. A hole may be formed in the center of the bottom spring mount piece 61. The hole may be larger in diameter than the cylindrical post top section of the center limiting component 57 but may be smaller in diameter than its flattened section.

When the magnetic UID embodiment 50 is assembled, the cylindrical post section of the center limiting component 57 may be fitted through the hole of the bottom spring mounting piece 61 so that the flattened section of the center limiting component 57, which may have a larger diameter than the hole of the bottom spring mounting piece 61, is positioned along the bottom of the bottom spring mounting piece 61. Manual actuator 51 may thereby be secured to the bottom spring mounting piece 61, limiting travel and over extension of the springs 56. The positioning of the center limiting component 57 through the bottom spring mounting piece 61 creates a mechanism for restricting the range of motion of the actuator 51, thereby preventing over-stressing of the springs 56. The bottom spring mounting piece 61 may be mounted to the top of the bottom base 52 using a screw 58 and/or other attachment mechanisms.

Figure 5:
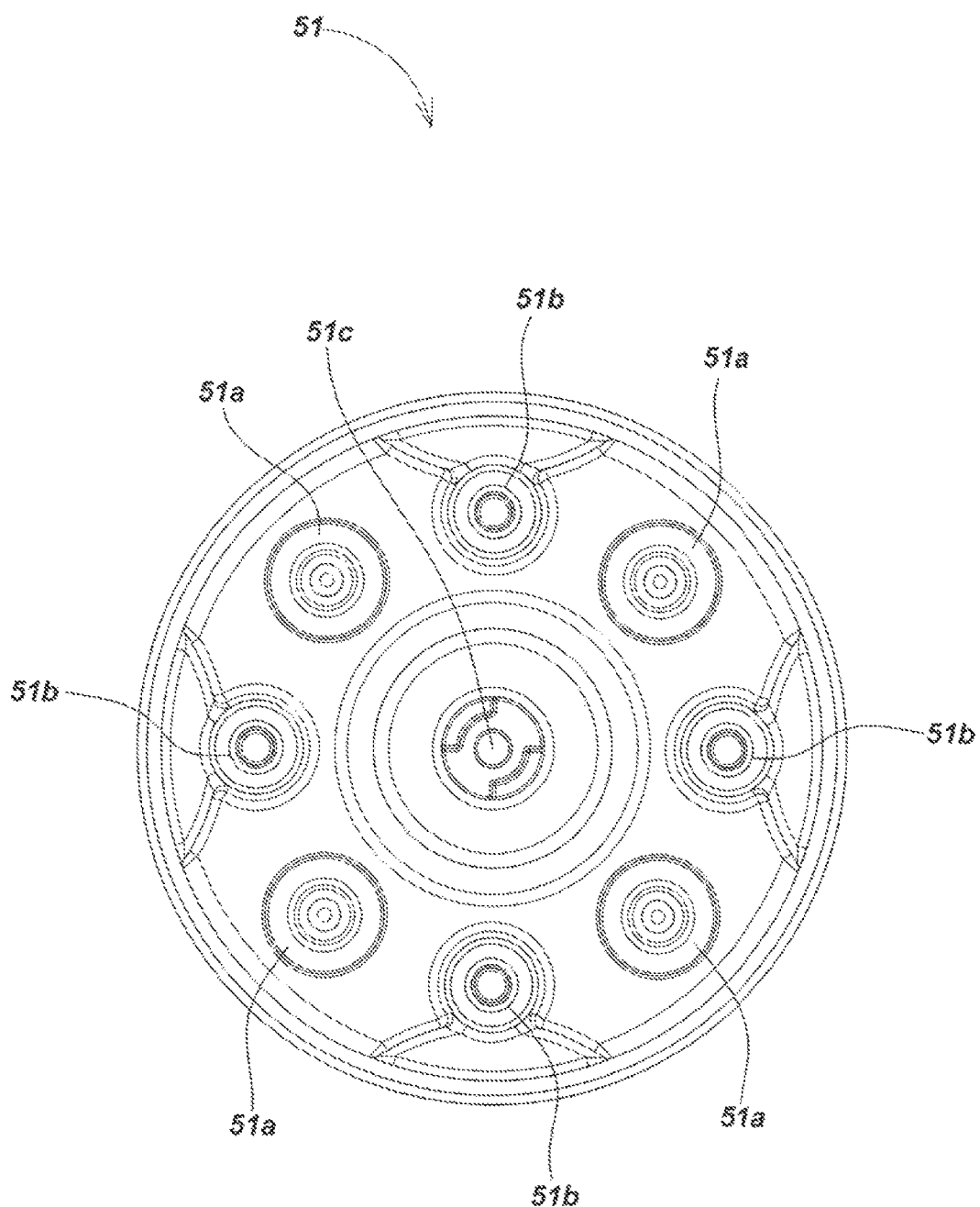
FIG. 5 is an enlarged bottom plan view of a scalloped-edge manual actuator of the magnetic UID embodiment of FIG. 1.

Referring to FIG. 5, top spring captures 51a may be evenly spaced about the internal circumference of manual actuator 51. Between each of the top spring captures 51a one of each of the magnet mounts 51b may be disposed. By positioning the cylindrical magnets 54 (as illustrated in FIGS. 2-4) as far along the internal circumference as possible, the distance between one of the cylindrical magnets 54 and the other ones of the cylindrical magnets 54 may be maximized within the actuator 51, which may thereby reduce interference. For example, if the distance between each of the cylindrical magnets 54 is maximized to the extent possible within a particular actuator shape, each magnetic field generated by the cylindrical magnets 54 may be correspondingly minimally influenced by the magnetic field of the other cylindrical magnets 54. In an exemplary embodiment, springs 56 may be positioned as far towards the internal circumference of actuator 51 as is practical.

Figure 6:
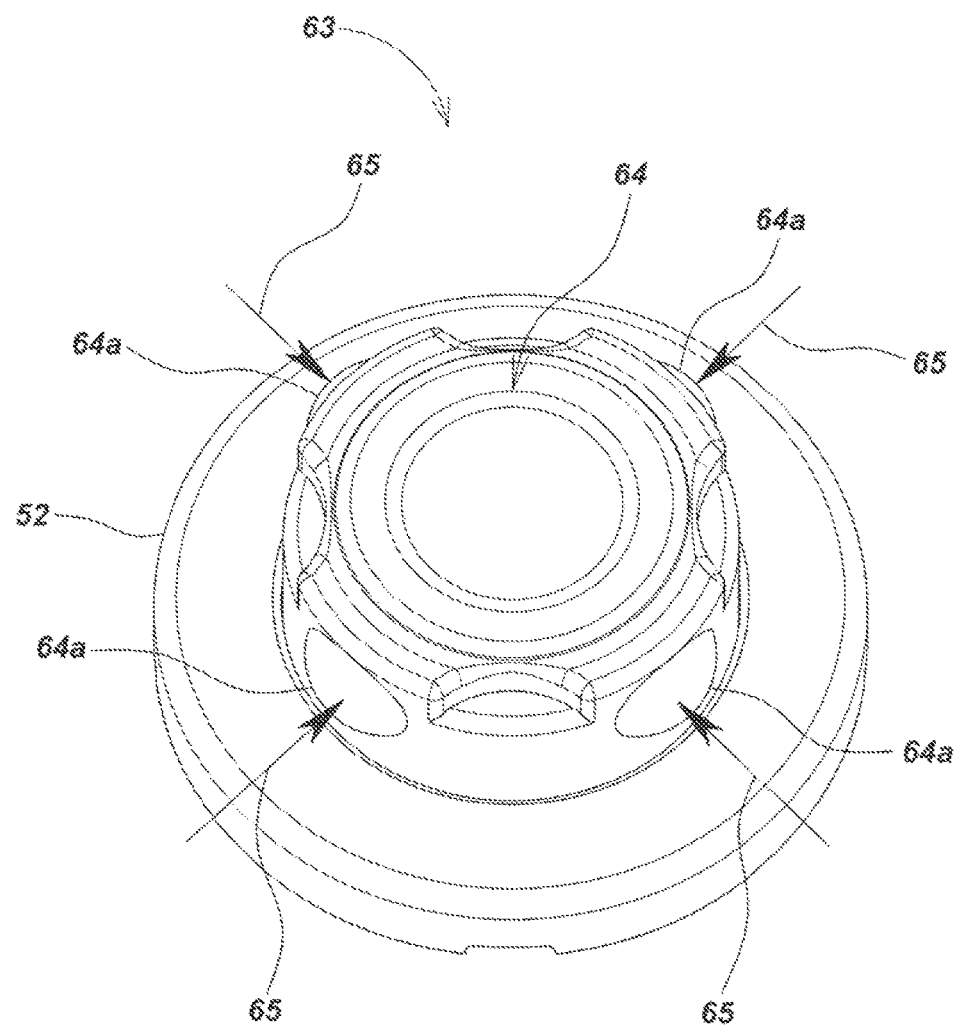
FIG. 6 is an isometric view of details of an alternate embodiment of a magnetic UID similar to the embodiment of FIGS. 1-4 with added switch bumps.
Figure 7:
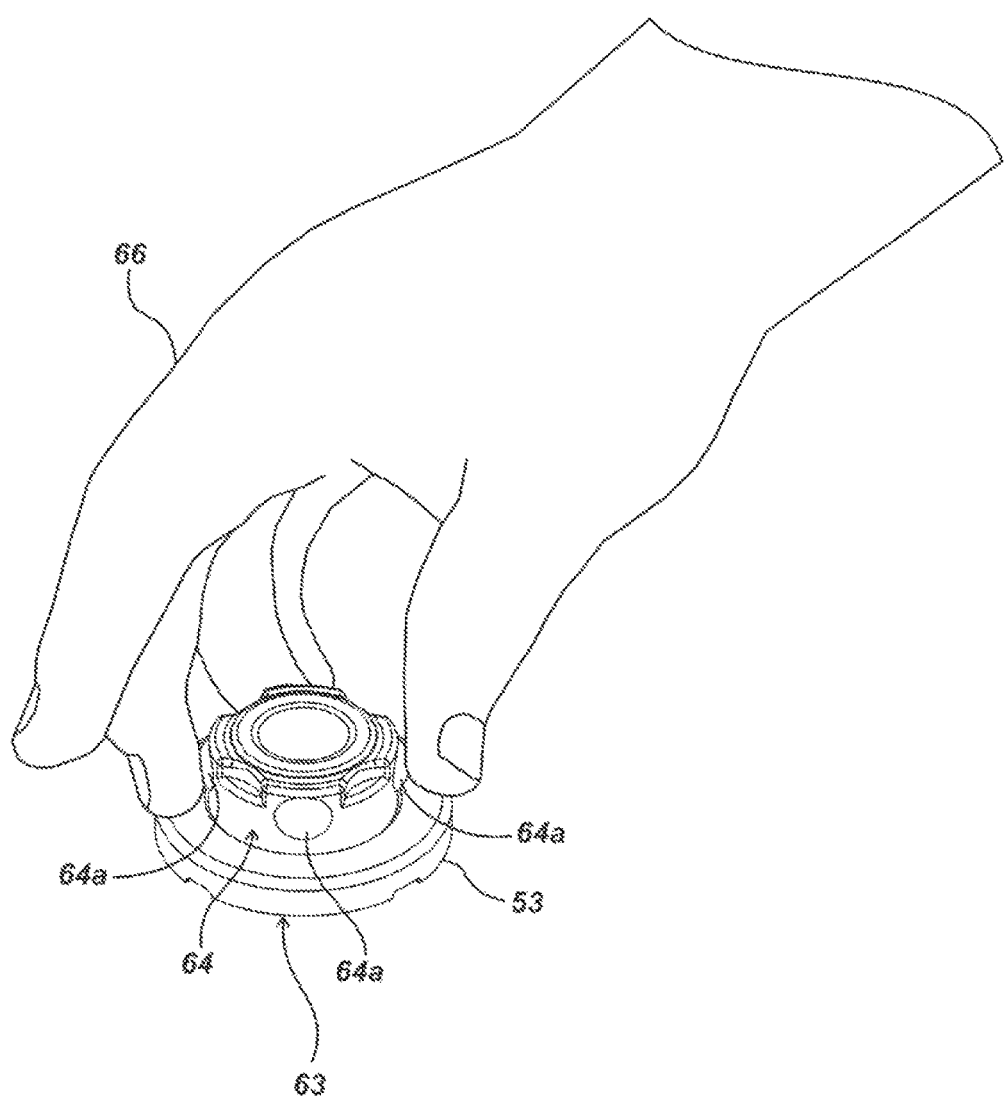
FIG. 7 is a reduced isometric view of a user's hand squeezing a switch bump on the magnetic UID embodiment of FIG. 6.

FIGS. 6 and 7 illustrate details of an alternate embodiment 63 of a magnetic UID, which is similar to embodiment 50 of FIGS. 1-5 except that embodiment 63 further includes an elastomeric covering 64 formed with four switch bumps 64a. In magnetic UID embodiment 63, each of the switch bumps 64a may be formed in the general shape of a dome and positioned along the vertical surface of the elastomeric covering 64 to allow user interaction with corresponding switches, which may be used to generate signals to be provided to a coupled computer or other electronic computing system. The switch bumps 64a may also be positioned evenly about the circumference defined by the vertical surface of the elastomeric covering 64.

The switch bumps 64a may be mechanically associated with a corresponding switch (not illustrated) that may be mounted to actuator 51, such as underneath the elastomeric covering 64. Suitable switches include, but are not limited to, electro-mechanical switches, as well as pressure sensitive variable resistance, capacitance, or inductance switching devices. In addition, optical interruption or variable intensity devices including interrupted or frustrated total internal reflection may be used as switches in some embodiments. Flexible wiring (not illustrated), a flex circuit (not illustrated), and/or springs 56 are example components that may be used to provide electrical connections from the switches to an associated PCB, such as to the clover leaf shaped printed circuit board 60.

The switch bumps 64a, when manually depressed, may be configured to afford the user a plurality of push button controls. A set of lines 65 in FIG. 6 illustrate the direction that radial inward force may be applied to the switch bumps 64a to activate the push button control. A user's hand 66 (as shown in FIG. 7) can grasp and squeeze the top of the manual user interface device 63, and the thumb and fingers of the user's hand 66 can individually activate the switch bumps 64a, with the activation then processed to initiate commands in an output signal to be provided to the electronic computing system. For example, squeeze or other deformation actions may be applied to the actuator, either alone or in combination with the switches, to signal user interactions with the electronic computing system. In a computer aided design (CAD) system, for example, a squeeze and/or switch actuation may be interpreted as picking up of a virtual object on a display screen of the electronic computing system.

In other applications, a squeeze of the manual user interface device 63 may be used to indicate a particular action in a video gaming system or for selecting text or other elements in a document interface, either alone or in combination with the switches. For example, the switch bumps 64a may serve the function of right and left mouse clicks of a cursor control device. Various other positions and arrangements of the switch bumps 64a and switches are possible to optimize ergonomics or particular use of the manual user interface device 63.

Though the above-described types of switching are represented in the embodiment 63, similar switching device configurations may also be adapted for use in the various other embodiments of magnetic UIDs. Although embodiment 50 and embodiment 63 illustrate two configurations of magnetic UIDs that may advantageously be used with the various processes as described herein, other configurations of manual user interface devices may include a variety of quantities, shapes, and/or arrangements of magnets and/or associated sensors to provide additional sensing functions. In addition, it is noted that various other types of magnetic sensors in addition to the described Melexis MLX90333 sensor (that specifically measures the Hall effect) may also be used such as, but not limited to, GMR sensors and InSb magnetoresistors.

Multi-axis magnetic sensors, such as Hall effect sensors 55 of FIGS. 2-4, sense multiple magnetic field components (typically in three axes) and generate corresponding sensor data. The sensor data may then be provided to a processing element, comprising a microprocessor, microcontroller, DSP, ASIC, or other programmable processing device or component. Because the magnetic field components are measurements of magnetism rather than positions in space, the processing element must be configured to interpret the magnetic field components as a position of each magnet relative to its corresponding magnetic sensor. The interpreted position may be relative to a reference position, such as a released state position or other position (e.g., a reference position at an offset from the released state position that may be adjusted for or compensated for during processing of the magnetic sensor signals).

Figure 8:
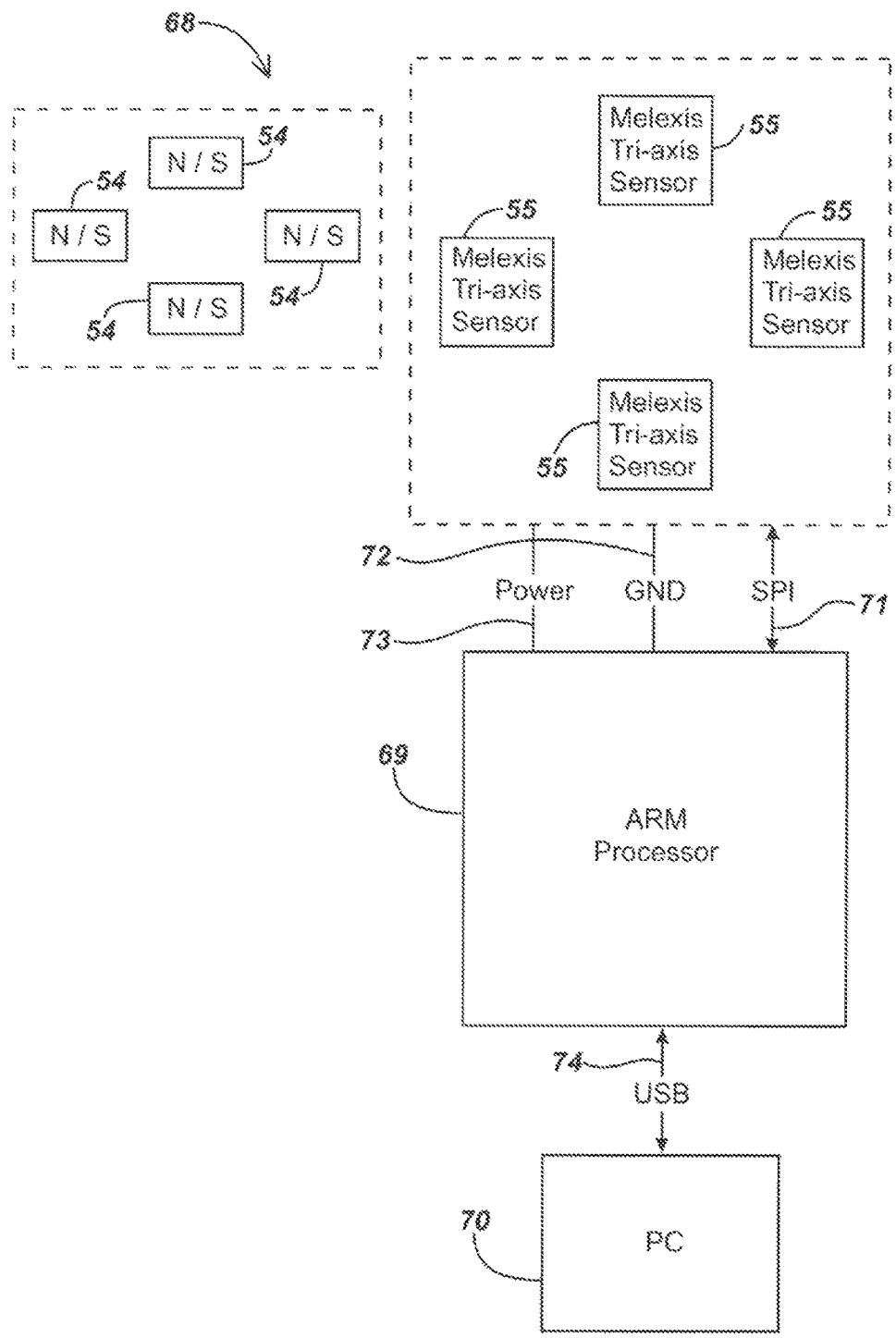
FIG. 8 is a block diagram illustrating details of an embodiment of circuitry for operatively coupling the magnetic UID embodiments of FIG. 1 or 6 to a computer or other electronic computing device.

FIG. 8 illustrates details of an embodiment 68 of circuitry that may be used to couple a manual user interface device, such as devices 50 or 63, to an electronic computing device or system such as a personal computer (PC) 70, which may be a notebook or laptop computer, desktop computer, tablet computer, smart phone, or other computing device.

In operation, sensors 55 may generate signals, such as periodically or asynchronously, associated with sensed displacements of the cylindrical magnets 54 (sensors may also generate signals during time periods when the magnets and associated actuator(s) are in a released position, and/or the user interface device may use determination of a released state for a period of time to control other functions, such as controlling power consumption).

The sensor signals may be sensed at one or more positions of the magnets, which may be positions relative to a reference or released state position. The sensed signals may then be sent to a processing element such as, for example, an ARM (or other) processor 69, which may be an NXP LCP2366 microcontroller or other processing device. The sensed signals may be in digital format or may be converted to digital format (if in analog format) by an analog-to-digital converter (A/D), which may be in the processor or in a separate device. The processor may then perform one or more processing methods on the received signals, such as those described subsequently herein, to determine information such as an estimated position, motion, and/or deformation of the actuator and/or associated magnets. The information may be provided in an output signal, which may be sent as output data, in a compatible format, to the PC 70 or other electronic computing device.

In an exemplary embodiment, a serial peripheral interface (SPI), or other parallel or serial connection 71, may be used to transmit sensor output signals from the sensors 55 to the processor 69. A ground (GND) connection 72 and a power connection 73 may also connect the sensors 55 to the ARM processor 69. The PC 70 may be connected to the processor 69 by a USB connection 74, which may advantageously provide both data transmission between the processor 69 and PC 70 and power to the ARM processor 69. Variations of the circuitry 68 as illustrated in FIG. 8 will be apparent to those skilled in the art. For example, different circuitry embodiments may have a different quantity of sensors and magnets, different power and interface circuitry, use different components, or have other differences in configuration. For example, different types of processing elements, such as different microcontrollers and/or different circuits for transmitting data and/or power to the manual user interface device, may be used.

Figure 9:
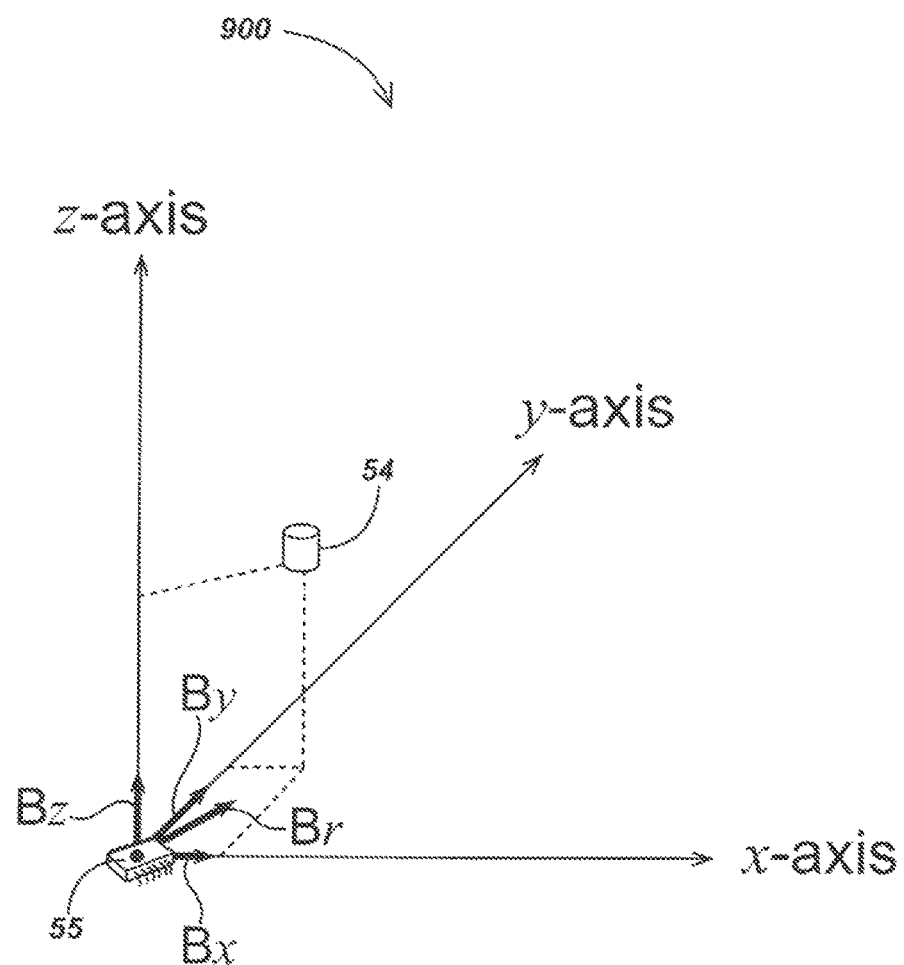
FIG. 9 is an illustration of an example magnetic sensor and magnet configuration and associated magnetic field components.

FIG. 9 illustrates details 900 of an embodiment of a magnetic field sensing configuration and associated magnets consistent with the present invention. In an exemplary embodiment, the magnetic sensors, may be configured to measure three magnetic field components, notated herein as $B_x$, $B_y$, and $B_z$ associated with corresponding magnets so that each of these three component measurements corresponds to a sensed value along one of three axes of diagram 900. A magnetic field component in the X-Y plane extending radially from the Z axis, notated herein as $B_r$, may also be calculated in a processing element by solving for $B_r$ as $SQRT(B_x^2+B_y^2)$. By calculating $B_r$, the sensor signals may be processed using a magnetic field model configured in the form of lookup tables (such as described subsequently herein), which may simplify processing and/or preserve storage space for memory associated with the processing element.

FIGS. 10 and 11 illustrate portions of example lookup tables (LUTs) 1000 and 1100, respectively, that may be used to process received sensor information to determine position, motion, and/or deformation estimates for the magnets and associated actuator. LUT 1000 is a radial displacement lookup table and LUT 1100 is a Z-axis displacement lookup table. In order to interpret magnetic field components to determine positional information of a corresponding magnet, such as ones of the cylindrical magnets 54 of FIGS. 1-8, a processing element may use the sensed magnetic field component values (as may be generated by magnetic sensors, such as sensors 55 of FIG. 8) to retrieve information from a radial displacement lookup table 1000 and a Z-axis displacement lookup table 1100. The values of the field model data represented in the lookup tables may be calculated using commercially available modeling software such as, for example, finite element modeling software provided by COMSOL (available at www.comsol.com) or other vendors.

In the examples shown in FIGS. 10 and 11, both radial displacement LUT 1000 and Z-axis displacement LUT 1100 tables are configured in three columns. The first column includes a range of measured values that describes a radius in magnetic field component measurements between the magnets and the Z-axis of its corresponding magnetic sensor. In these examples the units are milliteslas (mT).

It is noted that measurements in the magnetic field components about x and Y may alternately be used in place of radial measurements as shown. Utilizing a radial measurement of the magnetic field components requires some additional calculations, but may be advantageous in cases where less storage space is available, since radial information typically requires far less storage space. The second column includes a range of measured values along the Z-axis in magnetic field component measurements between the magnets and corresponding magnetic sensors (similarly in milliteslas (mT)). Pairing of values from the first column to those of the second column will correspond to actual positional information between the permanent magnet and corresponding magnetic sensor.

In the radial displacement lookup table 1000, partially illustrated in FIG. 10, the third column corresponds to a radial distance from the Z-axis between each of the magnets and corresponding magnetic sensors measured in millimeters. Note that the radial displacement lookup table 1000 illustrated in FIG. 10 is a partial illustration as a larger range of values is generally used in practice. In the Z-axis displacement lookup table 1100, partially illustrated in FIG. 11, the third column corresponds to a Z-axis distance between the magnets and corresponding sensors. Again, the Z-axis displacement lookup table 1100 illustrated in FIG. 11 is a partial illustration as a larger range of values is generally used in practice.

The information in the magnetic field model defining the relationship between the magnetic field component measurements and positioning between the magnets and magnetic sensors may be generated in various ways. For example, empirical direct measurement may be used. Another method of generating this information is by mathematically modeling the relationship. Mathematical modeling software, such as COMSOL, may be used when utilizing this approach. Other methods include, but are not limited to, using magnetic theory to calculate these relationships and utilizing an over determined self-fit model. An overdetermined self-fit model is an empirical approach wherein movement of the magnets about the magnetic sensors are used to refine the lookup table through use of the manual user interface device.

Once the positional data about each magnetic sensor has been determined, one or more processing algorithms may be used to interpret the radial and Z-axis positions as positions along three Cartesian axes. Individual interpretation of the position of each of the magnets allows for comparison of the displacement of each magnet with the other magnets to interpret the position and orientation of the actuator, as well as actions such as squeezes or other deformations. Commands or other information to be provided to an electronic computing system may then be generated according to the specific displacements of the actuator, such as in the form of position information, deformation information, motion information, switch actuations, and/or other magnetic UID information, and transferred, in an appropriate signaling format, from the magnetic UID to the electronic computing system.

Figure 12:
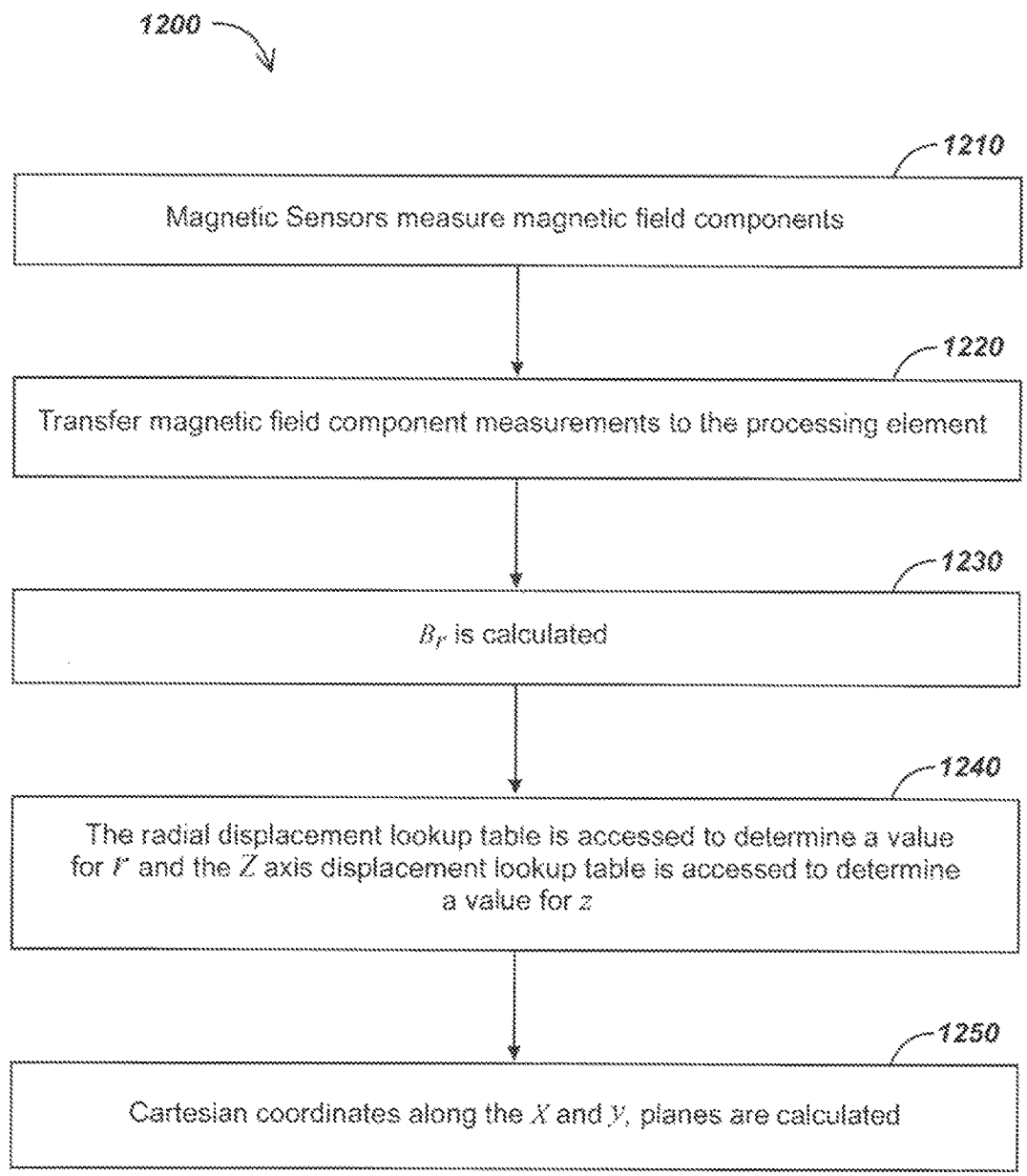
FIG. 12 illustrates details of an embodiment of a process for determining the position of a magnet in relation to a corresponding magnetic sensor using lookup tables in a magnetic UID.

FIG. 12 illustrates details of an embodiment of a process 1200 for determining the position of magnets, such as the magnets 54 shown in FIG. 8, in relation to corresponding magnetic sensing elements, such as corresponding magnetic sensors 55, from the magnetic field component measurements. In a typical configuration, one magnet is paired with one magnetic sensor; however, other configurations of magnets and magnetic sensors may be used in some embodiments. At stage 1210, magnetic field components may be measured by the magnetic sensors in one or more dimensional axes, typically in three orthogonal axes for each sensor device. In the example process 1200, three-dimensional measurements may be made by the magnetic sensors, with the three-dimensional axes of measurement denoted as $B_x$, $B_y$, and $B_z$. In an exemplary embodiment, multi-axis sensors, such as two or three axis magnetic sensors, may be used to sense magnetic fields in all three axes at a single reference point on or in the sensor. The sensing may be periodic, such as at 1 millisecond or 10 millisecond intervals or at other periodic sensing intervals, and/or may be asynchronous, such as at a rate or time determined by a relative amount of motion, or responsive to an interrupt or other circuit action, such as in time intervals determined by a power control circuit or other circuit.

At stage 1220, the measured magnetic field component information may be transferred or otherwise provided to a processing element, such as to ARM processor 69 as shown in FIG. 8 (and/or to other processing elements in various embodiments, such as ASICs, DSPs, FPGAs, other microcontrollers, or programmable devices). The transferred information may be in an analog or digital format, depending on the output capabilities of the magnetic sensors and the input capabilities of the processing element.

notated herein as $B_x$, $B_y$, and $B_z$, associated with corresponding magnets so that each of these three component measurements corresponds to a sensed value along one of three axes of diagram 900. A magnetic field component in the X-Y plane extending radially from the Z axis, notated herein as $B_r$, may also be calculated in a processing element by solving for $B_r$ as $SQRT(B_x^2+B_y^2)$. By calculating $B_r$, the sensor signals may be processed.

At stage 1230, a radial magnetic field component may be calculated. For example, the equation $SQRT(B_x^2+B_y^2)$ may be processed in the processing element to generate a value for $B_r$, the value of the magnetic field component extending radially from the Z axis at the sample time. As noted previously, determining $B_r$ may be advantageous in applications where storage capability is constrained; however, in some embodiments, signal processing using $B_x$ and $B_y$, rather than $B_r$, may alternately be used.

At stage 1240, with a known value of $B_r$ and $B_z$, one or more lookup tables, such as example radial displacement lookup table 1000 and example Z axis displacement lookup table 1100, may be accessed by the processing element to establish a radial displacement from the Z axis respectively and a position along the Z axis. The radial displacement is denoted hereafter as r and the position along the Z axis is denoted hereafter as z.

At stage 1250, calculations may be done to determine x and y values defining an estimated location of the magnet in relation to the corresponding magnetic sensor, such as in a Cartesian coordinate system. In a typical application, the expression $B_x/B_y$ may be assumed to be proportionate to the expression x/y, and the values of x and y may be found by:

$$x = \frac{B_x}{|B_y|} y \text{ and } y = \frac{B_y}{|B_y|} \sqrt{\frac{r^2}{1 + \left(\frac{B_x}{B_y}\right)^2}}.$$

In this way, positional information of each magnet in the form of x, y, and z, coordinates may be determined with respect to each magnet's corresponding magnetic sensor. In other embodiments, alternate coordinate systems may be used for the output information if such a coordinate system would be advantageous in either processing sensor data or providing output data from the user interface device to an electronic computing device or system. For example, in some applications it may be desirable to provide output information in a non-Cartesian coordinate system, such as one using angle and magnitude information to represent a position in space, in which case the signals from the magnetic sensors may be processed directly in the non-Cartesian coordinate system and output in the non-Cartesian system. In some embodiments, it may be desirable to solve directly for position in a Cartesian system and then convert this information to a non-Cartesian coordinate system, or solve in one non-Cartesian coordinate system and output the positional information in a second, different non-Cartesian coordinate system.

In addition, in some embodiments, other processing stages and/or algorithms may be used in addition to, or in place of, the lookup tables to solve for position information of the magnets and/or actuator. For example, the magnetic field model may be a closed form solution model, such as may be generated analytically by, for example, solving magnetic field equations based on the particular magnet and sensor configuration, or by generating a mathematical model based on measured data for particular magnet and sensor configurations and fitting the measured data to a closed-form model.

Figure 13:
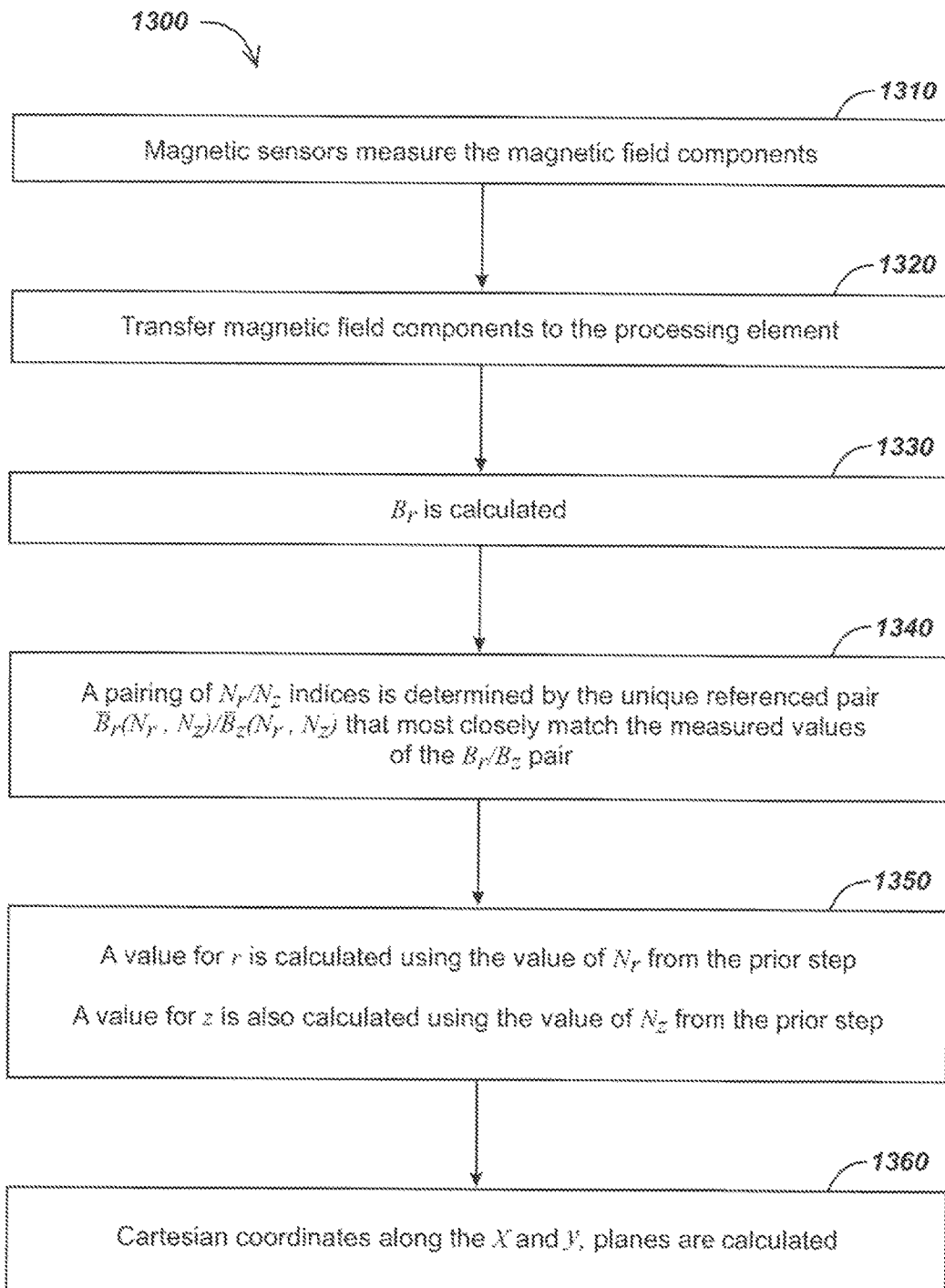
FIG. 13 illustrates details of an embodiment of a process for determining the position of a magnet in relation to a corresponding magnetic sensor using an indexed list in a magnetic UID.

FIG. 13 illustrates details of another embodiment of a process for determining the position of magnets, such as the magnets 54 shown in FIG. 8, in relation to corresponding magnetic sensing elements, such as corresponding magnetic sensors 55, from magnetic field component measurements. As shown in FIG. 13, process 1300 may be used to determine the positions of the magnets in relation to corresponding magnetic sensors using an indexed table of possible magnetic field values.

At stage 1310, magnetic field components for each magnet, $B_x$, $B_y$, and $B_z$, may be measured by ones of corresponding magnetic sensors. In an exemplary embodiment, this may be done by a three-axis magnetic sensor. At stage 1320, the magnetic field component measurements may be transferred or otherwise provided to a processing element or module, such as to ARM processor 69 as shown in FIG. 8 (and/or to other processing elements in various embodiments, such as ASICs, DSPs, FPGAs, other microcontrollers, or programmable devices).

At stage 1330, $B_r$ may be calculated in the processing element, such as by solving the equation $B_r = \text{SQRT}(B_x^2 + B_y^2)$. At stage 1340, lookup tables, such as two indexed tables, including a first table, $\overline{B}_r$, of magnetic field components in the radial direction and a second table, $\overline{B}_z$, of magnetic field components in the z direction, may be accessed to find the pair of table values $\overline{B}_r(N_r, N_z)$, $\overline{B}_z(N_r, N_z)$, that most closely correspond to the measured values, $B_r$ and $B_z$.

The most closely related $\overline{B}_r(N_r, N_z)$, $\overline{B}_z(N_r, N_z)$ pair to each measured $(B_r, B_z)$ pair may be identified, for example, as the minimum value of the expression $|B_r - \overline{B}_r(N_r, N_z)| + |B_z - \overline{B}_z(N_r, N_z)|$ for the set of possible pairs of values in the tables $\overline{B}_r$ and $\overline{B}_z$. The tables $\overline{B}_r$ and $\overline{B}_z$ may be organized such that the values of r linearly increase with the index $N_r$ at spacing $M_r$ with offset $D_r$, and the values z increase linearly with the index $N_z$ at spacing $M_z$ with offset $D_z$, or in other suitable configurations.

At stage 1350, a value for r may be determined given the index $N_r$ according to the relationship $r = N_r * M_r + D_r$. Similarly, a value for z may be calculated from the index $N_z$ according to the relationship $z = N_z * M_z + D_z$. Alternatively, it will be apparent to those skilled in the art that the tables may also be arranged in various non-linear configurations and that corresponding suitable functions may be evaluated to relate the $(N_r, N_z)$ pair to their corresponding values of r and z.

At stage 1360, x and y values in Cartesian coordinates may be determined. In a typical application, the expression $B_x/B_y$ may be assumed to be proportionate to the expression x/y, and the values of x and y may be found by solving:

$$x = \frac{B_x}{|B_y|} y \text{ and } y = \frac{B_y}{|B_y|} \sqrt{\frac{r^2}{1 + \left(\frac{B_x}{B_y}\right)^2}}.$$

Accordingly, positional information for each magnet in the form of x, y, and z coordinates may be established relative to corresponding magnetic sensors.

In other embodiments, alternate coordinate systems may be used for the output information if such a coordinate system would be advantageous in either processing sensor data or providing output data from the user interface device to an electronic computing device or system. For example, in some applications it may be desirable to provide output information in a non-Cartesian coordinate system, such as one using angle and magnitude information to represent a position in space, in which case the signals from the magnetic sensors may be processed directly in the non-Cartesian coordinate system and output in the non-Cartesian system. In some embodiments, it may be desirable to solve directly for position in a Cartesian system and then convert this information to a non-Cartesian coordinate system, or solve in one non-Cartesian coordinate system and output the positional information in a second, different non-Cartesian coordinate system.

In addition, in some embodiments, other processing stages and/or algorithms may be used in addition to, or in place of, the lookup tables to solve for position information of the magnets and/or actuator. For example, the magnetic field model may be a closed form solution model, such as may be generated analytically by, for example, solving magnetic field equations based on the particular magnet and sensor configuration, or by generating a mathematical model based on measured data for particular magnet and sensor configurations and fitting the measured data to a closed-form model.

Figure 14:
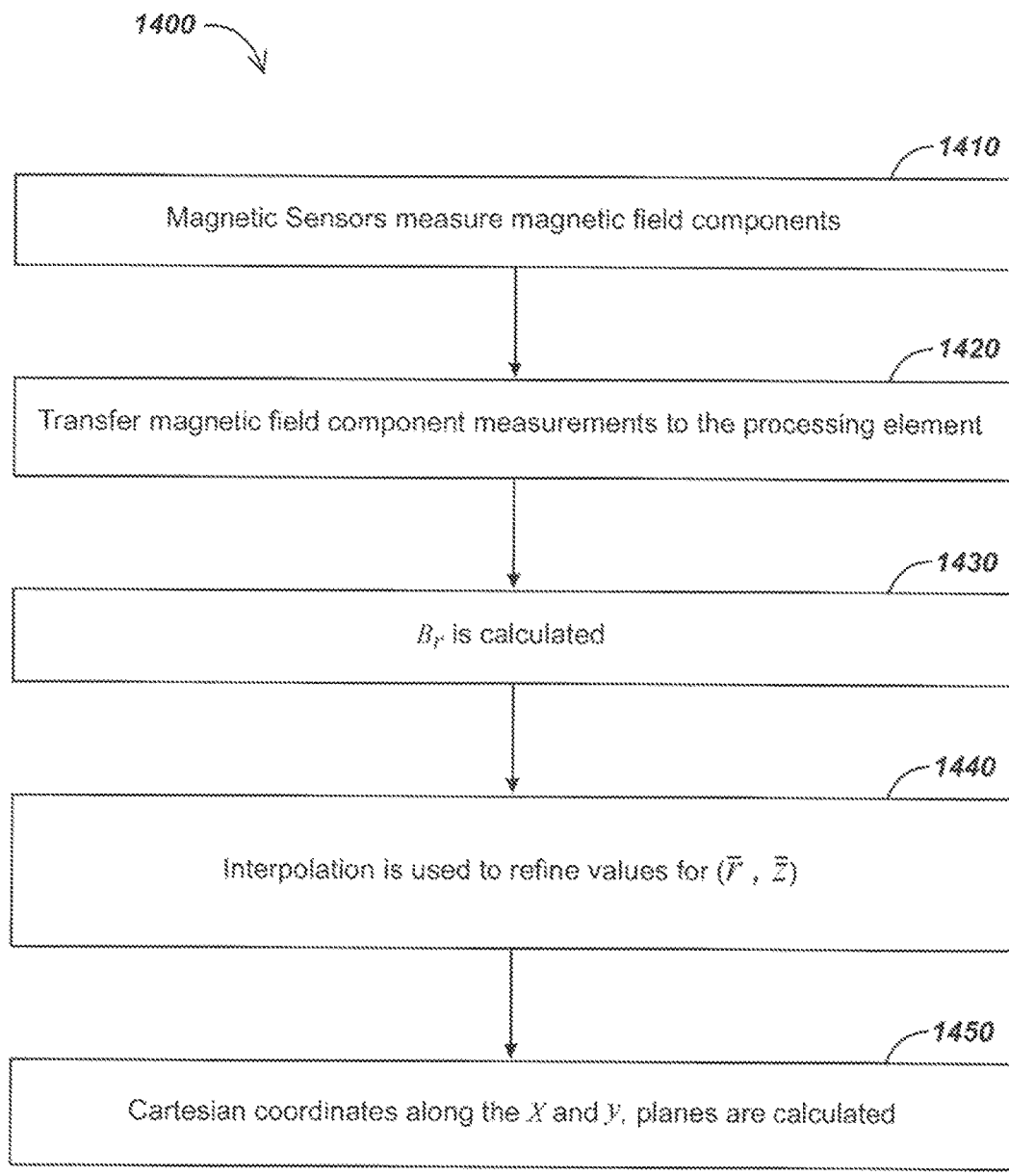
FIG. 14 illustrates details of an embodiment of a process for determining the position of a magnet in relation to a corresponding magnetic sensor using interpolation in a magnetic UID.

FIG. 14 illustrates an embodiment of a process 1400 for using interpolation to refine positional data of magnets and/or associated actuators. At stage 1410, the magnetic field components $B_x$, $B_y$, and $B_z$ may be measured by a magnetic sensor, such as described previously. At stage 1420, the measured magnetic field components may be transferred to a processing element, such as the ARM processor 69 as shown in FIG. 8 (and/or to other processing elements in various embodiments, such as ASICs, DSPs, FPGAs, other microcontrollers, or programmable devices).

At stage 1430, a value of $B_r$, the magnetic field component extending radially from the Z axis, may be determined, such as by solving for $SQRT(B_x^2+B_y^2)$. In an exemplary embodiment, lookup tables may be used, such as described previously. The $\overline{B}_r$ and $\overline{B}_z$ values may be uniformly spaced within the tables.

At stage 1440, since measured values of $B_r$ and $B_z$ may not directly correspond to a $(\overline{B}_r, \overline{B}_z)$ pair as found in a radial position lookup table, such as the radial position lookup table 1000 shown in part in FIG. 10, or a Z-axis position lookup table, such as the Z-axis position lookup table 1100 as shown in FIG. 11, a set of close referenced measurements, such as, for example, the four (or other) most closely referenced measurements in the lookup table, may be used to produce a more accurate approximation of the positional data of each magnet. In an example embodiment using the four closest pairing, the four closest $(\overline{B}_r, \overline{B}_z)$ pairings referenced in each table may be denoted as $(B_{r1}, B_{z1})$, $(B_{r1}, B_{z2})$, $(B_{r2}, B_{z1})$, $(B_{r2}, B_{z2})$, where $(B_r, B_z)$ may be measured between these four closest $(\overline{B}_r, \overline{B}_z)$ pairings.

For each of these four closest $(\overline{B}_r, \overline{B}_z)$ pairings, an r value and z value may be found from a radial position lookup table, such as the radial position lookup table 1000 shown in part in FIG. 10, and a Z-axis position lookup table, such as the Z-axis position lookup table 1100 shown in FIG. 11. These values may be denoted such that $(B_{r1}, B_{z1})$ results in a $(r_1, z_1)$ pairing, $(B_{r1}, B_{z2})$ results in a $(r_2, z_2)$ pairing, $(B_{r2}, B_{z1})$ results in a $(r_3, z_3)$ pairing and $(B_{r2}, B_{z2})$ results in a $(r_4, z_4)$ pairing. In embodiments using other lookup table configurations, a set of closest reference values in the particular coordinate space used may similarly be generated.

Interpolated r and z values, which may be denoted as $\bar{r}$ and $\bar{z}$, may then be determined. For example, interpolated values may be found by solving the following to determine:

$$\bar{r} = \left(1 - \frac{B_r - B_{r1}}{B_{r2} - B_{r1}}\right)\left(1 - \frac{B_z - B_{z1}}{B_{z2} - B_{z1}}\right)r_1 + \left(1 - \frac{B_r - B_{r1}}{B_{r2} - B_{r1}}\right)\left(\frac{B_z - B_{z1}}{B_{z2} - B_{z1}}\right)r_2 +$$
$$\left(\frac{B_r - B_{r1}}{B_{r2} - B_{r1}}\right)\left(\frac{B_z - B_{z1}}{B_{z2} - B_{z1}}\right)r_3 + \left(\frac{B_r - B_{r1}}{B_{r2} - B_{r1}}\right)\left(1 - \frac{B_z - B_{z1}}{B_{z2} - B_{z1}}\right)r_4$$

and $$\bar{z} = \left(1 - \frac{B_r - B_{r1}}{B_{r2} - B_{r1}}\right)\left(1 - \frac{B_z - B_{z1}}{B_{z2} - B_{z1}}\right)z_1 + \left(1 - \frac{B_r - B_{r1}}{B_{r2} - B_{r1}}\right)\left(\frac{B_z - B_{z1}}{B_{z2} - B_{z1}}\right)z_2 +$$
$$\left(\frac{B_r - B_{r1}}{B_{r2} - B_{r1}}\right)\left(\frac{B_z - B_{z1}}{B_{z2} - B_{z1}}\right)z_3 + \left(\frac{B_r - B_{r1}}{B_{r2} - B_{r1}}\right)\left(1 - \frac{B_z - B_{z1}}{B_{z2} - B_{z1}}\right)z_4.$$

In embodiments using other lookup table configurations, interpolated values determined in the particular coordinate space may similarly be generated.

At stage 1450, x and y values describing the location of the magnet in relation to the corresponding magnetic sensor in a Cartesian coordinate system may be determined, such as described previously herein. In a typical application, the expression $B_x/B_y$ may be assumed to be proportionate to the expression $x/y$, and the values of x and y may be found by solving:

$$x = \frac{B_x}{|B_y|}y \text{ and } y = \frac{B_y}{|B_y|}\sqrt{\frac{r^2}{1+\left(\frac{B_x}{B_y}\right)^2}}.$$

In this way, positional information of each magnet in the form of x, y, and z coordinates is established with respect to its corresponding magnetic sensor. In other embodiments, alternate coordinate systems may be used for the output information if such a coordinate system would be advantageous in either processing sensor data or providing output data from the user interface device to an electronic computing device or system. For example, in some applications it may be desirable to provide output information in a non-Cartesian coordinate system, such as one using angle and magnitude information to represent a position in space, in which case the signals from the magnetic sensors may be processed directly in the non-Cartesian coordinate system and output in the non-Cartesian system. In some embodiments, it may be desirable to solve directly for position in a Cartesian system and then convert this information to a non-Cartesian coordinate system, or solve in one non-Cartesian coordinate system and output the positional information in a second, different non-Cartesian coordinate system.

In addition, in some embodiments, other processing stages and/or algorithms may be used in addition to, or in place of, the lookup tables to solve for position information of the magnets and/or actuator. For example, the magnetic field model may be a closed form solution model, such as may be generated analytically by, for example, solving magnetic field equations based on the particular magnet and sensor configuration, or by generating a mathematical model based on measured data for particular magnet and sensor configurations and fitting the measured data to a closed-form model.

Some user interface device embodiments may provide actuator tilting functionality. During tilting displacements of the actuator and corresponding magnets in these embodiments, a recalculation may be made whereby the calculated tilt of the actuator may be used determine the tilt of each individual magnet. The determined degree and direction of the tilt of each magnet may be then used to rotate the frame of reference for each corresponding magnetic sensor. Higher sensitivity for user interface devices may be achieved by using this processing approach to further refine positional information for each magnet during tilting displacements.

Figure 15:
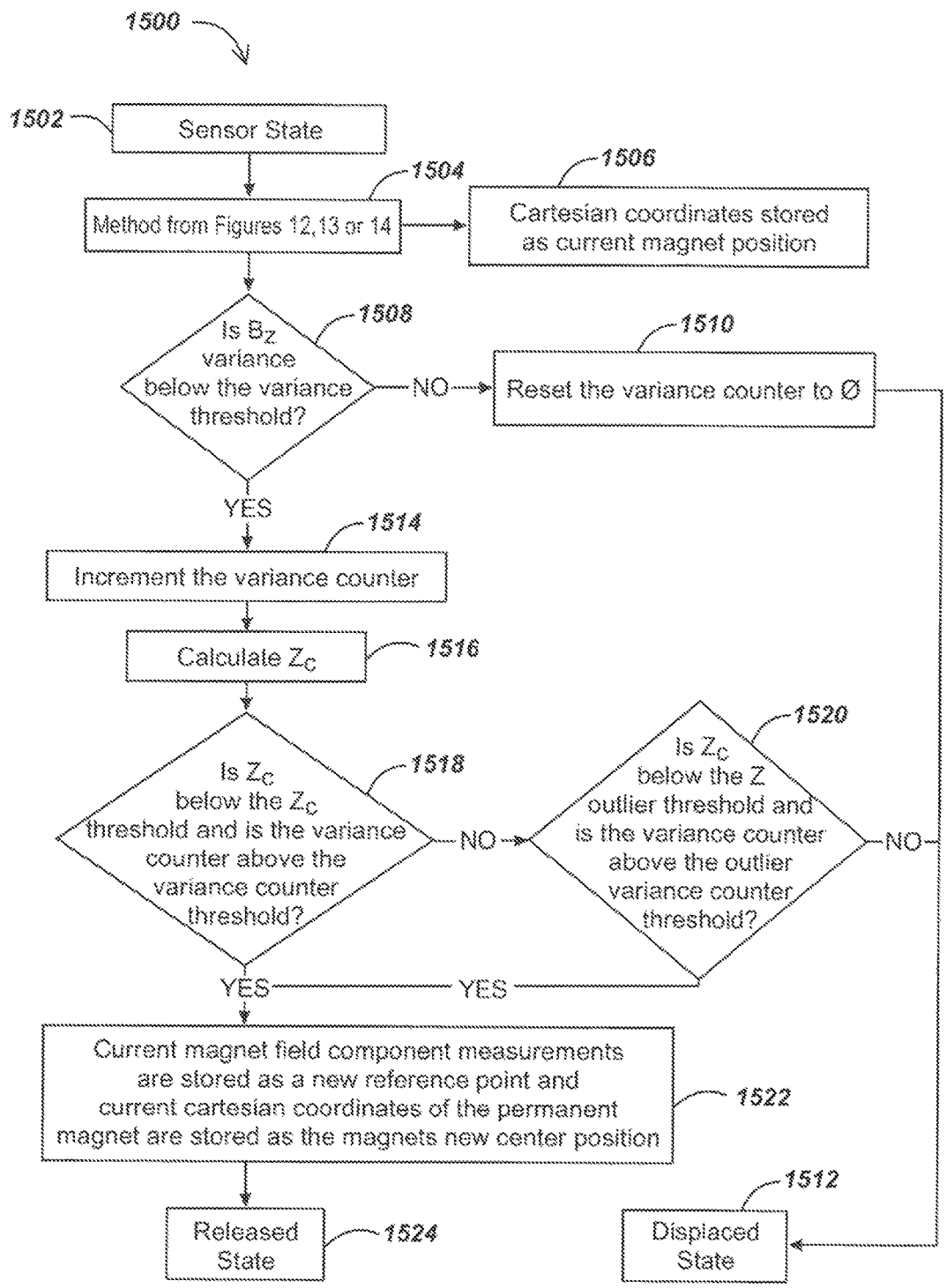
FIG. 15 illustrates details of an embodiment of a process for interpreting the state of displacements of magnets in a magnetic UID.

FIG. 15 illustrates details of an embodiment of a process 1500 that may be used for interpreting the state of displacements in a manual user interface device that employs magnetic sensors such as sensors 55. Process 1500 may be used in various embodiments to distinguish background or noise signals from signals caused by user interaction with the magnetic UID. The term "sensor state," when used herein in reference to a magnetic sensor, refers to state interpretations of the measured magnetic field components corresponding to user interaction with the magnetic UID. For example, in some implementations, sensor states may include a released state in which no operator-initiated forces are acting upon the manual actuator, and a displaced (or deformed) state in which operator-initiated forces are acting upon the manual actuator causing displacements or deformations of the manual actuator and magnets. In addition, in some implementations, reentry states may be defined wherein a reentry state defines a state where the manual user interface device is transitioning between a released state and displaced or deformed state or vice versa. In the embodiment of FIG. 15, only displaced and released states are processed, whereas in process embodiment 1600 of FIG. 16 (described subsequently herein), reentry states are further used.

Process 1500 may begin at stage 1502, where data associated with the sensor state may be accessed. Assuming no user interaction, the sensor state may be defined initially as being in a released state (e.g., prior to a first use of the magnetic UID). At stage 1504, an additional position determination process, such as the processes described with respect to FIGS. 12, 13 and/or 14, may be implemented to determine positions of magnets in relation to corresponding magnetic sensors. At stage 1506, Cartesian coordinates (or other position coordinates) defining the location of the magnet determined at stage 1504 may be stored as the current magnet position. At decision stage 1508, a decision may be made as to whether the calculated variance in the measurement of $B_z$ is below a predetermined variance threshold.

A predetermined variance threshold may be selected so as to be above the typical variance of small incidental changes in the measurement of $B_z$ due to variables such as noise or other variations inherent in the magnetic sensors, but below expected signals caused by user interactions with the magnetic UID. As these incidental changes tend to cause small variations in the magnetic field component measurements, any variation caused by even natural unintentional movements of a user's touch on the magnetic UID may result in a greater variation and may therefore be readily distinguishable from variations below the predetermined variance threshold. Testing of particular implementations of magnetic UIDs may be done to determine appropriate variance thresholds, which may then be stored in a memory for access by a processing element during process implementation.

If a variance in the measurement of $B_z$ is at or above the predetermined variance threshold, a variance counter may be reset at stage 1510, and the sensor state redefined as being in a displaced or deformed state at stage 1512. Alternately at decision stage 1508, if the variance in the measurement of $B_z$ is below the predetermined variance threshold, a stage 1514 may be performed in which the variance counter is incremented. At stage 1516, a calculation may be done to determine a value of $Z_c$, the average displacement along the Z axis from a rolling average of the most recent center Z axis coordinates. Once $Z_c$ has been calculated at stage 1516, a decision may be made at stage 1518 to determine if $Z_c$ is below a predefined $Z_c$ threshold and the variance counter above the variance counter threshold. If $Z_c$ is not below the $Z_c$ threshold or the variance counter is not above the variance counter threshold, a decision stage 1520 may be implemented to determine whether $Z_c$ is below a Z outlier threshold and the variance counter is above an outlier variance counter threshold.

The outlier thresholds may be defined as those magnetic field components that correspond to displacements of the magnet along their outermost possible positions from a released state. Outlier thresholds may be used to prevent a magnetic UID from determining a false released state when, for instance, a heavy object is placed on the actuator, causing it to be fully depressed but remain motionless in the fully depressed position. If decision stage 1520 results in a "NO" decision, the state may be redefined at stage 1512 to a displaced state. Alternately, if a "YES" decision results at stage 1520, indicating $Z_c$ is below the $Z_c$ threshold, then processing may proceed to stage 1522. Stage 1522 may also be executed if, in the stage 1518, $Z_c$ is below the $Z_c$ threshold and the variance counter is not below the variance counter threshold.

At stage 1522, the current magnetic field component measurements may be stored as a new released state reference point. The Cartesian coordinates (or other coordinate system position coordinates) of the magnets as stored at stage 1522 may also be defined as being the magnets' new center position. At stage 1524, the sensor state may be redefined as a released state. Once the sensor state has been redefined, the stages of process 1500 may be repeated with the reevaluated sensor state becoming the new sensor state of stage 1502. In some embodiments, similar or equivalent processes may be used to process signals in alternate coordinate systems, such as signals in x, y, z coordinates.

Figure 16A:
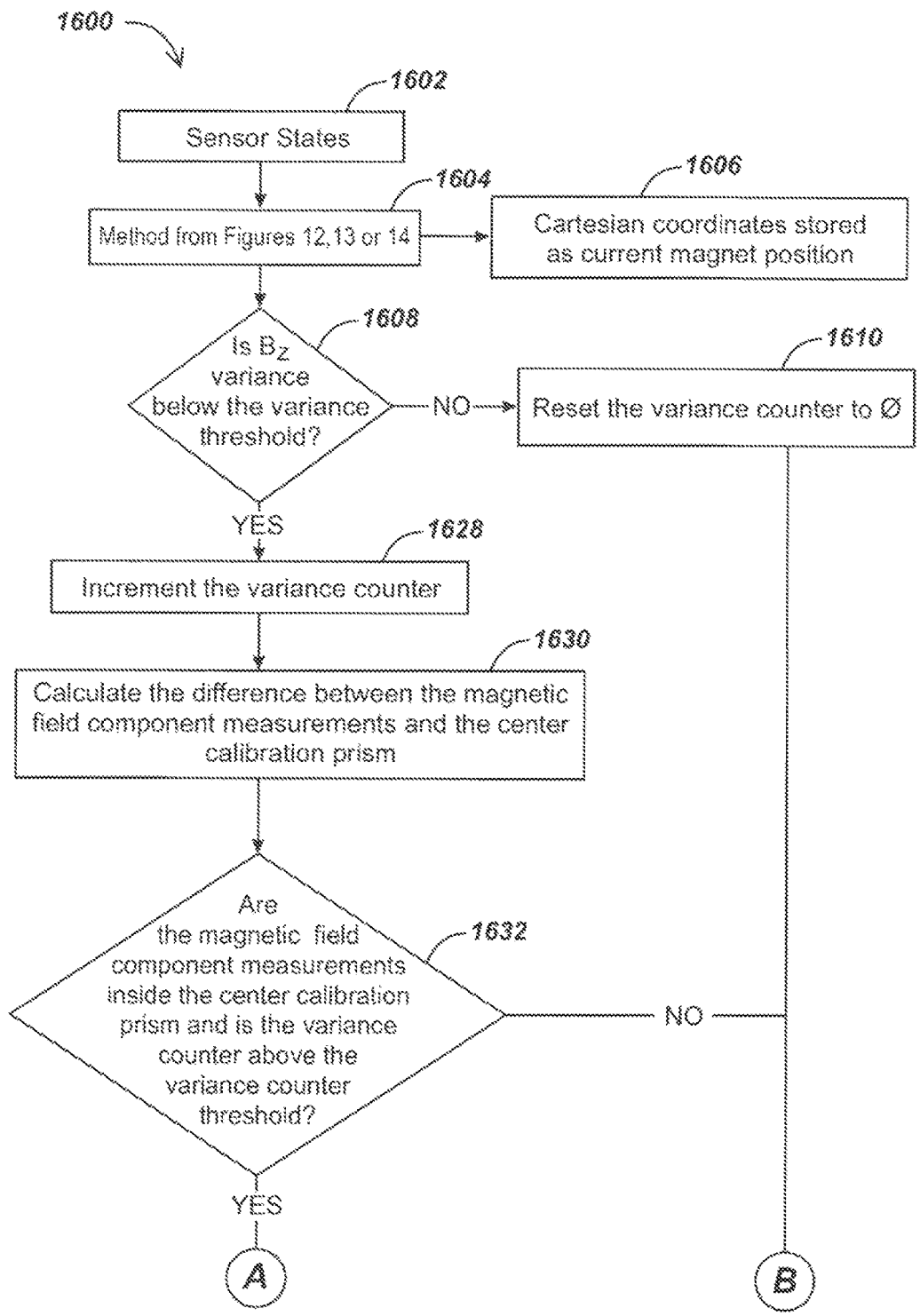
FIGS. 16A and 16B illustrate details of an embodiment of a process for interpreting the state of displacements of magnets in a magnetic UID.
Figure 16B:
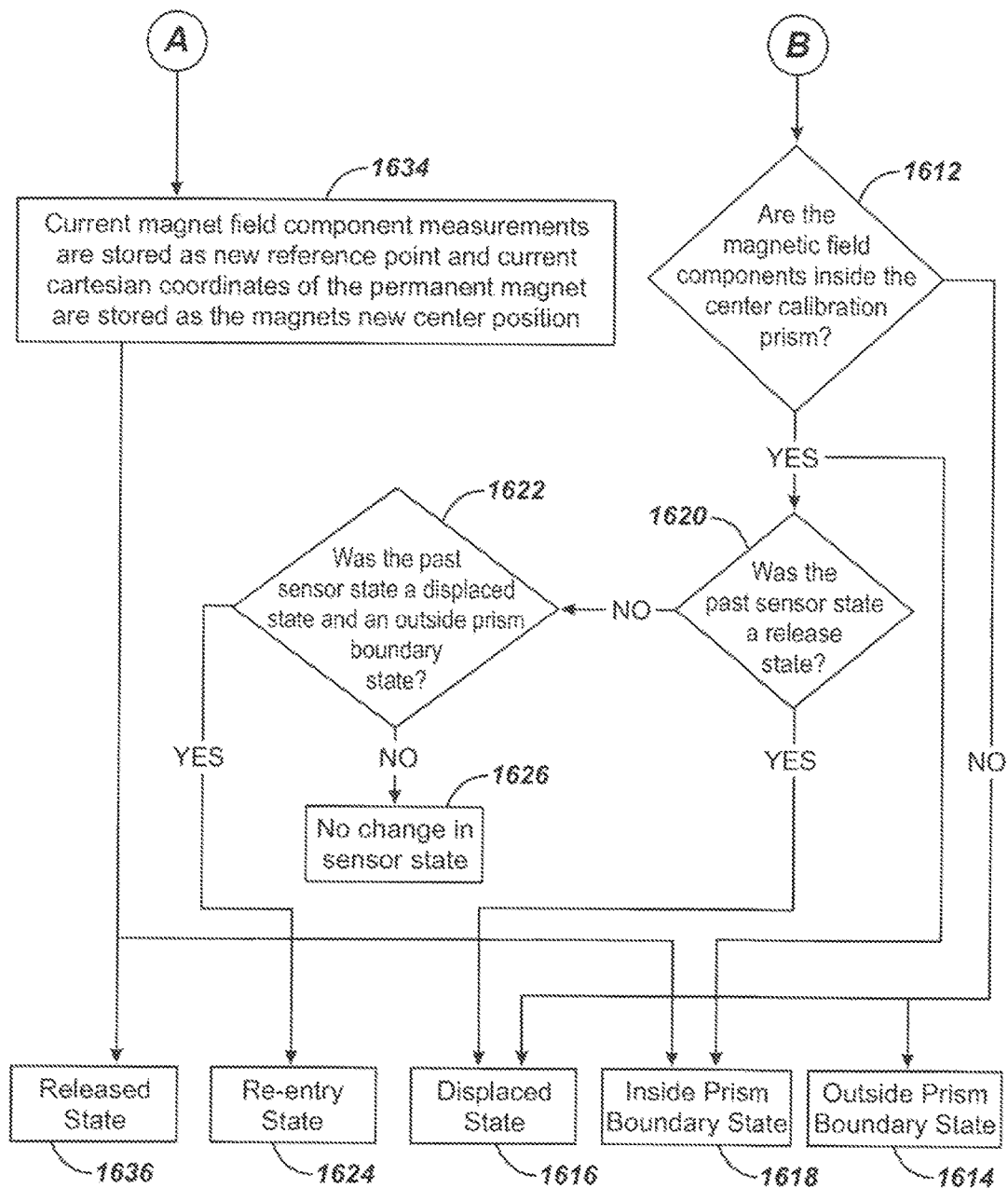

FIGS. 16A and 16B illustrate details of an embodiment of a process 1600 that uses a center calibration prism to aid in interpreting the state of displacements in a magnet UID. Process 1600 may be used in place of, or in addition to, process 1500 as described previously with respect to FIG. 15. The term "center calibration prism" as used herein refers to a set of boundaries in magnetic field measurements of the magnetic UID that may be predetermined, such as by a designed or device programmer. Generally, the center calibration prism process is designed to allow a certain degree of noise inherent in the system.

Process embodiment 1600 utilizes two possible states of the magnetic field measurements with respect to the center calibration prism—an inside prism boundary state and an outside prism boundary state. An inside prism boundary state may be defined by a magnetic sensor's measured magnetic field components being within center calibration prisms boundaries, and an outside prism boundary state may conversely be defined by any of a magnetic sensor's measured magnetic field components being outside the boundaries of the center calibration prism. Particular prism boundary states may be stored and redefined periodically, such as at each cycle of process 1600. By appropriately redefining the prism boundary state of process 1600, the manual user interface device may more accurately interpret the difference between user displacements and false displacements based on measurements in the magnetic field components and/or may be dynamically readjusted to changing operator or environmental conditions. This, in turn, may be used to implement an auto-zeroing or redefining of the released state position of each magnet.

Process 1600 may begin at stage 1602, as data associated with the sensor state is accessed. Initially, the sensor state may be determined as being in a released state prior to first use of the manual user interface device, such as previously described with respect to process 1500. Unlike process 1500 of FIG. 15, three sensor states may be used in process 1600; a released state, a displaced state, and a reentry state. The definitions of "released state" and "displaced state" are the same as defined in conjunction with FIG. 15. The term "reentry state" as used herein refers to a state in which the manual user interface device is transitioning from one sensor state to the other (such as from the released state to displaced state or vice-versa).

Generally, the reentry state occurs when the actuator has been released from a displaced state or moved from a released state and the processing unit has identified a change in the magnetic field component measurements but has yet to determine that the magnetic UID is in a displaced state or released state. At stage 1604, positional information may be determined, such as by the processes described in FIG. 12, 13, or 14, where magnetic field components are measured and interpreted as the position of the magnet in relation to its corresponding magnetic sensor. At stage 1606, the Cartesian coordinates (or other coordinate positions) describing the location of the magnet determined at stage 1604 may be stored as the current magnet position.

At decision stage 1608, a determination may be made as to whether there is a variance in the measurements of $B_x$, $B_y$, or $B_z$ that is below a variance threshold. If the variance in the measurement of $B_x$, $B_y$, or $B_z$ is above or at the variance threshold, a stage 1610 may be executed where a variance counter is reset to zero. Following stage 1610, a decision may be made at stage 1612 as to whether the magnetic field component measurements from stage 1604 are inside a center calibration prism.

If the magnetic field component measurements are not within the center calibration prism, the prism boundary state may be redefined as an outside prism boundary state and stored accordingly at stage 1614 (shown in FIG. 16B), and the sensor state may be determined to be a displaced state at stage 1616. Conversely, if the magnetic field component measurements are within the center calibration prism, a stage 1618 may be implemented in which the prism boundary state is redefined as an inside prism boundary state and stored accordingly.

A decision stage 1620 may also be implemented if the magnetic field component measurements are within the center calibration prism (as determined at stage 1612). At decision stage 1620, a decision may be made as to whether the prior sensor state was a released state. If the prior sensor state was a released state, a stage 1616 may be implemented in which the sensor state is redefined as a displaced state. Conversely, if the prior sensor state was not a released state, a decision may be made at decision stage 1622 as to whether the prior sensor state was in a displaced state and the prior prism boundary state is an outside prism boundary state. If the prior sensor state was a displaced state and the prior prism boundary state is an outside prism boundary state, the sensor stage may be redefined as a reentry state at stage 1624. If the past sensor state was not a displaced state or the past prism boundary state was not an outside prism boundary state then, at stage 1626, no change from the prior sensor state to the reevaluated sensor state need be made.

Referring back to decision stage 1608 of FIG. 16A, if the variance in the measurement of $B_x$, $B_y$, and $B_z$ is below the variance threshold (at stage 1608), a stage 1628 may be implemented, incrementing the variance counter. At stage 1630, a calculation may be made to determine the difference between the sensor component measurements of stage 1604 and the center calibration prism, and at decision stage 1632, a determination may be made as to whether the current magnetic component measurements are inside the center calibration prism and if the variance counter is above the variance counter threshold. If stage 1632 results in a "YES" decision, a stage 1634 (as shown in FIG. 16B) may be implemented. At stage 1634, the measured magnetic field components from stage 1604 may be defined as the new reference point. The Cartesian coordinates of the magnet from stage 1604 may also be defined as a new magnet center position. Following stage 1634, the sensor state may be redefined as a released state at stage 1636 and the prism boundary state may be redefined as an inside prism boundary state at stage 1618.

If stage 1632 results in a "NO" decision, processing may proceed to decision stage 1612 (as shown in FIG. 16B), where a decision may be made as to whether the magnetic field component measurements from stage 1604 are inside a center calibration prism. If the magnetic field component measurements are not within the center calibration prism, stage 1614 may be implemented, where the prism boundary state may be redefined as an outside prism boundary state and stored accordingly. If the magnetic field component measurements are within the center calibration prism, stage 1618 may be implemented with the prism boundary state redefined as an inside prism boundary state and stored accordingly.

Decision stage 1620 may also be implemented if the magnetic field component measurements are within the center calibration prism. At decision stage 1620, a decision may be made as to whether the prior or past sensor state was a released state. If the prior sensor state was a released state, stage 1616 may be implemented, with the sensor state redefined as a displaced state.

If the prior sensor state was not a released state, a decision may be made at stage 1622 as to whether the prior sensor state was a displaced state and the prior prism boundary state is an outside prism boundary state. If the prior sensor state was a displaced state and the prior prism boundary state is an outside prism boundary state, the sensor state may be redefined as a reentry state at stage 1624. If the past sensor state was not a displaced state and the past prism boundary state was not an outside prism boundary state then, at stage 1626, no change from the prior sensor state to the reevaluated sensor state need be made. Once the sensor and prism boundary states have been redefined and stored accordingly, the stages of the process 1600 may be repeated, with the redefined sensor and prism boundary states carried back through to stage 1602 for subsequent process execution.

Figure 17A:
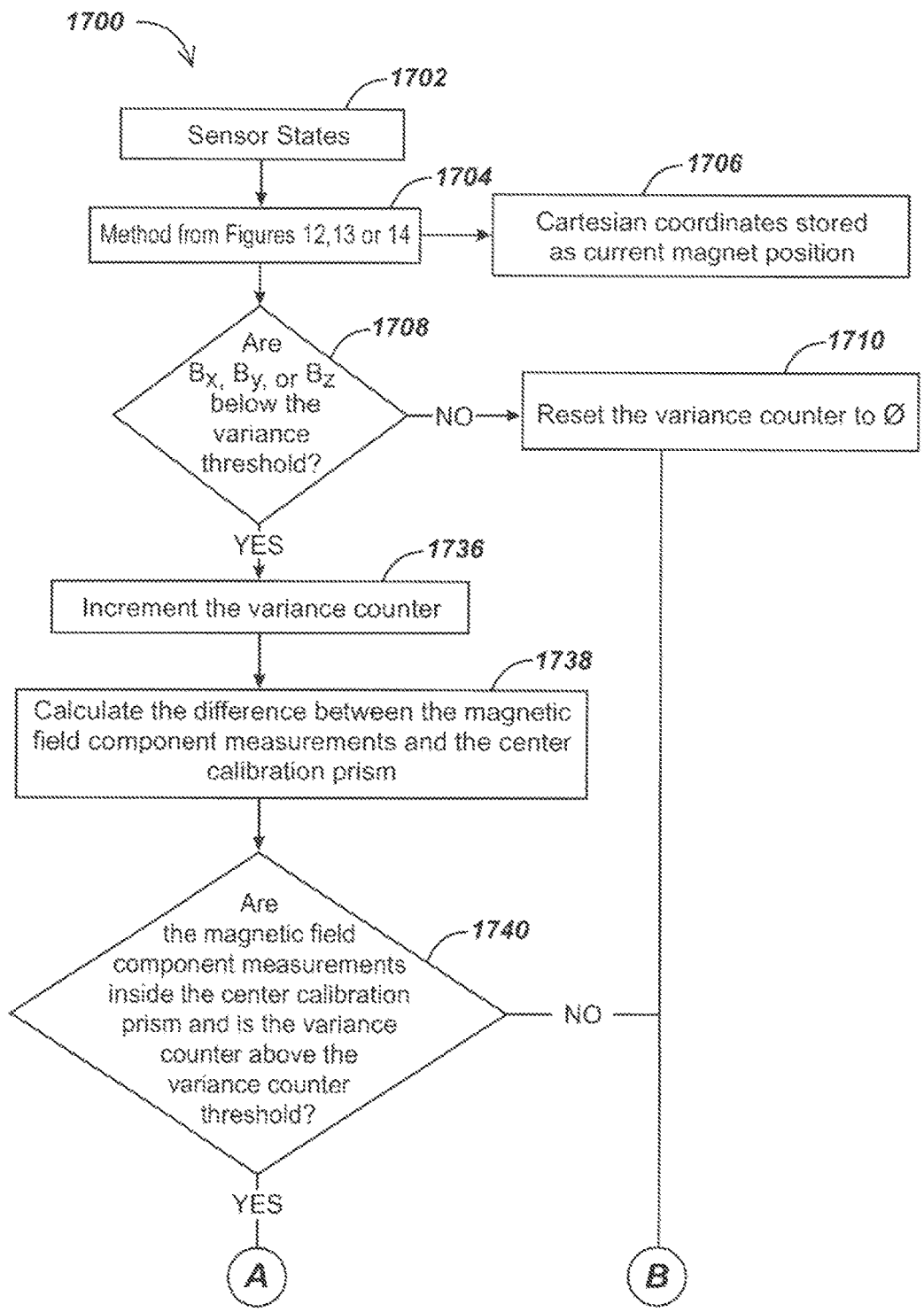
FIGS. 17A and 17B illustrate details of an embodiment of a process for interpreting the state of displacements of magnets in a magnetic UID.
Figure 17B:
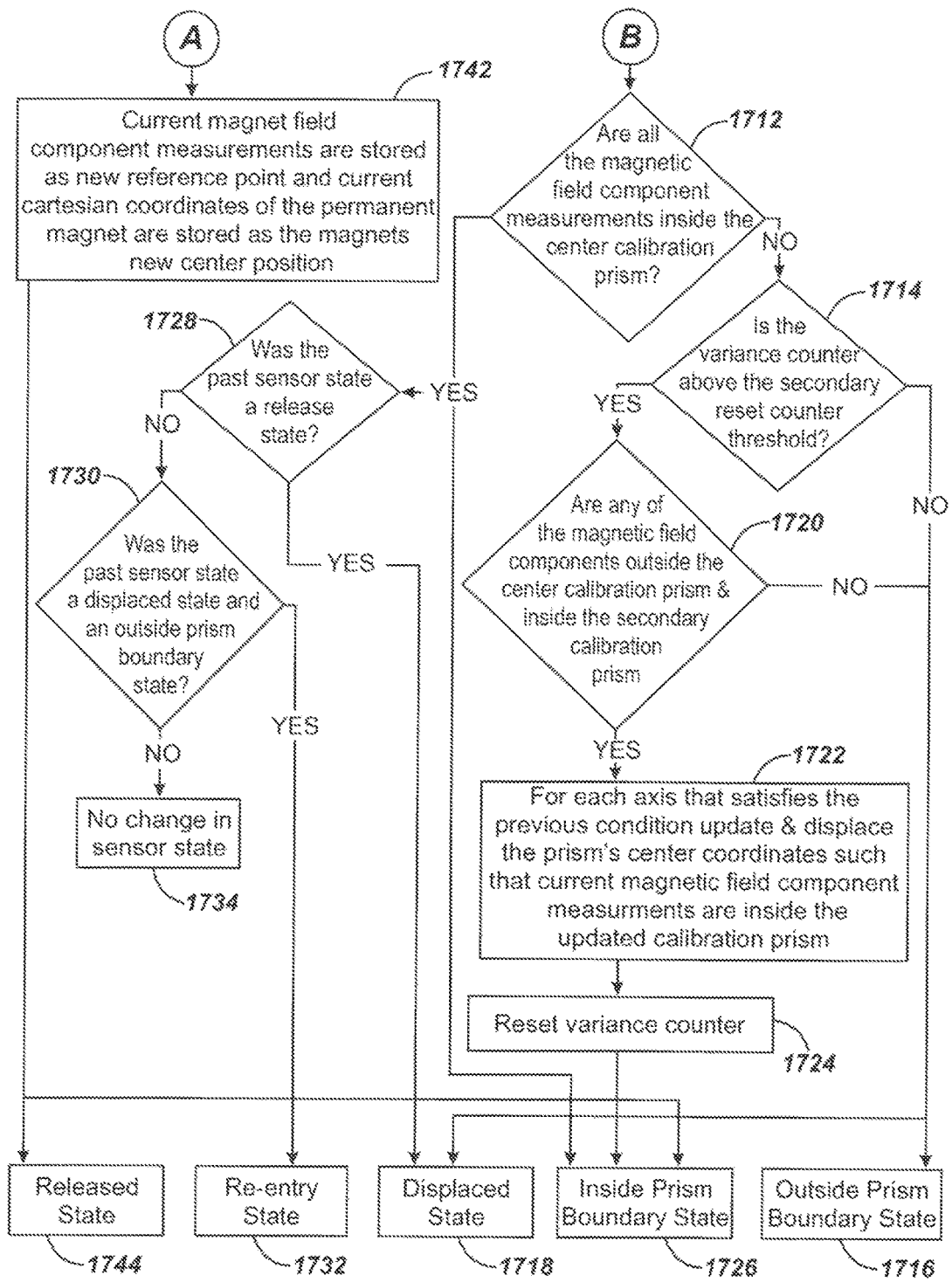

FIGS. 17A and 17B illustrate details of a process embodiment 1700 that uses a secondary calibration prism as well as a center calibration prism to aid in interpreting the state of displacements in a magnetic UID. The term "center calibration prism" as used herein refers to a set of boundaries in magnetic field measurements of the magnetic UID that may be predetermined, such as by a designed or device programmer. The term "secondary calibration prism" as used herein refers to a second predetermined set of boundaries in magnetic field measurements that may be similarly determined and predefined. The boundaries of the center calibration prism may be selected such that they lie within the boundaries of the secondary calibration prism. Generally, the center calibration prism and the secondary calibration prism are designed to allow a certain degree of noise inherent in the system.

The secondary calibration prism may allow for the center calibration prism to be redefined due to small variances in particular, redefining the center calibration prism's centroid or location. Process 1700 may utilize two possible states of the magnetic field measurements with respect to the center calibration prism; an inside prism boundary state and an outside prism boundary state. Both the inside prism state and the outside prism state may be defined with respect to the center calibration prism.

Process 1700 may begin at stage 1702, as data regarding the sensor state is accessed, such as described previously with respect to processes 1500 and 1600. Initially, the sensor state may be determined as being in a released state prior to first use of the manual user interface device, as in processes 1500 and 1600. Three sensor states may be used in process 1700; a released state, a displaced state, and a reentry state. The definitions of "released state" and "displaced state" are the same as defined with respect to FIG. 15.

At stage 1704, a positional determination may be made, such as described with respect to the processes of FIG. 12, 13, or 14 by which magnetic field components are measured and interpreted as the position of the magnet in relation to its corresponding magnetic sensor. At stage 1706, the Cartesian coordinates (or other coordinate system positions) describing the location of the magnet determined at stage 1704 may be stored as the current magnet position. At decision stage 1708, a determination may be made as to whether the variance of the measurement of $B_x$, $B_y$, or $B_z$ is below a variance threshold. If the variance in the measurement of $B_x$, $B_y$, or $B_z$ is at or above the variance threshold, a stage 1710 may be implemented and a variance counter reset to zero.

Subsequent to stage 1710, a decision may be made at stage 1712 as to whether all the magnetic field component measurements from stage 1704 are inside a center calibration prism. If any magnetic field component measurements are not within the center calibration prism, a decision may be made at stage 1714 as to whether the variance counter is above the secondary reset counter threshold. If the variance counter is not above the secondary reset counter threshold, the prism boundary state may be redefined as an outside prism boundary state and stored accordingly at stage 1716 and the sensor state may be determined to be a displaced state at stage 1718.

If the variance counter is above the secondary reset counter threshold, a decision may be made at stage 1720 if there are any of the magnetic field component measurements outside the center calibration prism and inside the secondary calibration prism. If there are not any of the magnetic field component measurements outside the center calibration prism and inside the secondary calibration prism, the prism boundary state may be redefined as an outside prism boundary state and stored accordingly at stage 1716, and the sensor state may be determined to be a displaced state at stage 1718.

If there are any of the magnetic field component measurements outside the center calibration prism or inside the secondary calibration prism, for each axis that satisfies the previous condition, the prism's center coordinates may be updated and displaced at stage 1722 such that the current magnetic field component measurements are inside the updated center calibration prism. At stage 1724, the variance counter may be reset, and at stage 1726, the prism boundary state may be redefined as an inside prism boundary state and stored accordingly.

If all the magnetic field component measurements are inside the center calibration prism at decision stage 1712, the prism boundary state may be redefined as an inside prism boundary state and stored accordingly at stage 1726, and a decision may be made at decision stage 1728 as to whether the past or previous state was a released state. If the past sensor state was a released state, stage 1718 may be implemented to redefine the sensor state as a displaced state. Conversely, if the past sensor state was not a released state, a decision may be made at decision stage 1730 as to whether the past sensor state was a displaced state and the prism boundary state an outside prism state. If the past sensor state was a displaced state and the prism boundary state was an outside prism state, the sensor state may be redefined as a re-entry state at stage 1732. If the past sensor state was not a displaced state and/or the prism boundary state was not an outside prism state, at stage 1734 no change in sensor state need be made.

Referring back to stage 1708 as shown in FIG. 17A, if the variance in the measurement of $B_x$, $B_y$, and $B_z$ is below the variance threshold, a stage 1736 may be implemented, incrementing the variance counter. At stage 1738, a calculation may be made to determine the difference between the sensor component measurements of stage 1704 and the center calibration prism. A decision may be made at stage 1740 as to whether the current magnetic component measurements are inside the center calibration prism and if the variance counter is above the variance counter threshold. If stage 1740 results in a "YES" decision, a stage 1742 may be reached.

At stage 1742, the measured magnetic field components from stage 1704 may be defined as the new reference point, and the Cartesian coordinates (or other coordinates system positions) of the magnets from stage 1704 may also be defined as a new magnet center position. The sensor state may be redefined as a released state in a step 1744, and the prism boundary state may be redefined as an inside prism boundary state at stage 1726.

If a "NO" decision is determined at stage 1740, processing may continue to decision stage 1712, where a determination as to whether the magnetic field component measurements from stage 1704 are inside a center calibration prism and successive stages following stage 1712, as described previously, may be implemented. Once the sensor and prism boundary states have been redefined and stored accordingly, processing may be repeated, with the redefined sensor and prism boundary states carried back through to stage 1702, where process 1700 may be repeated.

Figure 18:
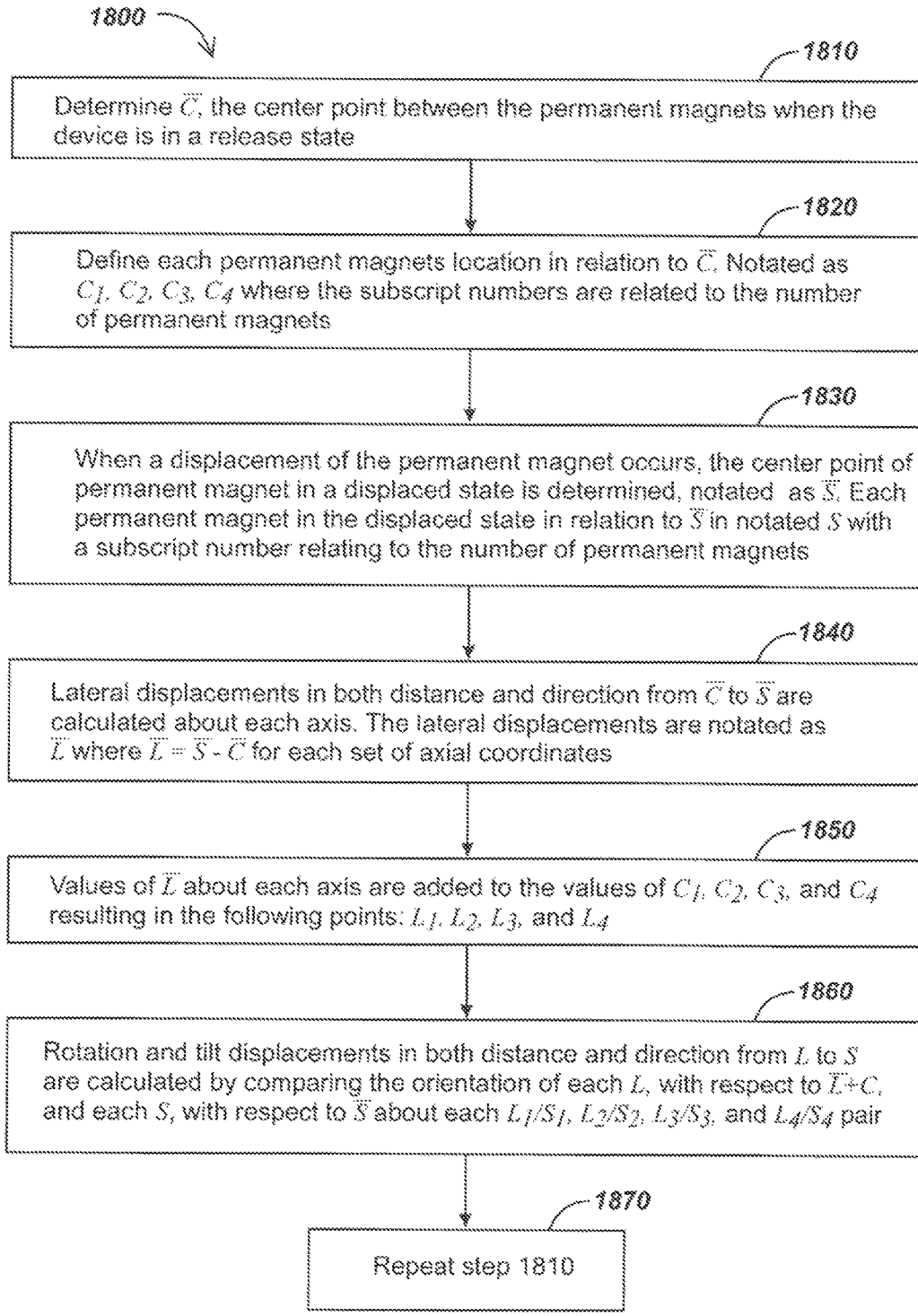
FIG. 18 illustrates details of an embodiment of a process interpreting displacements of an actuator using combined displacements of magnets in a magnetic UID.

FIG. 18 illustrates details of an embodiment of a process 1800 for determining displacement of a manual actuator by sensing displacement of magnets, such as cylindrical magnets 54 of FIG. 8. In an exemplary embodiment, the position of each magnet relative to the other magnets is known, such as by design or measurement, testing. Assuming the placement is known, a center point of the magnets may be defined or determined when the manual user interface device is in a released state at stage 1810. For example, the center point of each of the magnets, while the manual user interface device 50 is in the released state, may be denoted as $\overline{C}$, and may be defined as the closest point equidistant to the position of each of the magnets.

The position of each of the magnets in relation to $\overline{C}$, while the manual user interface device is in the same released state, is denoted herein with the letter C and a sequential subscript number starting at $C_1$. For example, if a particular embodiment has four magnets, the positions of magnets 1 through 4 would be denoted as $C_1$, $C_2$, $C_3$, and $C_4$, respectively.

As different embodiments may contain different numbers of the magnets, different embodiment may have a different total number of sequential subscript numbers preceded by a C. For example, given a manual user interface device with four magnets, with $\overline{C}$ as the center point of the four magnets at coordinates (or position) $(x_0, y_0, z_0)$, $C_1$ would be at coordinates $(x_0+n, y_0, z_0)$, $C_2$ would be at coordinates $(x_0, y_0+n, z_0)$, $C_3$ would be at coordinates $(x_0-n, y_0, z_0)$, and $C_4$ would be at coordinates $(x_0, y_0-n, z_0)$, in relation to position $\overline{C}$, where n is the distance between C and any of the magnets. These locations may be defined at stage 1820.

When a displacement of the magnets has occurred, such as by user movement (e.g., rotation and/or translation) and/or deformation (e.g., squeeze) of the actuator, each displaced position of the magnets may be denoted with the letter S and a sequential subscript number beginning at $S_1$. At stage 1830, the center point of the new actuator configuration resulting from the movement and/or deformation, $\overline{S}$, may be determined. For example, by averaging along each axis of the displaced magnets coordinates, a displaced center, $\overline{S}$, may be determined.

At stage 1840, initial lateral displacements of the magnets, denoted as $\overline{L}$, may then be calculated by subtracting the coordinates defined by $\overline{C}$ from those of $\overline{S}$ so that $(\overline{S}(x)-\overline{C}(x), \overline{S}(y)-\overline{C}(y), \overline{S}(z)-\overline{C}(z))$ or $\overline{L}=\overline{S}-\overline{C}$ along each axis.

At stage 1850, the sums of L and each of the $C_1$, $C_2$, $C_3$, and $C_4$ may be calculated to determine a series of new positions denoted as $L_1$, $L_2$, $L_3$, and $L_4$.

At stage 1860, rotation and/or tilt displacements in both distance and direction from L to S may be calculated by comparing the orientation of each L, with respect to $\overline{L}+\overline{C}$, and each S, with respect to $\overline{S}$, about each (L, S) pair. By determining the degree and direction of the individual displacements about each of the magnets, the direction and degree of rotation and/or tilt of the actuator may be determined.

Commands that correspond to movements of a cursor, pointer, or other two or three dimensional object within an electronic computing device may then be generated based on the determined position changes. For example, commands corresponding to and approximating analogous movement of the actuator may be generated and provided in an output signal.

At stage 1870, the process 1800 may be repeated, such as by returning to stage 1810 or stage 1830 and repeating the process. The process may be repeated periodically, such as at a predetermined or adjustable period, and/or may be asynchronous, such as based on an estimated speed of motion of the actuator or other element of the user interface device, based on an interrupt, or based on another action or circuit function.

In embodiments utilizing a magnetically sensed squeezable mechanism, such as described in U.S. patent application Ser. No. 13/110,910, filed on May 18, 2011, entitled USER INTERFACE DEVICES, APPARATUS, AND METHODS, processing may be done in a processing element, such as described previously with respect to FIG. 18, to determine a degree and/or direction of the squeeze, as well as other information related to the deformation, such as changes in position between magnets. This deformation information may then be provided as data in an output signal to a personal computer or other electronic computing system.

Figure 19:
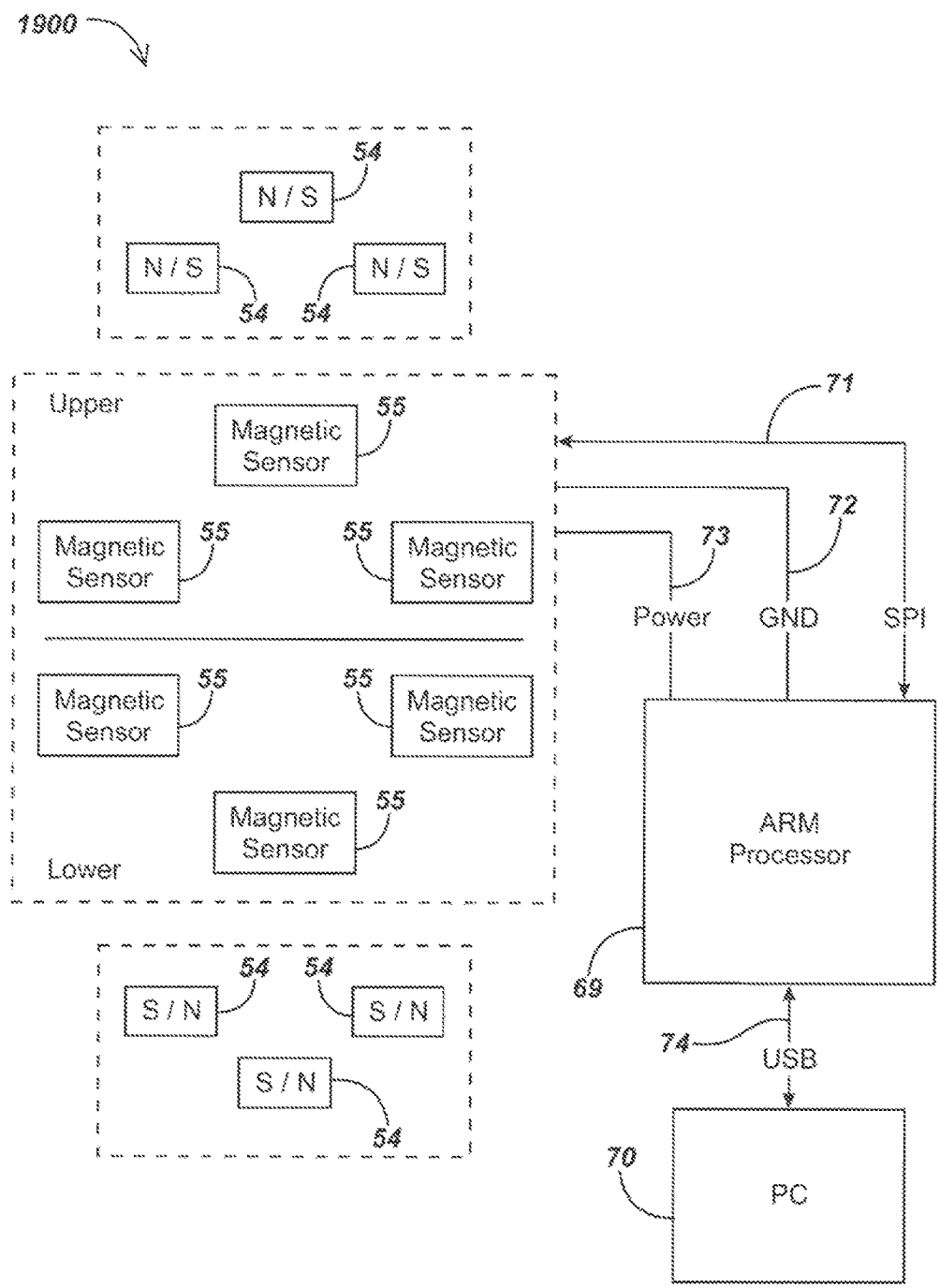
FIG. 19 illustrates details of an embodiment of circuitry for coupling a magnetic UID to an electronic computing system.

FIG. 19 illustrates simplified details of an embodiment of a magnetic user interface device having a magnetically sensed squeeze mechanism with magnets 54 and magnetic sensors 55, along with an embodiment of circuitry 1900 for coupling the user interface device to an electronic computing system, such as PC 70.

In circuitry embodiment 1900, there are two sets of three of the sensors 55 positioned such that three sensors are on the top side of a PCB and three are located on the underside. Six cylindrical magnets 54 are used in this embodiment, with three cylindrical magnets 54 located above and corresponding to the sensors 55 on the top of the PCB and three cylindrical magnets 54 located beneath and corresponding to the sensors 55 on the underside.

The sensors 55 generate sensor output signals due to measured displacements, which may include squeeze type displacements, of the cylindrical magnets 54, and transmit these signals to a processing element, such as ARM processor 69 and/or other processing elements. The processing element may implement one or more of the processing methods hereafter described on the sensor signals provided from the sensors 55, and may then send output data, in a compatible format, to PC 70 or to other electronic computing systems.

As shown in FIG. 19, a serial peripheral interface (SPI) (or other interface configuration) connection 71 sends the output signals from the sensors 55 to the processor 69. A ground (GND) connection 72 and a power connection 73 may also be used to connect the sensors 55 to the processor 69. The PC 70 may be connected to the processor 69 by a USB connection 74 (or other interface configuration for coupling a user interface device to an electronic computing system), and the connection may provide data transmission, power, or both to the processor 69. Variations of the circuitry embodiment 1900 as illustrated in FIG. 19 will be apparent to those skilled in the art. For example, different embodiments may have a different quantity of sensors and/or magnets. Furthermore, different processing elements, such as different microcontrollers or other programmable devices, as well as different circuit configurations for sending data and/or power to the user interface device may be used in various embodiments.

Processing of squeeze-type displacements, which may result in deformation of an element of the user interface device, such as the actuator or a separate squeezable element, may be implemented similar to the other motion and position sensing described previously herein. For example, lookup tables and/or closed form magnetic field models may be used. Similar to the radial displacement lookup table 1000 of FIG. 10 and the Z-axis displacement lookup table 1100 of FIG. 11, lookup tables for embodiments using magnetically sensed squeeze mechanisms may be generated for squeeze sensing of the magnetic sensors. FIGS. 20 and 21 illustrate details of portions of example lookup tables 2000 and 2100 that may be used for such processing. In order to interpret magnetic field components as indicative of the position of a magnet, such as each of the cylindrical magnets 54, a processing element, such as processor 69, can use the magnetic field component measurements to access a radial displacement lookup table 2000 and a Z-axis displacement lookup table 2100.

The data values of the magnetic field model represented in the lookup tables may be calculated using commercially available physical modeling software, such as COMSOL or other modeling tools. In the example LUT embodiments of FIG. 21 and FIG. 22, both radial displacement lookup table 2000 and Z-axis displacement lookup table 2100 are composed of three columns. The first column is composed of a range of the measured values that describes a radius in magnetic field component measurements between the magnets and the Z-axis of its corresponding magnetic sensor in milliteslas (mT). As described previously herein, it is also possible to use measurements in magnetic field components about x and y in place of the radial measurement. Utilizing a radial measurement of the magnetic field components requires some additional calculations but may advantageously require less storage space for the processing element.

The second column is composed of a range of measured values along the Z-axis in magnetic field component measurements between the magnets and corresponding magnetic sensors in milliteslas (mT). Pairing of the values from the first column to that of the second column will correspond to actual positional information between the magnet and corresponding magnetic sensor.

In the radial displacement lookup table 2000, partially illustrated in FIG. 20, the third column corresponds to a radial distance from the Z-axis between each of the magnets and corresponding magnetic sensor, measured in millimeters. It is noted that radial displacement lookup table 2000 as illustrated in FIG. 20 (as well as other lookup tables described herein) is a partial illustration as a larger range of values is generally used in LUTs in practice. In the Z-axis displacement lookup table 2100, partially illustrated in FIG.

21, the third column corresponds to a Z-axis distance between the magnets and corresponding sensor. Again, the Z-axis displacement lookup table 2100 illustrated in FIG. 21 is a partial illustration as a larger range of values is generally used in practice.

Figure 22:
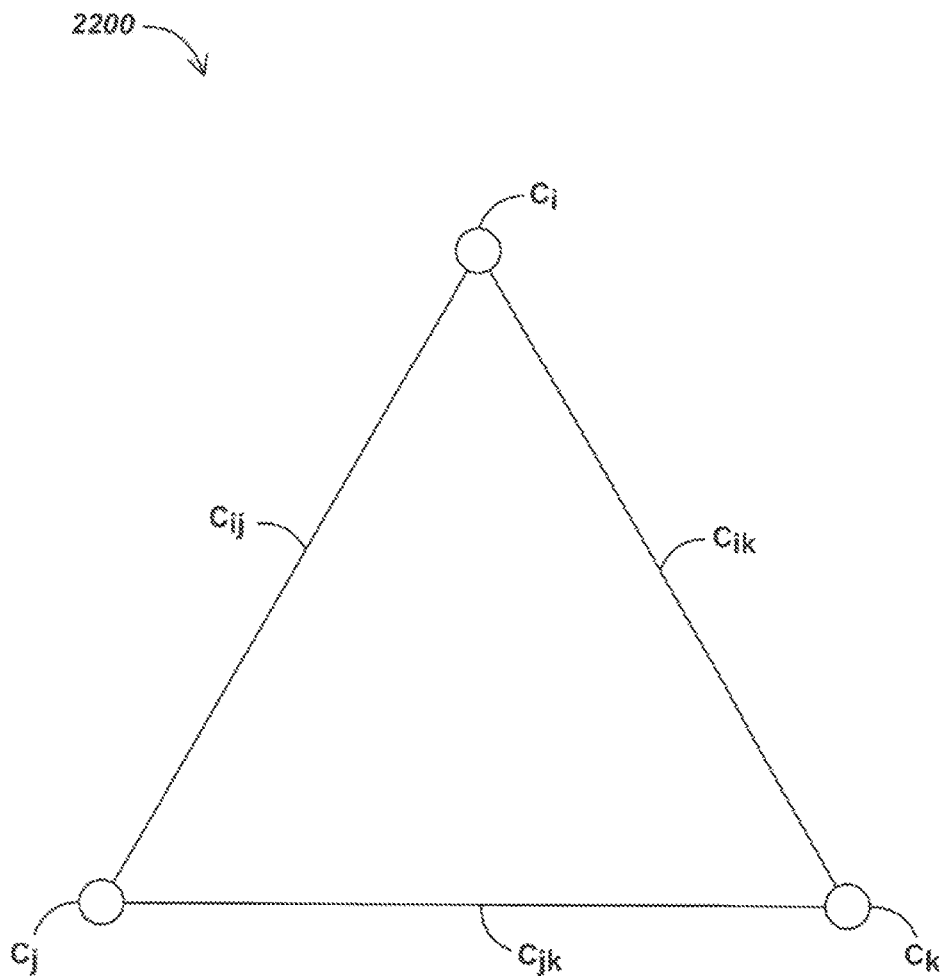
FIG. 22 is a diagram illustrating one possible magnet position, in a released state, of an embodiment of a magnetic UID that utilizes a magnetically sensed squeeze mechanism.

FIG. 22 shows a diagram 2200 illustrating possible positioning of magnets within an embodiment of a user interface squeeze mechanism in a released state. The magnet positions of the three magnets are denoted as $C_i$, $C_j$, and $C_k$ while in a released state and may be calculated using methods such as those described with respect to FIGS. 12, 13, and/or 14. Each of these positions may have x, y, and z coordinates such that they may be expressed as a point in space, for example, ($C_{ix}$, $C_{iy}$, $C_{iz}$). The distance between each calculated magnet position may be denoted as $C_{ij}$ between $C_i$ and $C_j$, $C_{ik}$ between $C_i$ and $C_k$, and $C_{jk}$ between $C_j$ and $C_k$.

Figure 23:
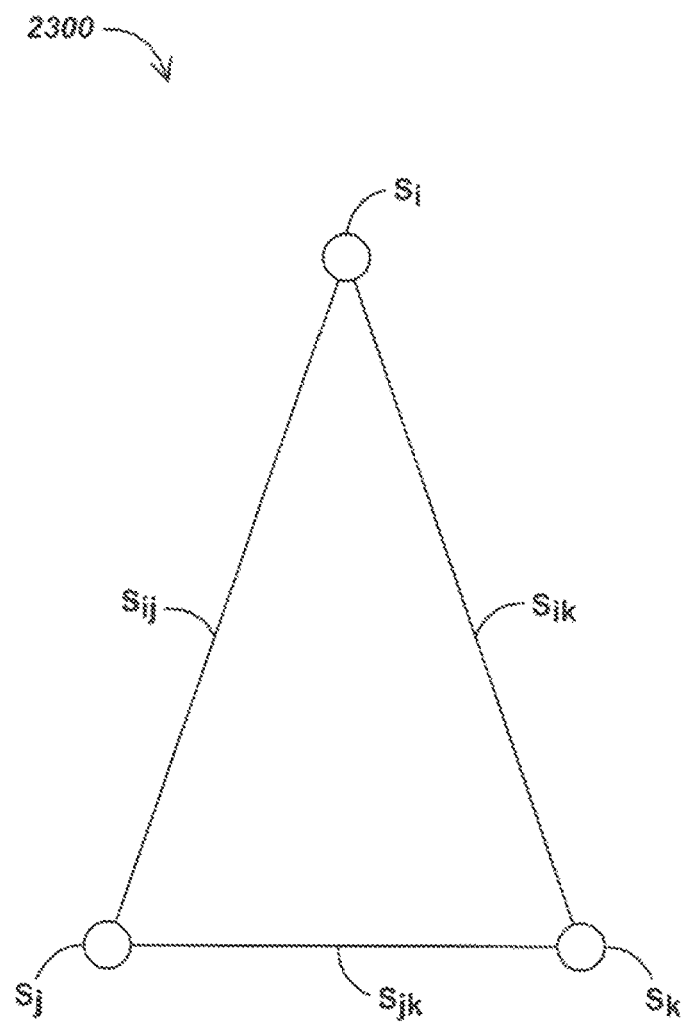
FIG. 23 is a diagram illustrating one possible magnet position, in a displaced state due to a squeeze-type deformation, of an embodiment of a magnetic UID manual user interface device that utilizes a magnetically sensed squeeze mechanism.

FIG. 23 shows a diagram illustrating possible positioning of magnets within an embodiment of a user interface squeeze mechanism in a displaced state due to a squeeze-type deformation. The magnet positions of the three magnets are denoted as $S_i$, $S_j$, and $S_k$ while in a displaced state and may be calculated using methods such as those described with respect to FIGS. 12, 13, and/or 14. Each of these positions may have x, y, and z coordinates such that they may be expressed as a point in space, for example, ($S_{ix}$, $S_{iy}$, and $S_{iz}$). The distance between each calculated magnet position may be denoted as $S_{ij}$ between $S_i$ and $S_j$, $S_{ik}$ between $S_i$ and $S_k$, and $S_{jk}$ between $S_j$ and $S_k$.

The distance between each calculated magnet position, regardless if displaced by a squeeze type displacement or in a released state, may be calculated by taking the magnitude of the vector difference between any two calculated magnet positions. For example, $C_{ij}=|C_i-C_j|$ or $C_{ij}=|\sqrt{(C_{ix}-C_{jx})^2+(C_{iy}-C_{jy})^2+(C_{iz}-C_{jz})^2}|$ may be used to calculate the distance between $C_i$ and $C_j$. By performing multiple calculations, such as by continually comparing these calculated lengths over a period of time, a squeeze type action may be detected.

A ratio, denoted as R, may be used to determine if the length of a side of a triangle formed by the three calculated magnet positions increased or decreased during a time period. For example, a scenario where the calculated magnet positions move from a released state to a displaced state may be expressed as $R_{ij}=S_{ij}/C_{ij}$. In this scenario, if $R_{ij}$ is greater than one, the determined length along that side will have increased. Where R is greater than one, the squeeze displacement may be interpreted as originating from a direction ninety degrees relative to the triangle side length orientation. Similarly, if $R_{ij}$ is less than one, the determined length along that side will have decreased. When no change in length has occurred, R will equal one. In other magnet configurations, similar processing may be done to determine changes in shape or patterns between the magnets.

Figure 24:
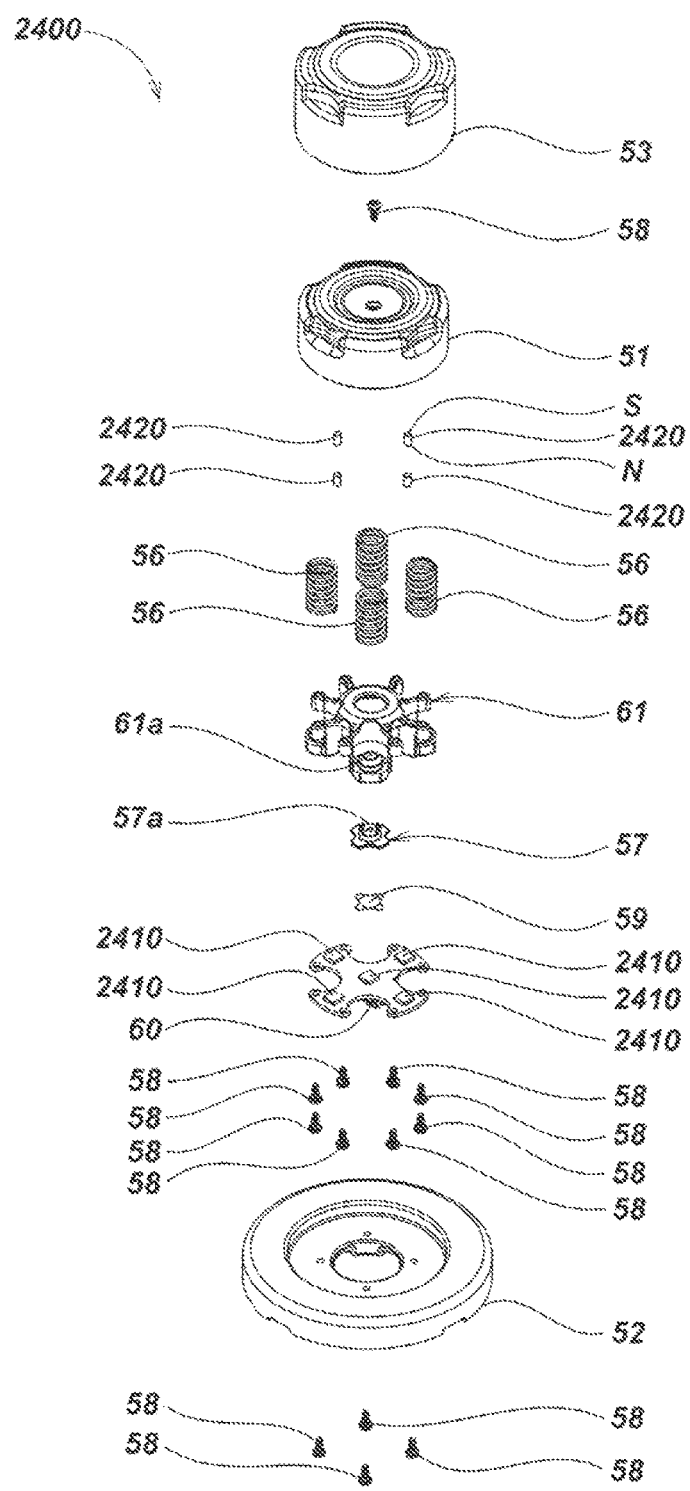
FIG. 24 illustrates details of an embodiment of a magnetic UID device using small magnets and compass sensors.

Some embodiments, such as illustrated in actuator assembly embodiment 2400 of FIG. 24, may use very sensitive magnetic sensors, such as a series of compass sensors 2410 or other high sensitivity sensors. The compass sensors 2410 may be commercially available BLBC3-B CMOS 3D Compass sensors from Baolab Microsystems, Xtrinsic MAG3110 Digital Magnometers from Freescale or other compass or high sensitivity sensors.

In an exemplary embodiment, five compass sensors 2410 may be used such that four of the compass sensors 2410 are positioned circumferentially about a circuit board, such as PCB 60, or other user interface device element such that each of the four compass sensors 2410 correspond to a small magnet 2420. The other compass sensor 2410 (also denoted as a "reference sensor 2410") may be positioned, for example, centrally on the PCB 350 such that it is separated from the other circumferentially positioned compass sensors 2410.

In these embodiments, the separated compass sensor 2410 may not correspond or be matched to any one of the small magnets 2420, and may be used as a reference sensor to measure and generate reference signals that may be used to subtract off any local or background magnetic fields, such as the earth's magnetic field or locally generated magnetic fields. By using physically small sensors, such as the compass sensors 2410, with closely positioned magnets, such as the small magnets 2420, the physical size of the actuator assembly and overall user interface device may be reduced.

Figure 25:
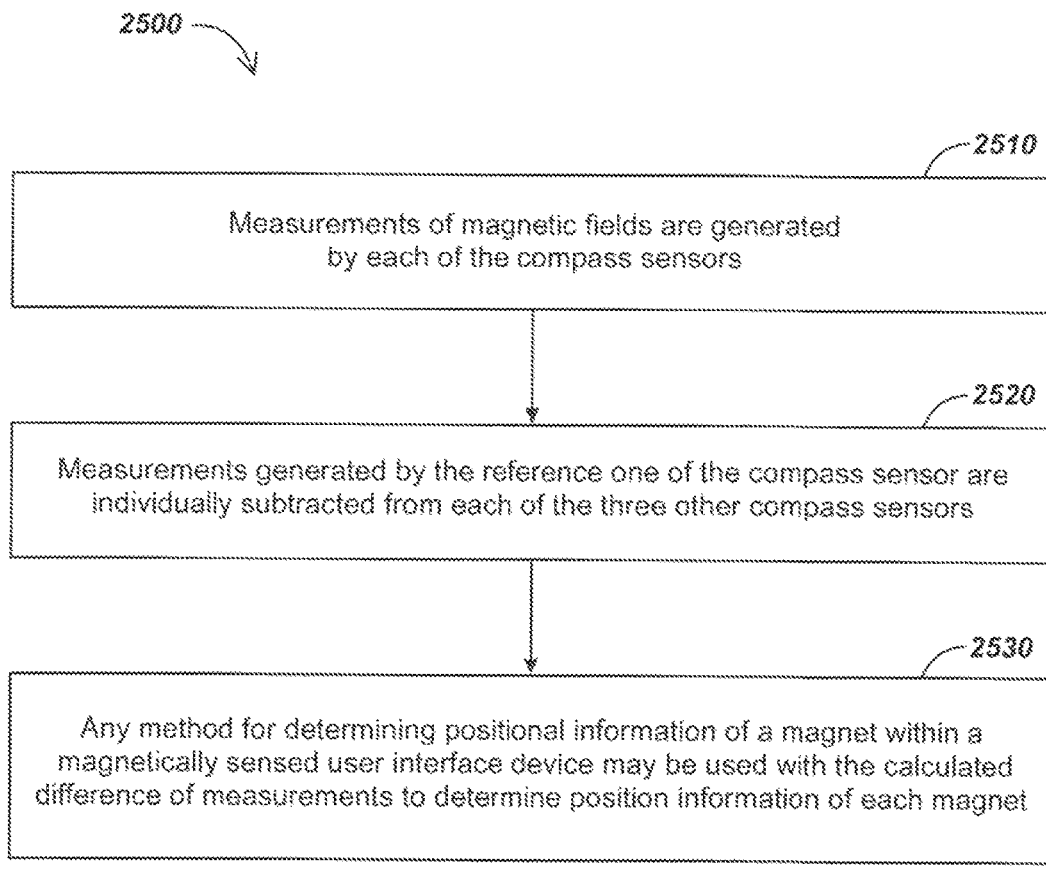
FIG. 25 is a block diagram illustrating details of an embodiment of a process for using magnetic field measurements generated from compass sensors to determine small magnet positions in a magnetic UID.

FIG. 25 illustrates details of an embodiment of a process 2500 for using high sensitivity magnetic sensors and associated sensor signaling, such as described with respect to the user interface device embodiment 2400 of FIG. 24, to adjust positional information in a user interface device using signals provided from a reference sensor. For example, process 2400 may be used to process magnetic measurements collected by a plurality of high sensitivity magnetic sensors, such as the compass sensors 2410 of FIG. 24, to determine the position of magnets such as the small magnets 2420 as illustrated in FIG. 24. Process 2500 may be used in conjunction with other processes described herein, such as with the processes as shown in FIG. 12, FIG. 13, or FIG. 14.

At stage 2510 magnetic field measurements may be generated, such as in three dimensions, $B_x$, $B_y$, and $B_z$, by a plurality of high sensitivity sensors, such as compass sensors 2410. These may include signals from high sensitivity sensors associated with magnets, as well as a reference signal generated by the reference sensor (that is not associated with a magnet such as magnet 2420).

At stage 2520, the measurement information provided from the reference sensor may be used to adjust information from the other sensors. For example, the reference sensor signal information may be subtracted from each information provided from each of the other compass sensors 2410 to generate difference information.

Once the difference between the three circumferentially positioned ones of the compass sensors 2410 and the reference sensor 2410 is calculated, positional information may be determined at stage 2530, such as by using any of the aforementioned or known methods of determining the position of a magnet within a magnetically sensed user interface device.

Figure 26:
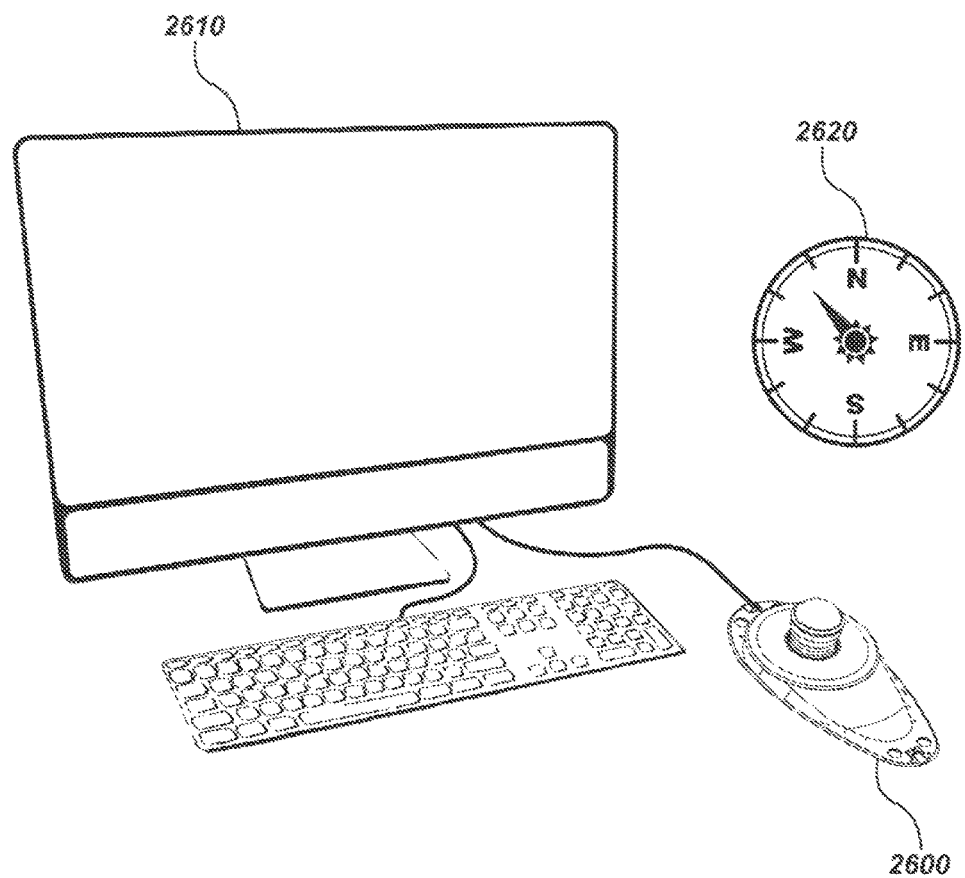
FIG. 26 illustrates details of an embodiment of a system including an electronic computing device coupled to a magnetic UID with associated compass devices for providing additional position information.

FIG. 26 illustrates details of an embodiment of a system including an electronic computing device (not shown) coupled to a magnetic UID embodiment 2600, such as via a USB connection, along with an associated electronic computing device monitor 2610. In the magnetic UID embodiment 2600, a compass device, such as compass chip or other component (not shown), may be incorporated in a base or other component of the magnetic UID 2600 to determine the device's relation to a magnetic reference, such as magnetic north. In such embodiments, the orientation of a user's computer monitor, such as monitor 2610, may also be determined in relation to the magnetic reference through the use of, for example, a magnetic compass 2620.

An internal electronic compass inside the monitor 2610 may also be used to determine the orientation of the monitor 2610 in relation to the magnetic reference. Alternately, the orientation of the monitor 2610 in relation to the magnetic reference may be inputted into the computing device. By using embodiments with this configuration, as the user moves or rotates the entire user input device 2600 relative to the orientation of the monitor 2610, the electronic compass within the user input device 2600 may allow the input coordinate system to rotate. For example, pushing the actuator towards the monitor 2610 may consistently result in the same relative user interface action. The electronic compass in the user interface device 2600 may also allow the absolute direction of motion of seismic induced accelerations at the operating surface to be sensed by the device.

In some embodiments, software may be used whereby the orientation of the user interface device 2600 in relation to the monitor 2610 is initially determined and stored. In such embodiments, all subsequent incidents of moving or rotating the entire user interface device 2600 from the initial determined orientation to the monitor 2610 may be used to rotate the input coordinate system accordingly. The same software may also be enabled, during an initial set up process, to use operator intended actuator motions to correspond to determine the orientation of the user interface device 2600 with respect to that of the monitor 2610.

It some embodiments, permanent magnets, such as described previously herein, may be replaced, in whole or in part, with electromagnets, such as chip scale electromagnet devices (which may be configured, for example, similar to small SMT inductors). A high sensitivity sensor device, such as a compass sensor as described previously herein, may be used with the electromagnet to build a compact, single sensor user interface device. This approach may be viewed similar to a configuration where "permanent" magnets could be switched off and on, thereby allowing use of two different (electro)magnets with a single compact three axis sensor. This allows a far smaller, lower cost, single sensor UI device to be built compared to multiple, three axis sensors. Applications for this type of compact device may include notebook computers, smart phones, tablet devices, or devices where small and/or thin user interface devices may be useful. Since high sensitivity sensors such as compass sensors are very sensitive, a very low powered, very small electromagnet array (e.g., a cross-shaped pair or other configuration of electromagnets) may be used in place of permanent magnets.

One potential advantage of such an implementation is that a pair of crossed dipoles (e.g., the energized electromagnets) that are energized in sequence or in combination may be used to eliminate the ambiguity associated with the movement around the axis of symmetry of a single dipole, and thereby allow a single three axis sensor to be used while still allowing all six degrees of freedom to be sensed. Electromagnet embodiments may use similar elements and methods to those described previously for permanent magnet implementations. The primary difference is replacement of the small permanent magnets with small controllable electromagnets (dipoles), and associated electromagnet driver controls and/or associate sensor controls. For example, in one embodiment of an electromagnet magnetic UID configuration a cross-shaped electromagnet may use a small chip scale, wire wound surface mount (SMT) cross dipole inductor that can produce either a magnetic dipole A or a magnetic dipole B, such as by using a cross-shaped electromagnet, when electric current is run through wire windings A or B.

A cross-shaped electromagnet may be placed above a small digital magnetometer (such as Freescale MAG3110 device or other similar or equivalent device), and the crossed dipole may be moved by the user relative to a small compass or other high sensitivity magnetic field sensor (e.g., digital magnetometer) device and sequential measurements of the field of dipole A and then dipole B may be measured when current is passed through each of these in sequence, thereby allowing the positional displacement and tilt of the relative movement and tilt between the two components to be measured.

In some embodiments, springs may be used as suspension elements in an electromagnetically configured magnetic UID. For example, three springs (or other numbers or shapes of springs) may be used to act as suspension elements between the high sensitivity magnetic sensor (e.g., compass chip or magnetometer) and electromagnets (e.g., crossed dipoles). The springs may also be used as electrical circuit elements to provide signals to the electromagnets, such as to allow dipoles A and B to be separately and controllably energized with current, such as may be controlled by a processing element or other circuit component of the magnetic UID, to create instant magnetic dipoles that can be sensed by a nearby multi-axis, (e.g., typically three axis) high sensitivity magnetic sensor (such as a compass chip or magnetometer).

In some embodiments drive signaling may be applied selectively to each of the dipole elements, for example, separately to dipole A and then dipole B (e.g., an electromagnet array comprising crossed dipoles A and B), to generate the magnetic fields for sensing. In addition, an "off state" may be used, where no current is applied to either dipole. For example, dipole A may first be energized to create a magnetic field, such as by a square waveform, ramp or triangle waveform, half sinusoidal waveform, or other appropriate waveform, and a measurement may be taken by the high sensitivity magnetic sensor (e.g., compass sensor or magnetometer), and then dipole B may subsequently be energized in a similar fashion to create a magnetic field and a second measurement may be taken by the sensor. A reference ambient magnetic field value may be taken with both dipoles A and B in the "off state" so that the relative strengths of the magnetic fields due to A and B alone may be determined by differencing away the ambient field value. Other patterns, sequences, and/or drive waveforms may be used in various embodiments.

Such a miniature magnetic UID using electromagnets and high sensitivity magnetic sensors may be advantageous for use in smart phones, notebook computers, tablet computers, or other similar small and/or thin electronic devices. In an exemplary embodiment, a cross-shaped electromagnet configuration with a single magnetic sensor may be built upon a single central PCB, where the device may be pinched by a user from opposite sides between two fingers, thereby allowing six degrees of motion to be imparted to the device by a user using only two fingers gripping from opposite sides. Optionally if a second pair of dipoles and/or a second magnet sensor is added, a pinch-squeeze measurement may also be made. In such an embodiment, the outer two pinchable PCBs and/or supports under the rubber covers might be optionally mechanically linked so that they move as a single unit.

As noted previously, the electromagnets may include inductors surrounded by coil, such as coil-wrapped chip inductors. In some embodiments, deliberately saturating the inductors may be used to improve the reproducibility of the magnetic field over short time intervals.

Figure 27:
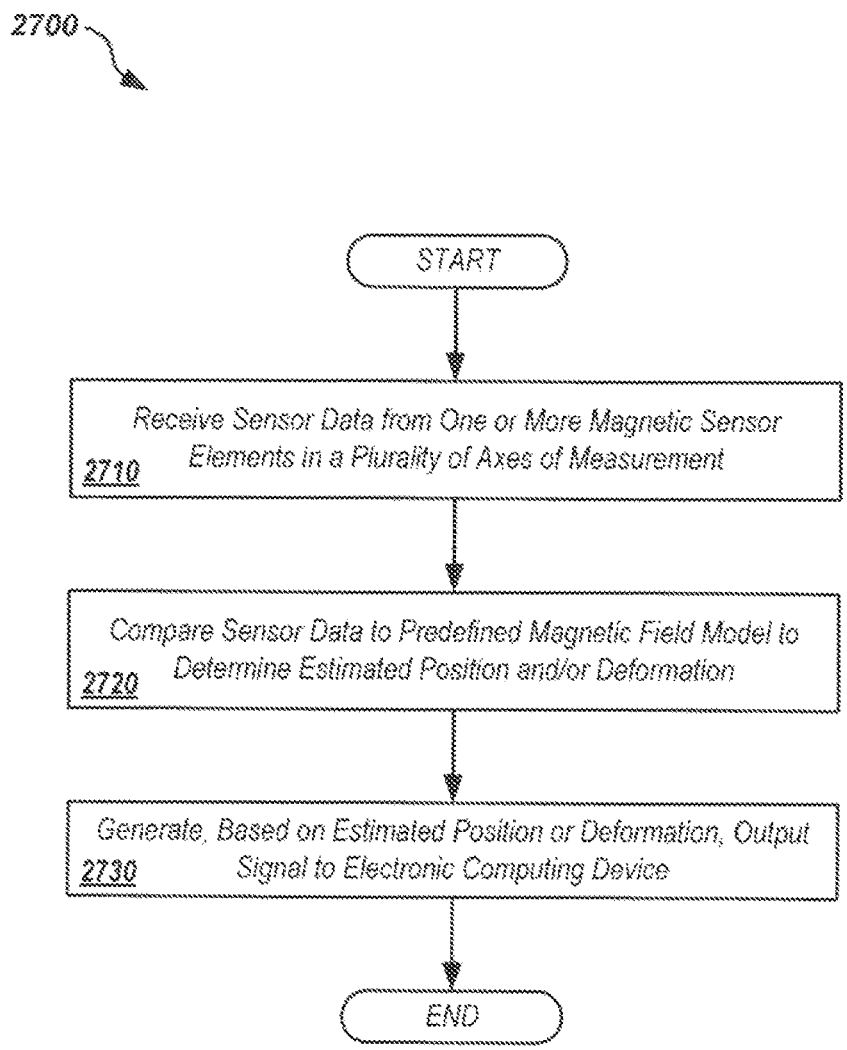
FIG. 27 illustrates details of an embodiment of a process for determining positional information of an actuator element and/or magnets in a magnetic UID.

FIG. 27 illustrates details of an embodiment of a process FIG. 2700 that may be used to process magnetically sensed signals in a magnetic UID, such as the magnetic UID embodiments described previously herein. At stage 2710, a processing element may receive, during a movement or deformation of an actuator element from the released state, sensor data from one or more magnetic sensor elements, such as from a two or three-axis magnetic sensor. The sensor data may be in a plurality of axes of measurement, such as in three-axes of measurement, and may be sufficient to determine motion of the actuator and/or associated magnets in six degrees of freedom.

At stage 2720, the sensor data from the one or more magnetic sensor elements may be compared to a predefined magnetic field model to determine an estimated position or deformation of the actuator element from the reference state, such as by accessing a lookup table and/or solving a closed form equation model. At stage 2730, an output signal may be generated based on the estimated position or deformation of the actuator element from the reference state. The output signal may be formatted in a compatible format, such as USB or other computer-interface formats, to be provided to an electronic computing device from the magnetic UID. The predefined magnetic field model may be configured to relate positional information of the one or more magnets with corresponding sensor information associated with the one or more magnetic sensor elements, and may be stored in one or more memory elements of the magnetic UID, such as in a memory device integral with or coupled to the processing element to allow direct access to the memory device.

The stage 2720 of comparing the sensor data from the one or more magnetic sensor elements to a predefined magnetic field model may include, for example, comparing the sensor data to values in one or more lookup tables to determine the estimated position or deformation. The stage of comparing the sensor data may further include converting x and y dimension sensor measurements to an r-dimension measurement and determining the estimated position by accessing a lookup table including $B_r$ and z-dimension values. Alternately, or in addition, the stage 2720 of comparing the sensor data from the one or more magnetic sensor elements to a predefined magnetic field model may include solving, based on the sensor data, a closed form equation of the predefined magnetic field model to determine the estimated position or deformation. The plurality of orthogonal axes of measurement may be three orthogonal axes of measurement.

The one or more magnets may be permanent magnets. Alternately, or in addition, the one or more magnets may be electromagnets. The actuator element may include one or more movable elements. Alternately, or in addition, the actuator element may include one or more deformable elements.

The output signal may include, for example, data defining the estimated position of the actuator element and/or of magnets in or associated with the actuator element. The output signal may include data defining a motion of the actuator element. The output signal may include data defining the deformation of the actuator element. The predefined magnetic field model may include one or more lookup tables relating the positional information to the sensor information. The predefined magnetic field model may include a mathematic model, which may be a closed form solution model, relating the position information to the sensor information. The reference position may be a released state position or may be another position related to or associated with the released state position, such as a position offset from the released state position.

The reference position may be offset from a released state position, and the method may further include, for example, determining the offset from the released position and adjusting the estimated position based on the determined offset. The offset may be a function of temperature and/or other physical or operational parameters, and the estimated position may be adjusted responsive to a temperature measurement or determination of the other physical or operational parameters.

The process 2700 may further include, for example, a stage of compensating for unintended displacement of the manual actuator below a predetermined minimum threshold. The process may further include a stage of compensation for position of the magnetic user interface device using one or more compass devices. The position of the magnetic user interface device may be compensated by using a first compass on the magnetic user interface device and a second compass on a display or monitor of a coupled electronic computing system.

The determining of the offset from the released position may include, for example, generating a center calibration prism including a predetermined set of boundaries of the magnetic field components detected by each sensor, and repeatedly re-defining the center calibration prism so as to auto-zero the released state position.

Figure 28:
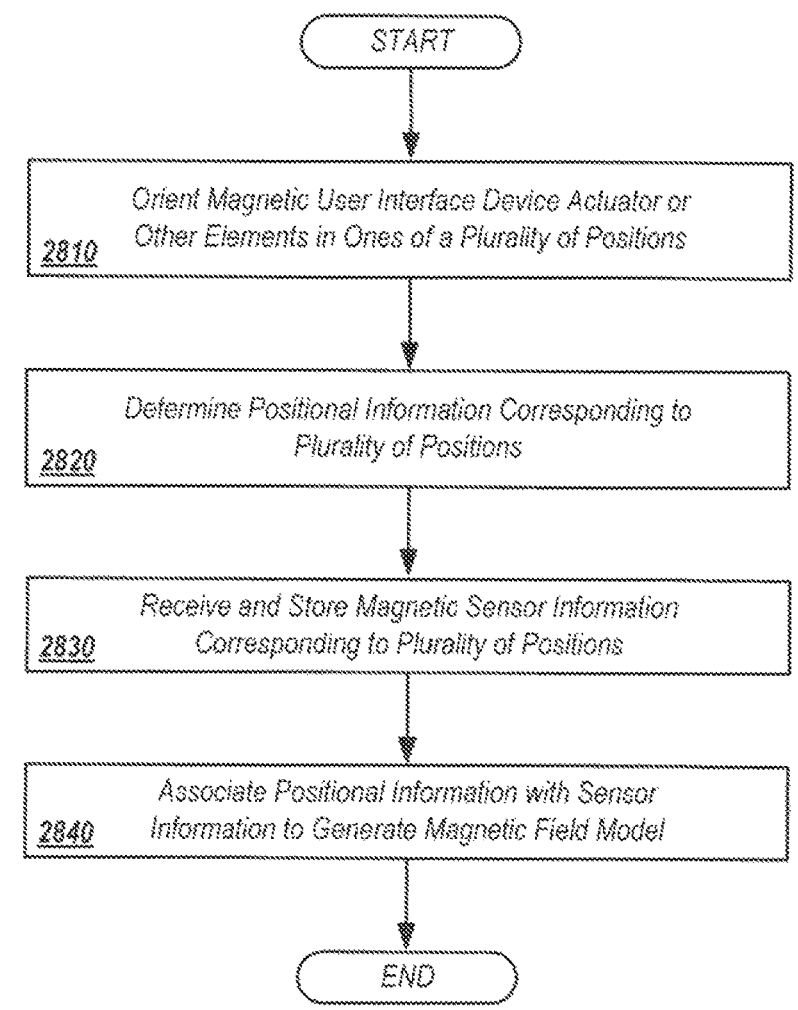
FIG. 28 illustrates details of an embodiment of a process for determining magnetic field model information for use with a processing element of a magnetic UID.

FIG. 28 illustrates details of an embodiment of a process FIG. 2800 that may be used to generate a predefined magnetic field model for use in a magnetic user interface device, such as the magnetic UID embodiments described herein. At stage 2810 a user interface device or element of the user interface device, such as an actuator or magnet assembly, may be oriented in ones of a plurality of different positions. At stage 2820, positional information may be determined and stored in a test system, such as a test computer, with the positional information corresponding to ones of the plurality of positions that are measured. At stage 2830, ones of a plurality of sensor data values may be generated, such as from a magnetic sensor apparatus, and may be sent to the test system, where they may be associated with the positional information at stage 2840 and stored to generate the predefined magnetic field model. The predefined magnetic field model may then be loaded or burned into a memory of a magnetic UID for use during operation such as described previously herein. In some embodiments, the positional information and sensor data values may be associated and configured in the form of a lookup table. Alternately, or in addition, the positional information and sensor data values may be translated to a closed form mathematical model, such as a closed form approximation of the measured sensor and position data, and then stored in the form of a closed-form equation which may be processed by a processing element of a magnetic UID during operation.

In some embodiments, permanent magnets, such as described previously herein, may be replaced, in whole or in part, with electromagnets, such as chip scale electromagnet devices (which may be configured, for example, similar to small SMT inductors) or other small scale electromagnetic devices. A high sensitivity magnetic sensor device, such as a magnetometer or compass sensor as described previously herein, may be used with the electromagnet to build a compact user interface device that may be operable with a single multi-axis magnetic sensor, rather than multiple sensors as described previously herein. This approach may be viewed as similar to a configuration where "permanent" magnets could be switched off and on, thereby allowing use of two different (electro)magnets with a single compact three axis sensor. This configuration may allow for a smaller, lower cost, single sensor user interface device to be built compared to devices using multiple three axis sensors. In embodiments using electromagnets, a control circuit, such as an electronic circuit including logic elements and current switching elements such as transistors or other solid state switching devices, may be used to provide driving current to the electromagnets. The control circuit may be implemented in a separate circuit on or within the user interface device or may be incorporated, in whole or in part, in a processing element of the user interface device. Output current and/or other signals may be coupled between the control circuit and electromagnets using conductive springs, wires, or other conductive circuit elements.

In typical configurations using electromagnet dipole arrays, rather than permanent magnets, the relative instantaneous strength of the current provided through the dipole elements may be controlled in the control circuit to allow the associated magnetic field to be switched (in any order) such as by sequential or other switching schemes, to provide independent measurements of the field strength and orientation so as to allow a unique positional solution of the relative position of the magnetic sensors and the dipole array. The solution may be done, for example, as described previously herein with respect to permanent magnet configurations. The current through the dipoles may be controlled and switched in a variety of ways to provide measurably distinct, separate, and independent magnetic fields at the sensor that are then sensed by the sensor to provide sensor output signals to a processing element or other electronic component of the associated UID or other device. The fields need not necessarily be perpendicular to be independent. In some embodiments the control circuit and associated switching may be coordinated with magnetic field sensing done by the magnetic sensor and/or signal processing performed in the processing element on sensed magnetic field data.

Example applications for this type of compact device may include notebook computers, smart phones, tablet devices, gaming devices, compact computing or electronics systems, or other devices or systems where small and/or thin user interface devices may be useful or desirable. Since high sensitivity sensors such as compass sensors can be very sensitive, a very low powered, small electromagnet array (e.g., a cross-shaped pair or other configuration of dipole electromagnets) may be used in place of permanent magnets in some embodiments.

One potential advantage of such an implementation is that a dipole array including a pair of crossed dipoles (e.g., the energized electromagnets) that are energized in sequence or in combination may be used to eliminate the ambiguity associated with the movement around the axis of symmetry of a single dipole, and thereby allow a single three axis sensor to be used while still allowing all six degrees of freedom (as described previously herein) to be sensed. The configuration may be particularly advantageous in size-limited or cost-sensitive applications.

Electromagnet UID embodiments may use similar elements and methods to those described previously for permanent magnet implementations as described subsequently herein. A primary difference is replacement of the small permanent magnets with small controllable electromagnets (e.g., dipoles), and addition of associated electromagnet driver calibration, and/or compensation controls, and/or associated magnetic sensor control functions, which may be implemented in a control circuit. Some example embodiments are illustrated subsequently.

Figure 29A:
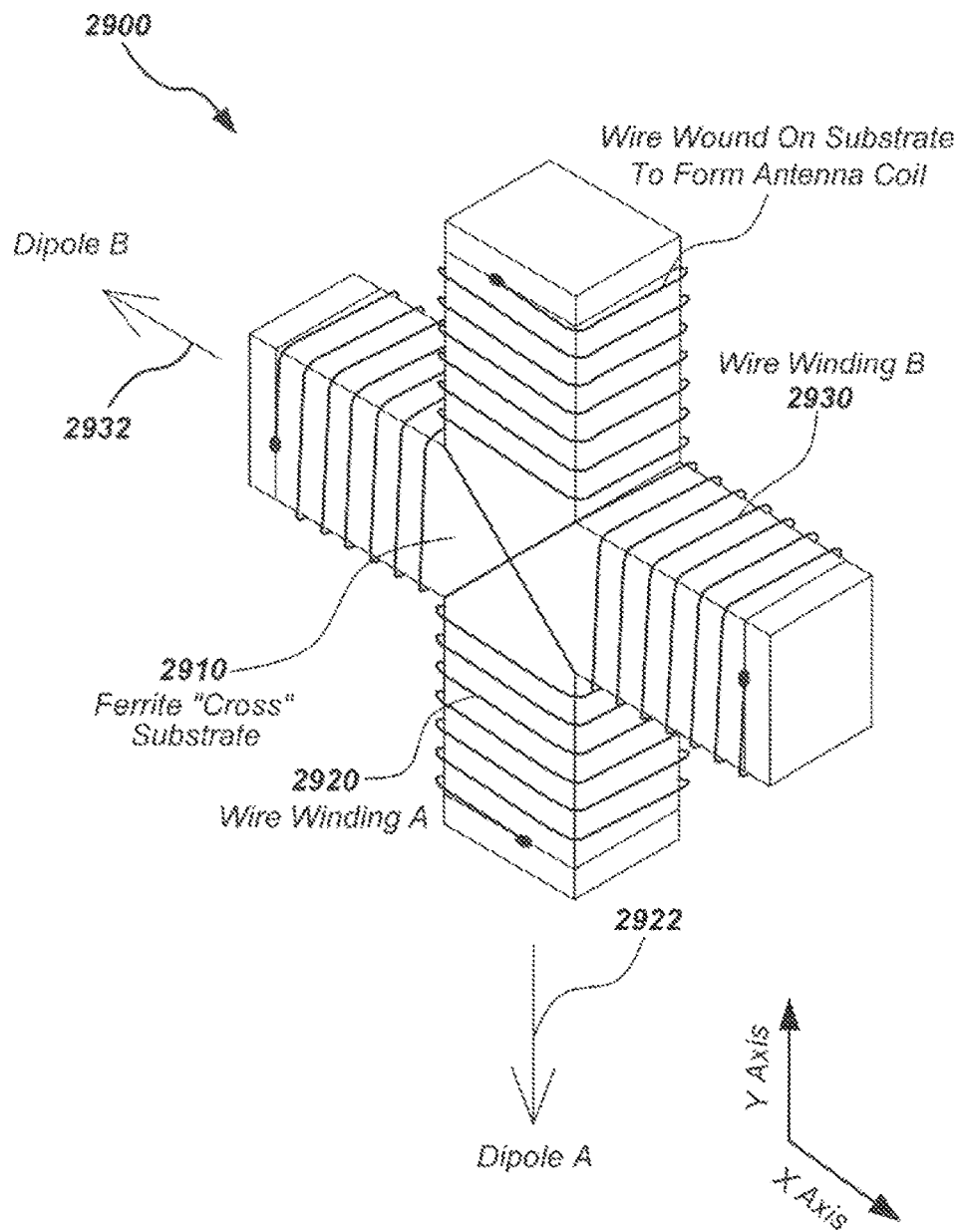
FIGS. 29A-29C illustrate details of an embodiment of an electromagnet dipole array with X and Y axis dipoles and examples of configurations for use of such an array in a magnetic UID.

For example, FIG. 29A illustrated details of one embodiment 2900 of such an electromagnetic dipole array configuration. The cross-shaped electromagnet array shown in FIGS. 29A-29C may use a small chip scale, wire wound surface mount (SMT) cross dipole inductor element that can produce either magnetic dipole A or B when electric current is provided through wire windings A or B. This may be done through a switching circuit or other electronic control module, which may be controlled by or incorporated within a processing element of the UID in which the array is being used.

As shown, array 2900 includes a support or substrate structure 2910, which may be a cross-shaped inductor ferrite as shown to allow for orthogonally configured dipoles. In this example, the dipoles are oriented in X and Y dimensions as shown. The substrate cross-section may be square or rectangular as shown, such as to allow for use of square-shaped board-level inductors or other magnetic components, or may have other shapes such as circular or oval, or other cross-sectional shapes. Likewise, while an exemplary embodiment may use a cross-shape as shown, other shapes allowing for generation of orthogonal magnetic fields may be used in various implementations.

Figure 40:
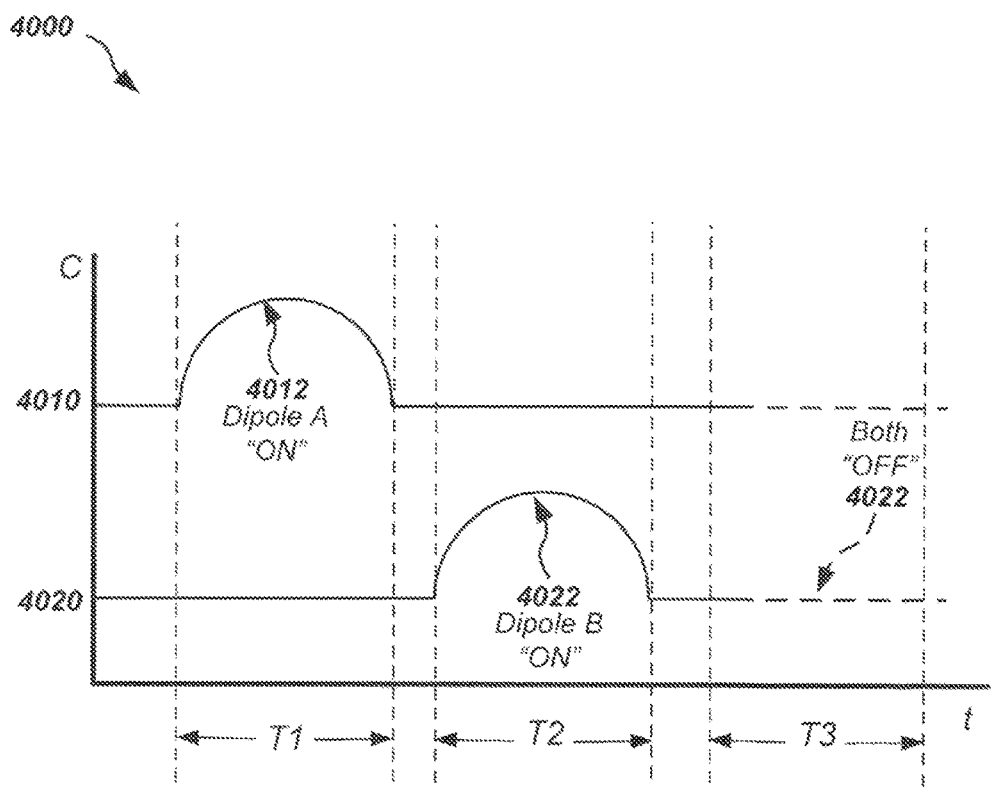
FIG. 40 illustrates example details of one switching scenario embodiment using a pair of electromagnetic dipole elements of an electromagnetic dipole array in a UID.

In the example array 2900, two wire windings, windings 2920, and 2930, form dipoles A (2922) and B (2932), respectively, when energized. These dipoles may be alternately energized, such as by switching on and off as shown in FIG. 40, and/or in some embodiments may be energized jointly, at the same or varying phases and/or amplitudes, so as to generate a shaped magnetic field. In the example embodiment 2900, the four "prongs" of the cross-shaped ferrite substrate may have wire winding crossed-over at the center to connect the windings together as shown. In alternate configurations described subsequently, each prong may have a separate winding (e.g., four windings on a cross-shaped substrate as shown) to allow separate or tandem energization of each dipole. Other configurations may include alternate interconnection points and/or wiring configurations.

Figure 29B:
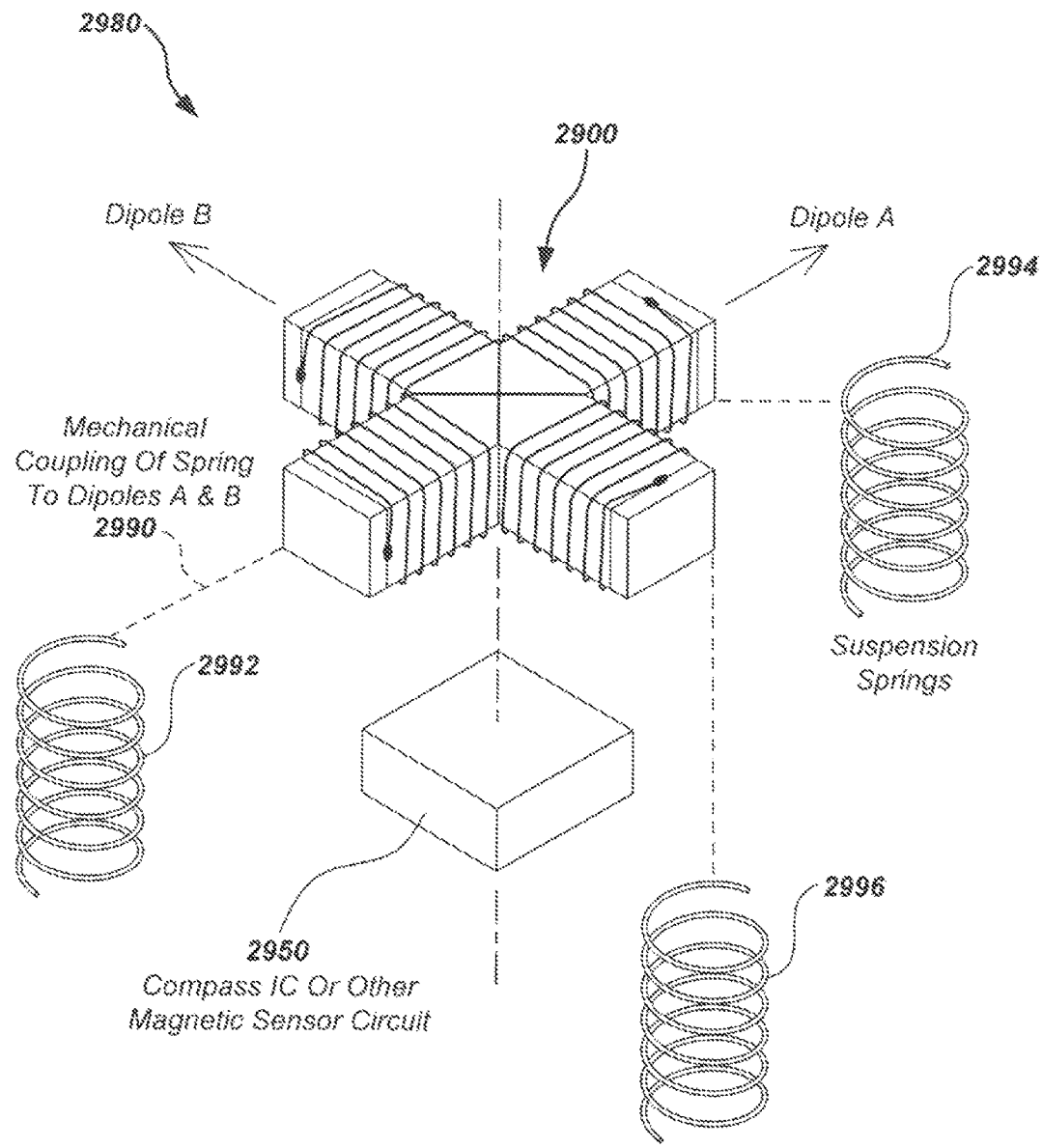

FIG. 29B illustrates a simplified example embodiment of the dipole array embodiment 2900 of FIG. 29A positioned above a multi-axis magnetic sensor 2950, which may be, for example, a small digital magnetometer (such as Freescale MAG3110 device) or other similar or equivalent device. During user actuation, the crossed dipole array may be moved by the user relative to the sensor 2950 (e.g., digital magnetometer) and measurements of the field of dipole A and then dipole B may be measured, such as sequentially or in some other sequence, when current is passed through each, thereby allowing the positional displacement and tilt of the relative movement and tilt between the two components to be measured. The array 2900 may be mechanically coupled via a coupling mechanism 2990, such as those described previously herein or other fixed or rigid coupling mechanisms, to a printed circuit board or other base element. This may be done by using a plurality of suspension springs 2992, 2994, and 2996 (which may include more or fewer springs in various embodiments). As described subsequently, the springs may also be used as conductors for providing driving currents and/or control or data signals.

Figure 29C:
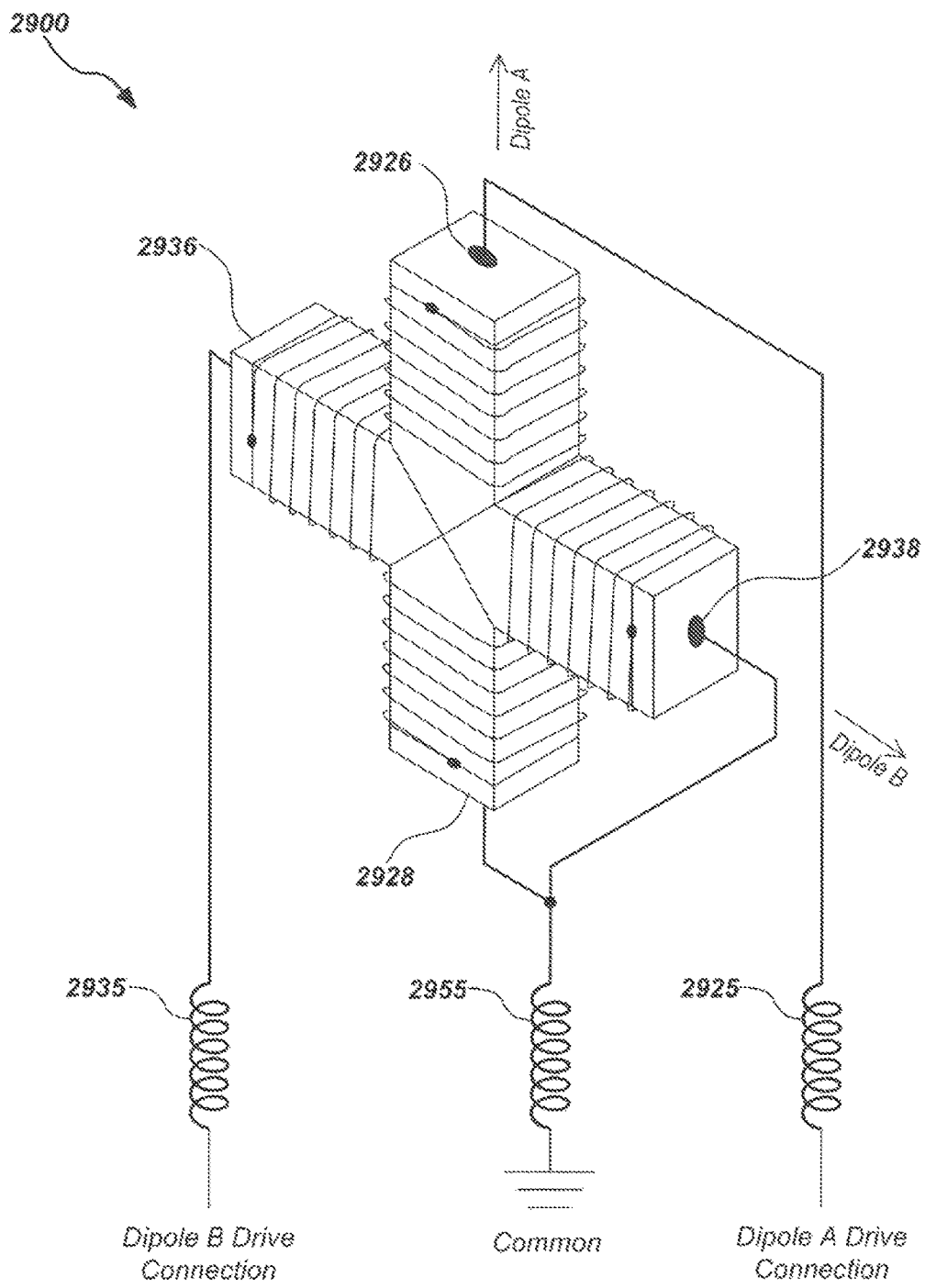

FIG. 29C illustrates additional details of use of dipole array 2900 including an embodiment of a driving circuit for providing current to the dipole array. In this configuration, the two dipoles A and B may be coupled to a common point at contact points 2938 and 2928 through spring 2955, which may correspond with one of springs 2992, 2994, or 2996 as shown in FIG. 29B. The other connection point 2936 (of Dipole B) and 2926 (of Dipole A) may be connected to separate driving circuit connections through springs 2935 and 2925, respectively (which may be others of springs 2992, 2994, and 2996), as shown. Although springs may be used for electrical connection points in exemplary embodiments as shown, in other embodiments wiring or other conductive elements may be used to carry currents and/or other signals between the electromagnetic array and an associated power and/or control circuit.

Through use of the springs (as shown) or other conductive elements, a control circuit may provide signals to selectively drive the electromagnets, such as to allow dipoles A and B to be separately and controllably energized with current to create instant magnetic dipoles that can be sensed by a nearby three axis magnetic sensor (e.g., magnetometer or compass sensor), such as sensor 2950 as shown in FIG. 29B.

Figure 30A:
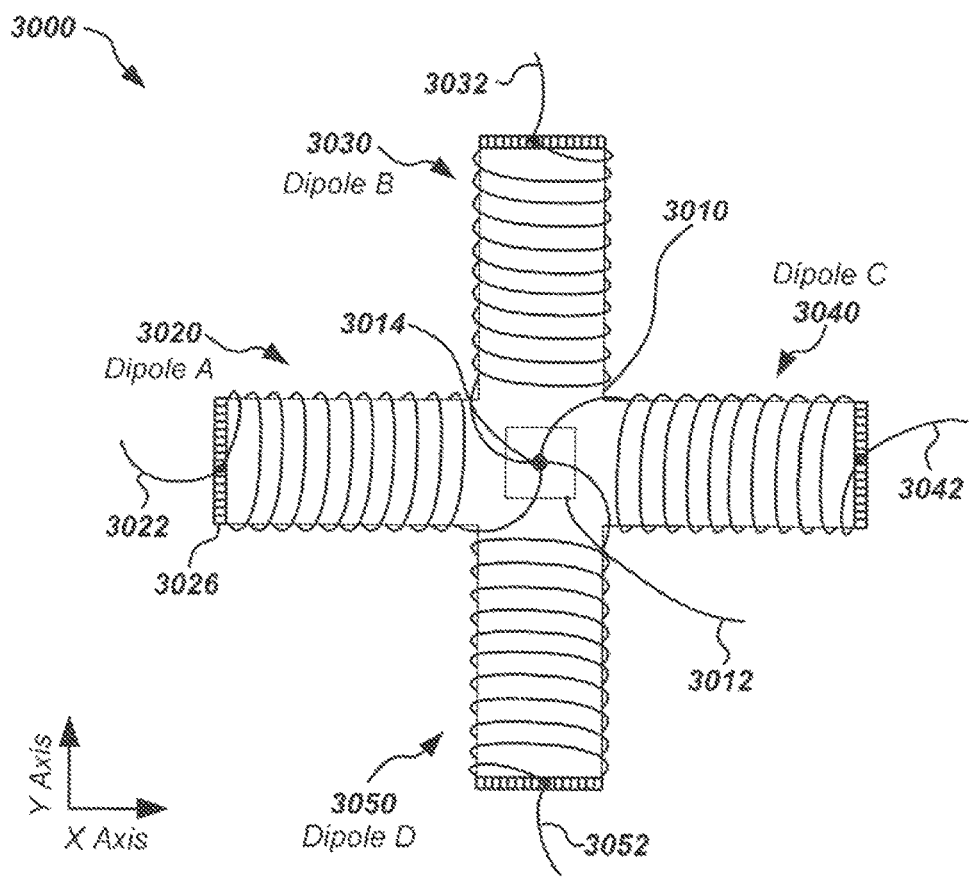
FIGS. 30A and 30B illustrate details of another embodiment of an electromagnet dipole array with X and Y axis dipoles for use in a magnetic UID.
Figure 30B:
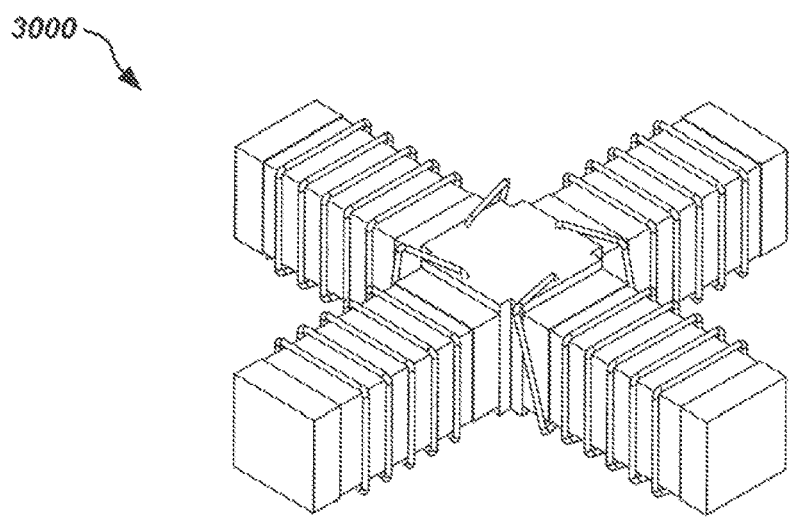

FIGS. 30A and 30B illustrate details of another embodiment of an electromagnetic dipole array 3000. In this configuration, four dipoles, Dipole A (3020), Dipole B (3030), Dipole C (3040), and Dipole D (3050) are formed on a cross-shaped substrate 3010. This substrate may be the same as or similar to the substrate 2910 as shown in FIG. 29A, such as a ferrite cross or other cross-shaped element. Array 3000 may include a common connection point 3014, which may be on a solder pad 3012 or other connection point on or within the substrate 3010. Corresponding windings of each of the four dipoles may connect at one point to the common connection point 3014. The other ends of the windings may connect to leads at points 3022, 3032, 3042, and 3052, of Dipoles A, B, C, and D, respectively. These leads may be coupled to a driving circuit to control switching and/or common energization of the multiple dipole elements.

FIG. 30B illustrates details of one embodiment of a dipole array such as array 3000 on a chip-scale ferrite core with solder pads at the end of each prong of the core as well as in the center. Wire windings on each prong are coupled to the common center pad as well as to the outer pads.

Figure 31A:
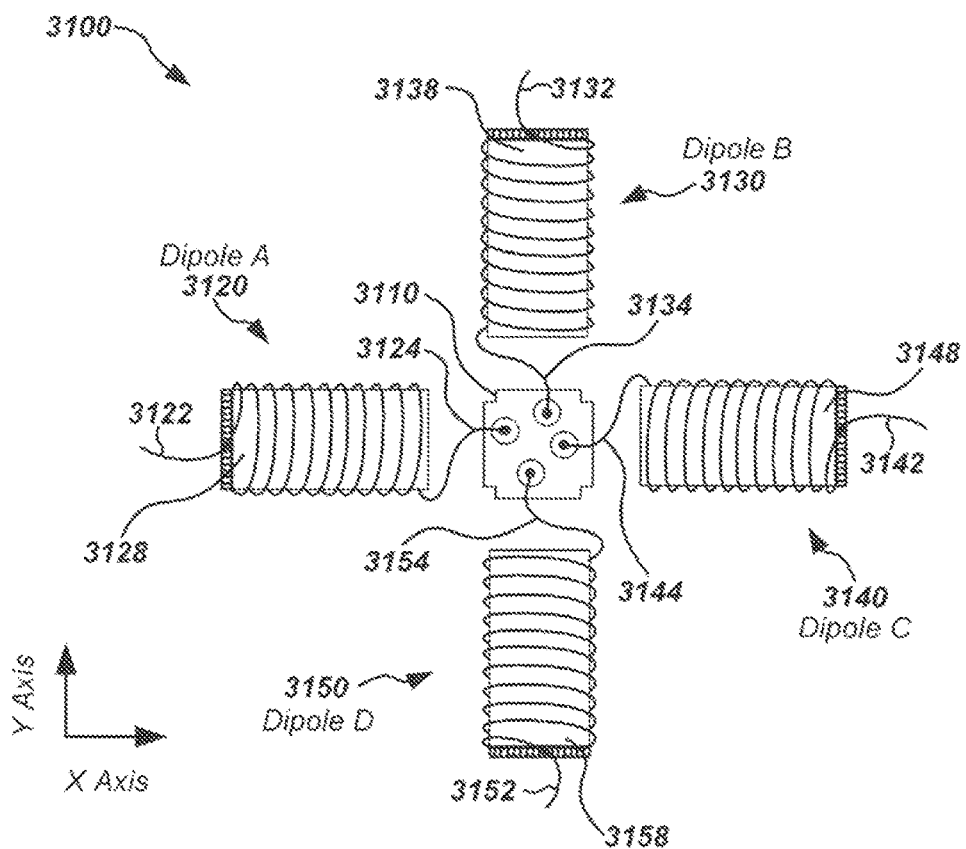
FIGS. 31A and 31B illustrate details of another embodiment of an electromagnet dipole array with X and Y axis dipoles for use in a magnetic UID.
Figure 31B:
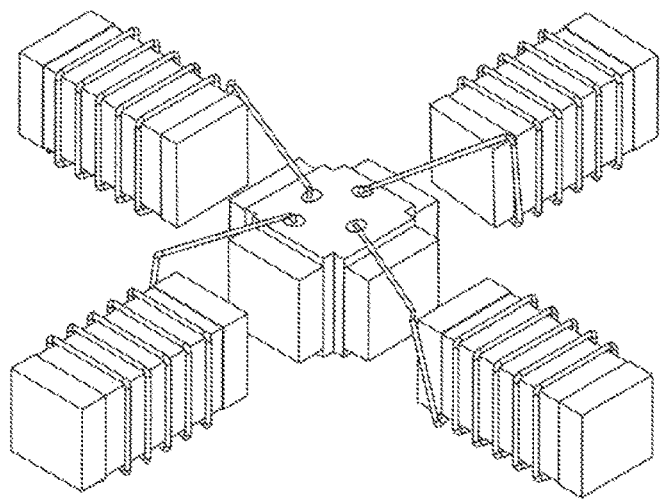

FIGS. 31A and 31B illustrate details of another embodiment of an electromagnetic dipole array 3100. In this configuration, four dipoles, Dipole A (3120), Dipole B (3130), Dipole C (3140), and Dipole D (3150) are formed on separate ferrite cores 3128, 3138, 3148, and 3158, with wiring from each Dipole coupled at one end to a center substrate 3110 via connections 3124, 3134, 3144, and 3154. The connections may meet at a common point on substrate 3110 or may each include a separate connection to control circuitry. The other ends of dipole wiring may be coupled to connections 3122, 3132, 3142, and 3152 as shown, with each connection point being controllable separately or in some cases jointly or in tandem. FIG. 31B illustrates an example embodiment of an electromagnetic dipole array 3100 using chip-scale components and associated wiring.

Figure 32:
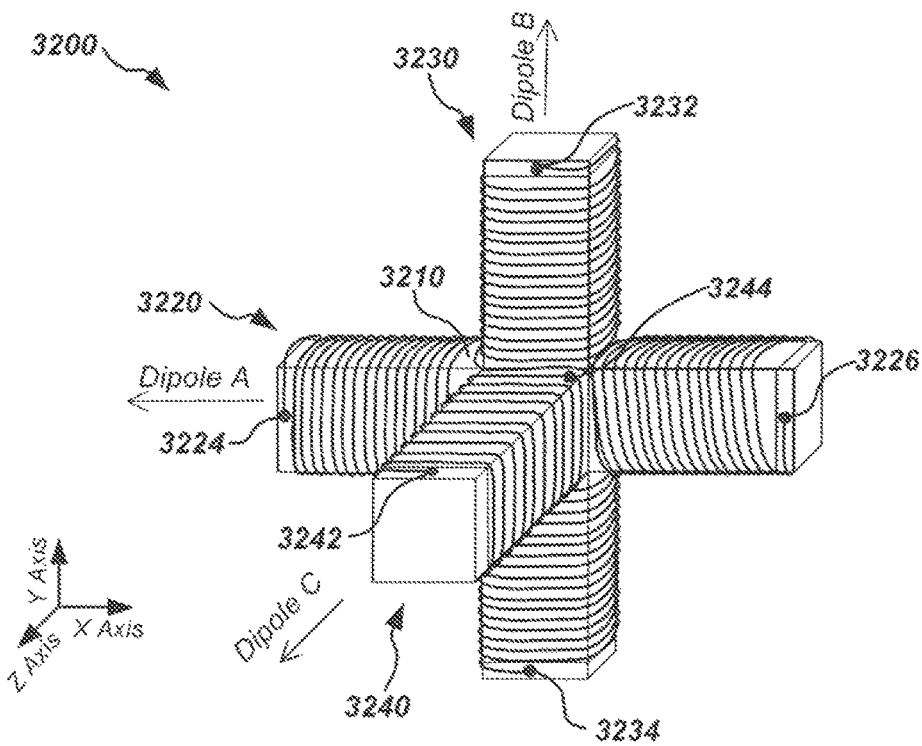
FIGS. 32-35 illustrate details of other embodiments of electromagnet dipole arrays with X, Y, and Z-axis dipoles for use in a magnetic UID.

Various other dipole array configurations may be used in alternate embodiments to provide dipole elements in two or more dimensions or axes. For example, FIG. 32 illustrates another embodiment of a dipole array 3200 having an additional dipole (relative to array 2900) in the Z-axis. In this configuration, which may be implemented similarly to array 2900, an additional Z-axis structure may be added to form substrate 3210. Dipoles A (3220) and B (3230) may be formed similarly to those shown in FIG. 29, with connection points 3224 and 3226 for Dipole A and 3232 and 3234 for Dipole B. In addition, another winding on substrate 3210 in the Z-axis (as shown) may form Dipole C, with connection points 3242 and 3244. Various connection point configurations may be used, such as by sharing a common connection point as shown in FIG. 29C (with addition of a connection for Dipole C, e.g., connection point 3244). A configuration such as dipole array 3200 may include an additional spring if suspension springs are also used as conductors, and/or may include other connections, such as through wires or other conductors.

Dipole elements of the dipole array may be used to generate magnetic fields to provide independent field measurements centered or nearly centered on a single location, though in principle the dipoles really do not have to be collocated, and thereby make the device smaller and more compact and require the use of fewer magnetic field sensors. In addition, in some embodiments ambient magnetic fields may be measured (e.g., by using a single multi-axis sensor or, in certain configurations where multiple sensors are used, those multiple sensors) to determine the ambient conditions and then adjust the output of the dipole array elements to compensate. In addition, in some embodiments, an ambient magnetic signal may be measured, then a nominal driven magnetic field (e.g., equal current in each dipole) may be measured, and then the dipole array may be adjusted to generate an adjusted driving signal to compensate for the ambient magnetic field.

Figure 33:
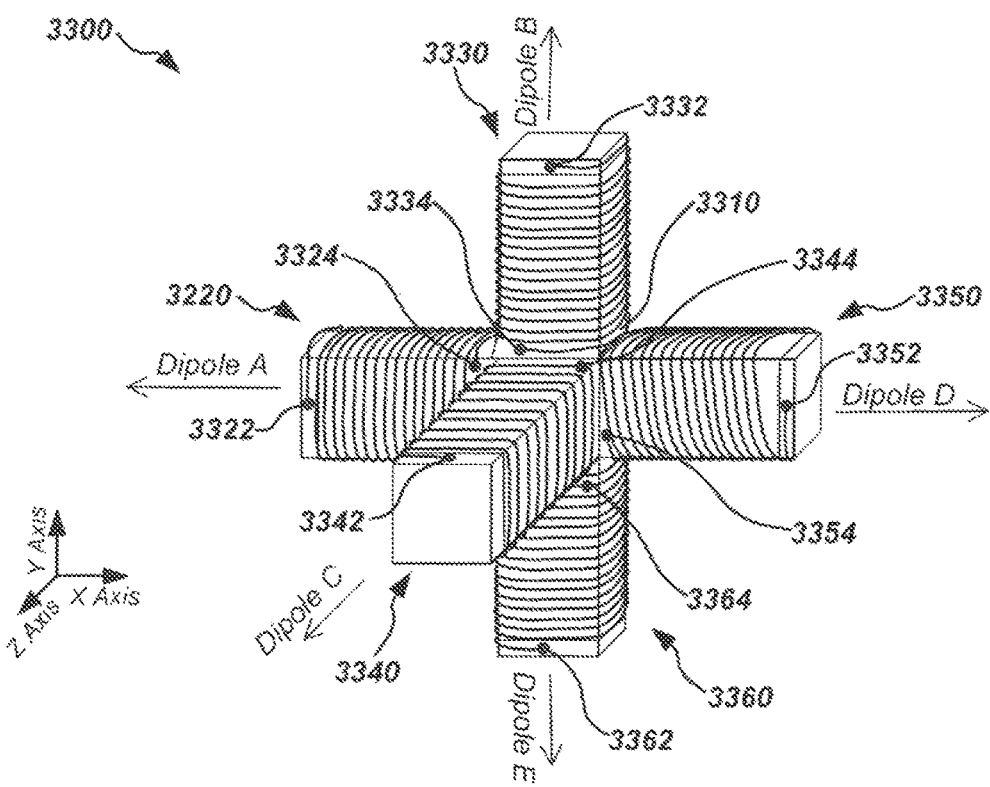

FIG. 33 illustrates another embodiment of a dipole array with a Z-axis dipole element 3340 formed on substrate 3310. This array may be configured similarly to array 3000 of FIG. 30, but with the addition of Dipole C. For example, Dipole A (3320) may include connection points 3322 and 3324, Dipole B (3330) may include connection points 3332 and 3344, Dipole C (3340) may include connection points 3342 and 3344, Dipole D (3350) may include connection points 3352 and 3354, and Dipole E (3362) may include connection points 3362 and 3364. In some embodiments one end of each dipole winding may be connected to a common point (e.g., connection points 3324, 3334, 3344, 3354, and/or 3364), with the other ends of each winding separately controlled or controlled in pairs or in tandem). Alternately, each dipole may be coupled to a separate driving and/or control circuit.

Figure 34:
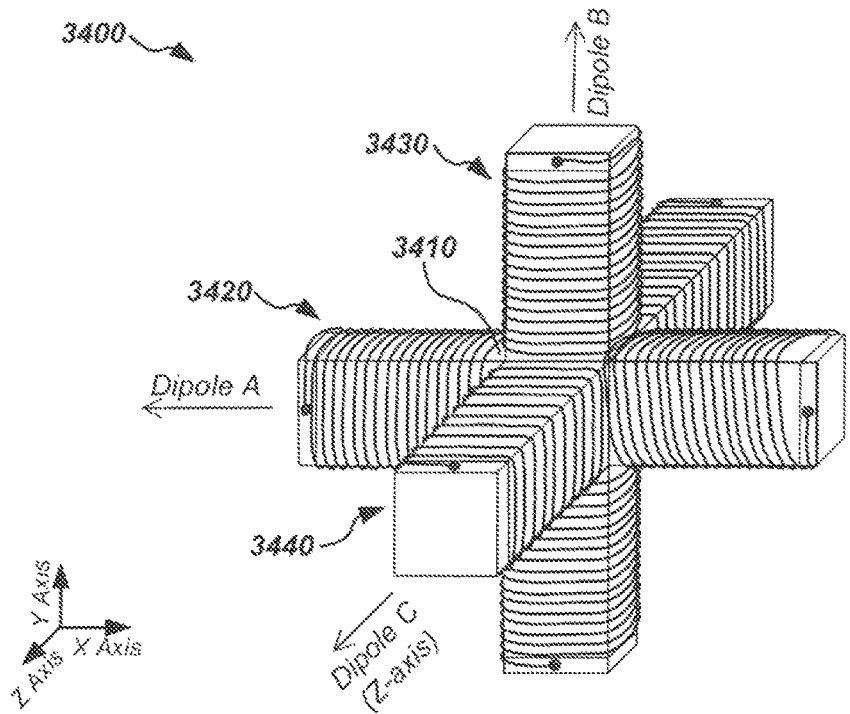

FIG. 34 illustrates another embodiment of a dipole array with a Z-axis dipole element 3440 formed on substrate 3410. This array may be configured similarly to array 2900 of FIG. 29, but with the addition of Dipole C along both prongs in the Z-axis. For example, Dipole A (3420) may extend the entire length of the substrate along the X axis, Dipole B (3430) may extend the entire length of the substrate along the Y axis, and Dipole C (3440) may extend the entire length along the Z axis as shown. The ends of each winding of the dipoles may be connected in a common point configuration as described previously or each may be separately connected to a driving/control circuit.

Figure 35:
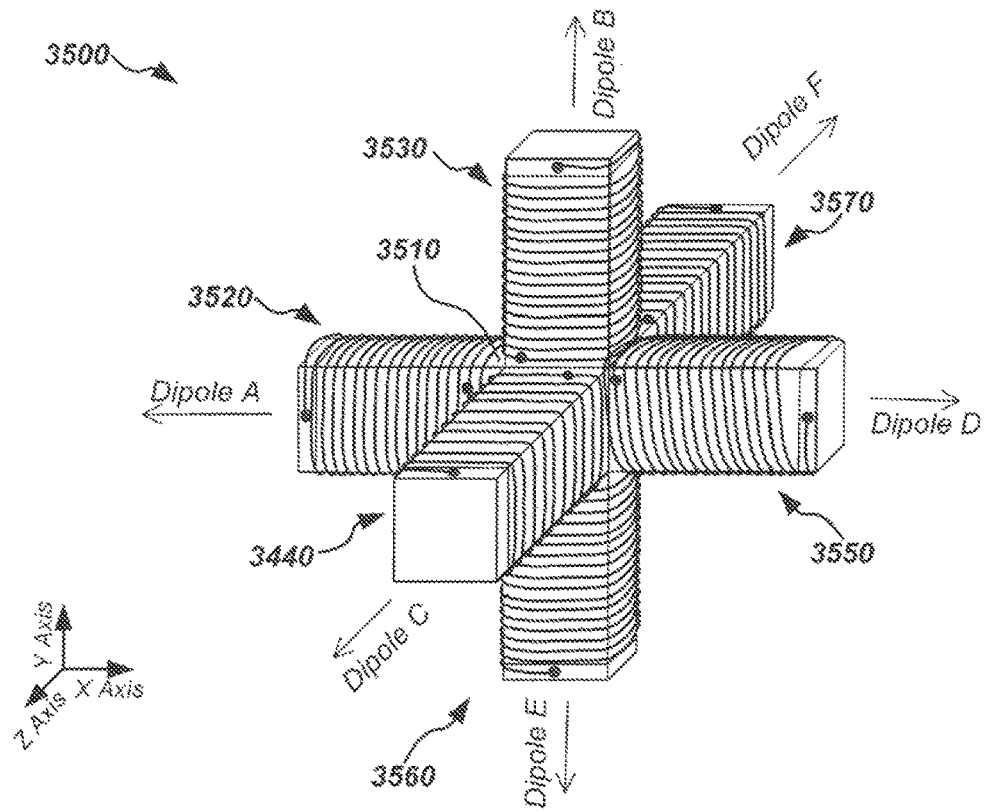

Yet another embodiment of a dipole array embodiment 3500 with a Z-axis configuration is shown in FIG. 35. This dipole array may be configured similarly to the array 3300 of FIG. 33 but with the addition of a second dipole 3570 along the Z-axis. For example, Dipole A (3520) may extend along one prong of substrate 3510, with Dipole D (3550) along the opposite prong in the X-axis. Dipole B (3530) may extend along one prong on the Y-axis with Dipole E (3560) along the opposite prong. Along the Z-axis Dipole C (3540) may extend along one prong and Dipole F (3570) along the opposite prong. The dipoles may be connected at or to a common point, with the other ends of each winding separately controlled or controlled in pairs or in tandem. Alternately, each dipole may be coupled to a separate driving and/or control circuit. In this configuration, Dipoles A and D would typically be energized and driven in tandem to produce a single dipole field centered at or near where the three axes intersect. Similarly Dipoles B and E, and Dipoles C & F, would typically be energized and driven in tandem. However, in some embodiments each element may be driven separately to achieve a desired magnetic field structure, such as to compensate for ambient fields or other distortions.

Figure 36A:
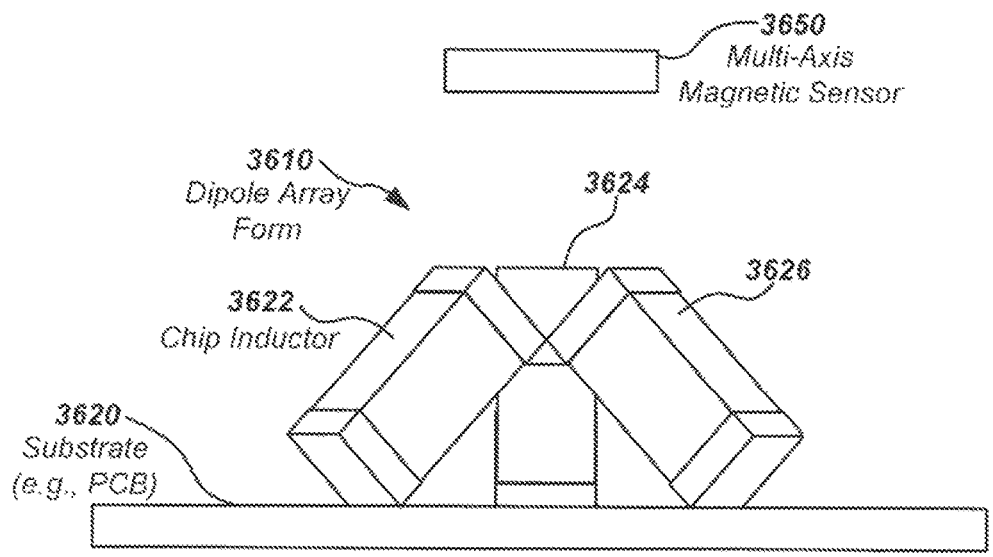
FIGS. 36A and 36B illustrate details of other embodiments of electromagnet dipole arrays with three dipole array elements disposed in a pyramid stack configuration on a printed circuit board (PCB)
Figure 36B:
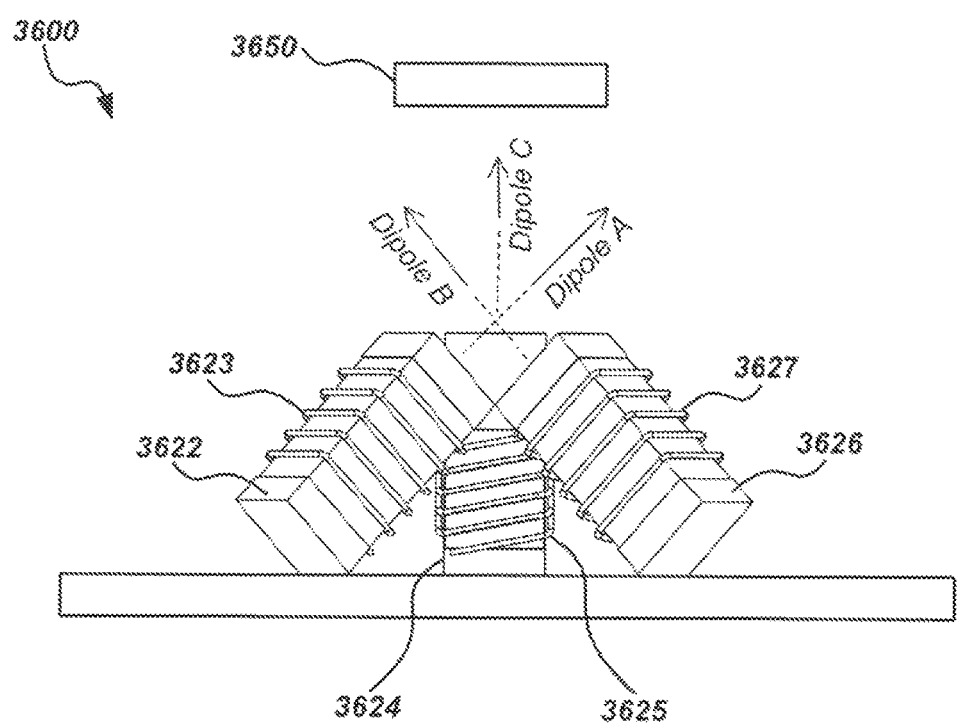

FIGS. 36A and 36B illustrate details of another embodiment 3600 of an electromagnetic dipole array. This embodiment may be implemented using chip-scale inductor or other substrate components with windings disposed thereon and stacked in a pyramid-like configuration on a circuit board or other base structure. For example, as shown in FIG. 36A, three chip inductors, 3622, 3624, and 3626, form a dipole array substrate or form 3610. These may soldered together at solder pad at the top ends (relative to the substrate 3620) of the inductors, and each may be soldered at the other end to pads on the substrate 3620. This structure may then be positioned in proximity to a magnetic sensor element 3650, which may be a magnetometer or compass sensor as described previously herein, or other multi-axis magnetic sensing element. FIG. 36B illustrates windings 3623, 3625, and 3627, on inductors 3622, 3624, and 3626, respectively. These form Dipoles A-C as shown.

Figure 37A:
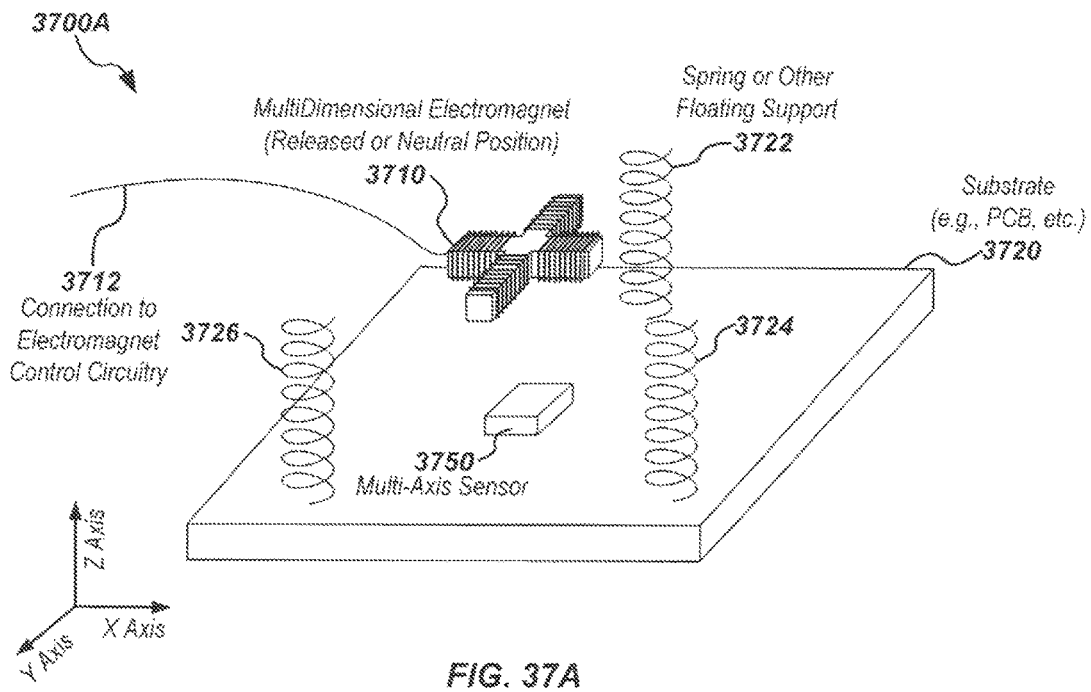
FIGS. 37A and 37B illustrate simplified details of an example mechanical actuation of an embodiment of an electromagnetic dipole array in a UID.
Figure 37B:
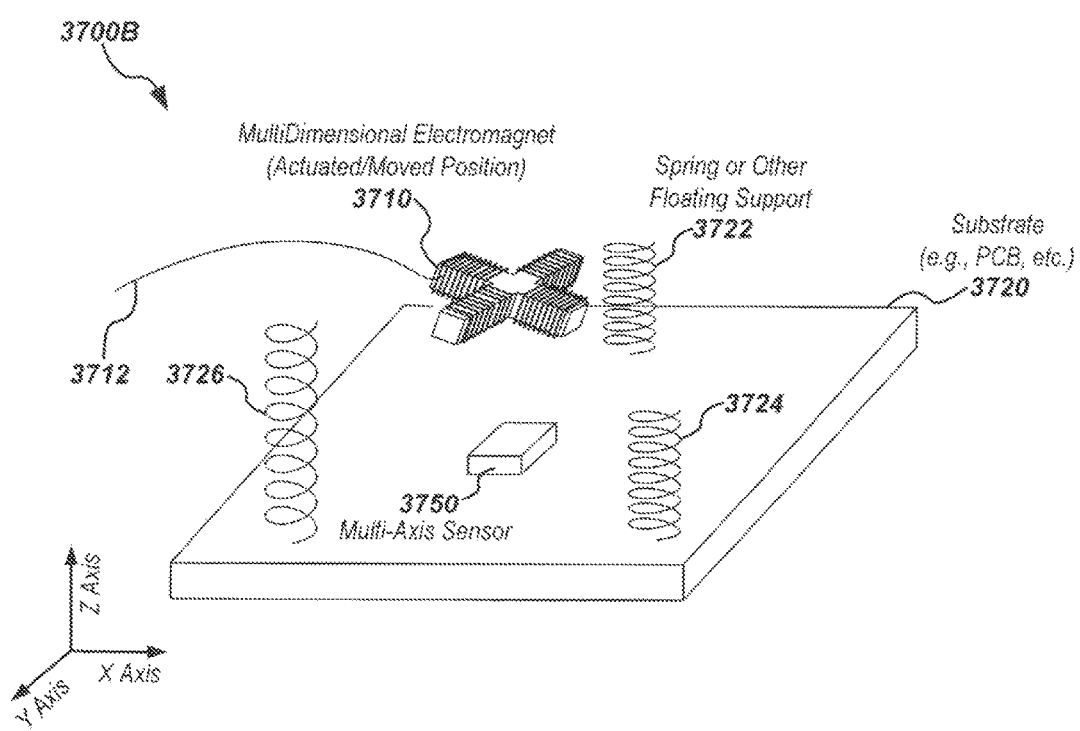

FIGS. 37A and 37B illustrate details of movement of an electromagnetic dipole array 3710 which may correspond to any of the previously described dipole array embodiments. In FIG. 37A, the array 3710 is in a neutral or released position 3700A in the user interface device (UID), such as when a user is not in physical contact with the associated magnetic UID or is in contact but is not actuating the UID. In this position springs, such as springs 3722, 3724, and 3726 are in their nominal or released-state position and the array 3710 is positioned and restrained in a neutral or released position relative to the multi-axis magnetic sensor 3750, which may be a magnetometer or compass sensor or other magnetic sensor element. A connection 3712, which may include multiple wires or other conductors may provide drive and/or control signaling to the array 3710, alternately, or in addition, springs 3722, 3724, 3726, and/or other springs (not shown) may be used as electrical conductors to provide power and/or control signaling to the array 3710. The sensor 3750 may be disposed on a substrate 3720, such as a PCB or other base element. Additional mechanical coupling (not shown) may be used to couple the array 3710 to the springs. For example, the dipole array, springs, and substrate may be configured similarly to the magnetic UID configurations described previously herein. In this released state, magnetic fields generated by the dipole array may be sensed by the sensor 3750 and may be stored as a released or reference position and/or may signal a coupled computer or other device of the current actuation state of the UID.

FIG. 37B illustrates the UID of FIG. 37A in a user-actuated position 3700B. In this position, the dipole array 3710 has moved (as shown in the example movement) in response to user actuation, and the springs are compressed and/or expanded as shown in response. Magnetic fields generated by dipole array 3710 in this position will be sensed by sensor 3750 and, due to the movement of the dipole array 3710, will be different than in the released state. The differences in the magnetic field may then be used to determine a corresponding position of the actuator of the UID.

Figure 38:
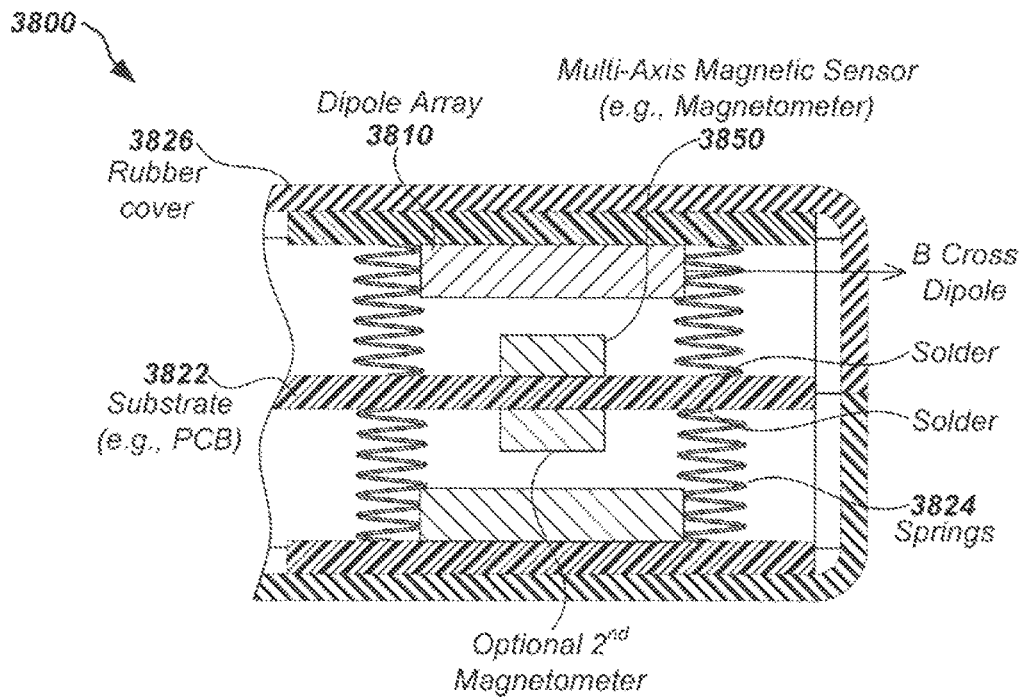
FIG. 38 illustrates details of another configuration of a UID including two electromagnet dipole arrays in a UID.

FIG. 38 illustrates details of an embodiment of a miniature magnet UID 3800 suitable for use in a smart phone, tablet computer, or other small device or system. This example device illustrates use of an electromagnet configuration built upon a single central substrate 3822, in the form of a PCB, where the device may be pinched by a user from opposite sides between two fingers, thereby allowing six degrees of motion to be imparted to the device by a user using only two fingers gripping from opposite sides. Dipole array 3810 and associated sensor 3850 may be used to sense the pinching action. Optionally a second dipole array and/or a second magnet sensor may be added (as shown), in which case a pinch-squeeze measurement may also be made. In such an embodiment, the outer two pinchable PCBs and/or supports under the rubber covers 3826 may be optionally mechanically linked so that they move as a single unit. Springs 3824 may be used to mechanically couple the dipole array(s) to the substrate 3822 as shown.

Figure 39:
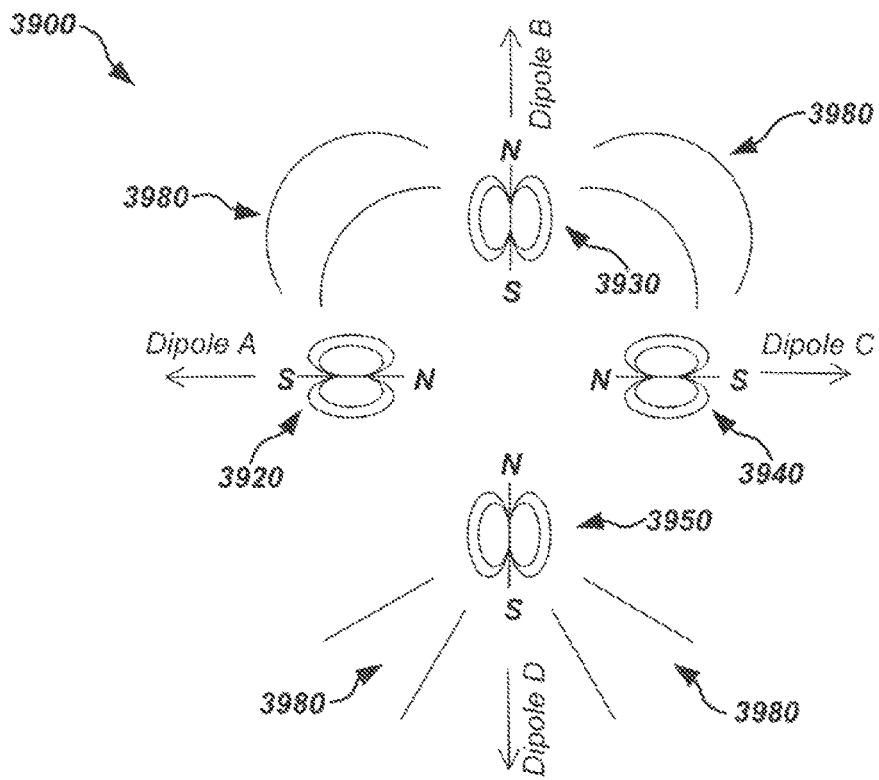
FIG. 39 illustrates details of magnetic field shaping as may be implemented using multiple dipole elements of a magnetic dipole array.

FIG. 39 illustrates details 3900 of an embodiment of a dipole array including four dipole elements, Dipole A (3920), Dipole B (3930), Dipole C (3940), and Dipole D (3950). In this configuration, the associated magnetic field 3980 may be selectively shaped by controlling the magnitude and/or phase of the driving signals applied to each dipole either separately or in tandem. For example, the ambient magnetic field may be initially sensed without any driving current applied to the dipoles. This information may then be used to generate a driving signal to compensate for distortions associated with the ambient magnetic field by shaping the driven magnetic field.

FIG. 40 illustrates details of an embodiment of drive signaling 4000 that may be applied to the electromagnets to generate magnetic fields for sensing. An example of one embodiment of drive current flow as a function of time, t, through an electromagnet array (e.g., the electromagnet array comprising dipoles A and B of a dipole array as described previously) is shown. Other configurations with more dipole elements (e.g., Dipoles C-F as described previously) may be driven with similar signaling.

In the example drive embodiment of FIG. 40, Dipole A may first be energized during time interval T1 to create a magnetic field, and a measurement may be taken by the magnetic sensor (e.g., magnetometer or compass sensor), then Dipole B may subsequently be energized during time interval T2 to create a magnetic field and a second measurement may be taken by the sensor. A reference ambient magnetic field value may then be taken during time interval T3 with both dipoles A and B OFF so that the relative strengths of the magnetic fields due to A and B alone may be determined by differencing away the ambient field value. Other patterns, sequences, and/or drive waveforms may be used in various embodiments.

In the example sequence shown, Dipole A may be switched on and a corresponding three-axis magnetic field measurement may be taken by a magnetic field sensor to determine the field produced by inductor #1, Dipole B may then be switched on and another three-axis measurement taken to determine the field produced by inductor #2, then both may be switched on (or both off) and a third 3-axis magnetic field measurement may be made to determine an ambient magnetic field.

As noted previously, the electromagnets may include various configurations of substrates and windings, such as chip or other inductors surrounded by coil, such as coil-wrapped chip inductor. In some embodiments, deliberately saturating the inductors may be used to improve the reproducibility of the magnetic field over short time intervals.

While a number of different embodiments of methods and systems for implementing magnetic user interface device functionality with electromagnets are described herein, others are also apparent to one of skill in the art. For example, an initial calibration of the manual user interface device may be used to compensate for errors in positioning of the electromagnets and magnetic sensors due to manufacturing tolerances or other changes or offsets. Similarly, an iterative error reduction algorithm or other techniques may be used to compensate for the same. Furthermore a capacitive or other independent means may be used to determine when the manual user interface device has been touched by a user and thereby determine a center point for the manual user interface device in a released state at that time rather than the center calibration prism and auto-zeroing methods of FIGS. 16A and 16B.

In some configurations, the methods, apparatus, or systems described herein may include or describe means for implementing features or providing functions described herein. In one aspect, the aforementioned means may be a module including a processor or processors, associated memory and/or other electronics in which embodiments of the invention reside, such as to implement magnetic sensor signal processing and position determination or other functions related to magnetic sensors and sensing applications, or to provide other electronic or computer processing functions described herein. These may be, for example, modules or apparatus residing in magnet user interface devices, computers, such as laptop, notebook, desktop, tablet, or other computing devices, smart phones, or other electronic equipment, systems, or devices.

In one or more exemplary embodiments, the various functions, methods, and processes described herein for use with user interface devices and associated electronic computing systems may be implemented in hardware, software, firmware, or any combination thereof. If implemented in software, the functions may be stored on or encoded as one or more instructions or code on a non-transitory computer-readable medium.

Computer-readable media includes computer storage media. Storage media may be any available media that can be accessed by a computer, microcontroller, microprocessor, DSP, FPGA, ASIC, or other programmable device. By way of example, and not limitation, such computer-readable media can comprise RAM, ROM, EEPROM, FLASH, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above are also be included within the scope of computer-readable media.

As used herein, computer program products comprising computer-readable media include all forms of computer-readable medium except, to the extent that such media is deemed to be non-statutory, transitory propagating signals. Computer program products may include instructions for causing a processing element or module, such as a microcontroller, microprocessor, DSP, ASIC, FPGA, or other programmable devices and associated memory to execute all of some of the stages of processes such as those described herein.

It is understood that the specific order or hierarchy of steps or stages in the processes and methods described herein are examples of exemplary approaches. Based upon design preferences, it is understood that the specific order or hierarchy of steps in the processes may be rearranged, added to, deleted from, and/or amended while remaining within the spirit and scope of the present disclosure.

Those of skill in the art would understand that information and signals, such as video and/or audio signals or data, control signals, or other signals or data may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, elements, and algorithm steps described in connection with the embodiments disclosed herein may be implemented as electronic hardware, computer software, electro-mechanical components, or combinations thereof. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative functions and circuits described in connection with the embodiments disclosed herein with respect to magnetic user interface devices be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a magnetic user interface device, computer, or other electronic system or electronic computing device.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The disclosure is not intended to be limited to the aspects shown herein, but is to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the appended claims and their equivalents.

We claim:

1. A user interface device, comprising:
   an actuator element having a plurality of magnets;
   a plurality of three-axis magnetic sensor elements, each associated with a corresponding magnet amongst the plurality of magnets, to sense the magnetic field components associated with displacements of the corresponding magnets in three orthogonal axes and provide magnetic sensor output data corresponding to the sensed magnetic field components;
   a processing element communicatively coupled to the three-axis magnetic sensor elements to determine, based at least on the magnetic sensor output data, an estimated position or deformation of the actuator element from a released state; and
   a memory to store a predefined magnetic field model, wherein the determined estimated position or deformation of the actuator element from the released state is further based on the predefined magnetic field model.

2. The device of claim 1, wherein the plurality of magnets comprises cross-shaped electromagnets having a pair of dipole elements on orthogonal prongs of the cross shape.

3. The device of claim 1, wherein the predefined magnetic field model is a closed form equation.

4. The device of claim 1, wherein the output signal includes data defining the estimated position of the actuator element relative to the released state.

5. A user interface device, comprising:
   an actuator element having a plurality of magnets;
   a plurality of three-axis magnetic sensor elements, each associated with a corresponding magnet amongst the plurality of magnets, to sense the magnetic field components associated with displacements of the corresponding magnets in three orthogonal axes and provide magnetic sensor output data corresponding to the sensed magnetic field components; and
   a processing element communicatively coupled to the three-axis magnetic sensor elements to determine, based at least on the magnetic sensor output data, an estimated position or deformation of the actuator element from a released state;
   wherein the output signal is further based upon a reference position determined as an offset from the released position.

6. The device of claim 5, wherein the offset is a function of temperature and the estimated position is adjusted responsive to a temperature measurement.

7. The device of claim 1, wherein the determined estimated position or deformation of the actuator element from the released state is provided as an output signal to an electronic device coupled to the user interface device.

8. The device of claim 1, wherein the plurality of three-axis magnetic sensor elements include four three-axis magnetic sensor elements and the plurality of magnets include four magnets, each corresponding to one of the plurality of three-axis magnetic sensor elements.

9. The device of claim 1, wherein the plurality of magnets include one or more cylindrical magnets.

10. The device of claim 1, further comprising a base and a plurality of springs disposed between the base and the actuator element.

11. A user interface device, comprising:
    an actuator element having a plurality of magnets;
    a plurality of three-axis magnetic sensor elements, each associated with a corresponding magnet amongst the plurality of magnets, to sense the magnetic field components associated with displacements of the corresponding magnets in three orthogonal axes and provide magnetic sensor output data corresponding to the sensed magnetic field components;
    a base and a plurality of springs disposed between the base and the actuator element;
    a processing element communicatively coupled to the three-axis magnetic sensor elements to determine, based at least on the magnetic sensor output data, an estimated position or deformation of the actuator element from a released state; and
    a limiting component to limit movement of the actuator element relative to the base.

12. A user interface device, comprising:
    an actuator element having a plurality of magnets;
    a plurality of three-axis magnetic sensor elements, each associated with a corresponding magnet amongst the plurality of magnets, to sense the magnetic field components associated with displacements of the corresponding magnets in three orthogonal axes and provide magnetic sensor output data corresponding to the sensed magnetic field components;
    a processing element communicatively coupled to the three-axis magnetic sensor elements to determine, based at least on the magnetic sensor output data, an estimated position or deformation of the actuator element from a released state; and
    a plurality of switches disposed in the actuator element and an elastomeric cover including switch bumps corresponding to ones the plurality of switches disposed over the actuator element.

13. The device of claim 12, wherein one or more of the plurality of switches are electro-mechanical switches.

14. The device of claim 12, wherein one or more of the plurality of switches are pressure sensitive variable resistance switching devices.

* * * * *